(12) United States Patent
Pyeon et al.

(10) Patent No.: US 9,148,277 B2
(45) Date of Patent: Sep. 29, 2015

(54) CLOCK REPRODUCING AND TIMING METHOD IN A SYSTEM HAVING A PLURALITY OF DEVICES

(71) Applicant: NovaChips Canada Inc., Ottawa (CA)

(72) Inventors: Hong Beom Pyeon, Kanata (CA); Peter Gillingham, Kanata (CA)

(73) Assignee: NovaChips Canada Inc., Ottawa, Ontario (CA)

( * ) Notice: Subject to any disclaimer, the term of this patent is extended or adjusted under 35 U.S.C. 154(b) by 0 days.

(21) Appl. No.: 14/294,372

(22) Filed: Jun. 3, 2014

(65) Prior Publication Data
US 2014/0341328 A1 Nov. 20, 2014

Related U.S. Application Data

(63) Continuation of application No. 12/168,091, filed on Jul. 4, 2008, now Pat. No. 8,781,053.

(60) Provisional application No. 61/039,605, filed on Mar. 26, 2008, provisional application No. 61/019,907, filed on Jan. 9, 2008, provisional application No. 61/013,784, filed on Dec. 14, 2007.

(51) Int. Cl.
*H03D 3/24* (2006.01)
*H04L 7/033* (2006.01)
*G06F 13/16* (2006.01)

(52) U.S. Cl.
CPC .......... *H04L 7/0331* (2013.01); *G06F 13/1689* (2013.01); *H01L 2224/32145* (2013.01);
(Continued)

(58) Field of Classification Search
CPC ......... H03L 7/0814; H03L 7/033; G11C 7/22
USPC ................................ 375/371, 376; 365/200
See application file for complete search history.

(56) References Cited

U.S. PATENT DOCUMENTS 4,542,351 A 9/1985 Okada
5,768,173 A 6/1998 Seo et al.
(Continued)

OTHER PUBLICATIONS

Lai et al., "Proposed FPGA Hardware Architecture for High Frame Rate (100 fps) Face Detection Using Feature Cascade Classifiers", Biometrics: Theory, Applications, and Systems, First IEEE International Conference on, Sep. 27-29, 2007, pp. 1-6.
(Continued)

*Primary Examiner* — Daniel Washburn
*Assistant Examiner* — Fitwi Hailegiorgis
(74) *Attorney, Agent, or Firm* — Shin Hung; Borden Ladner Gervais LLP

(57) ABSTRACT

A system includes a memory controller and a plurality of semiconductor devices that are series-connected. Each of the devices has memory core for storing data. The memory controller provides a clock signal for synchronizing the operations of the devices. Each device includes a phase-locked loop (PLL) that is selectively enabled or disabled by a PLL enable signal. In each group, the PLLs of a selected number of devices are enabled by PLL enable signals and the other devices are disabled. The enabled PLL provides a plurality of reproduced clock signals with a phase shift of a multiple of 90° in response to an input clock signal. The data transfer is synchronized with at least one of the reproduced clock signals. In the devices of disabled PLLs, the data transfer is synchronized with the input clock signal. The enabled PLL and disabled PLL cause the devices to be the source and the common synchronous clocking, respectively. The devices can be grouped. The devices of one group can be structured by multiple chip packages.

11 Claims, 56 Drawing Sheets

(52) U.S. Cl.
CPC .......... *H01L2224/48091* (2013.01); *H01L 2224/48145* (2013.01); *H01L 2224/48227* (2013.01); *H01L 2224/73265* (2013.01); *H01L 2225/06562* (2013.01); *Y02B 60/1228* (2013.01)

(56) References Cited

U.S. PATENT DOCUMENTS

| | | |
|---|---|---|
| 6,442,644 B1 | 8/2002 | Gustavson et al. |
| 6,941,484 B2 | 9/2005 | To et al. |
| 7,181,639 B2 | 2/2007 | Chua-Eoan et al. |
| 7,561,651 B1 * | 7/2009 | Karabatsos ............ 375/371 |
| 2002/0032843 A1 | 3/2002 | Lofgren et al. |
| 2003/0099138 A1 * | 5/2003 | Kyung ................ 365/200 |
| 2003/0126356 A1 | 7/2003 | Gustavson et al. |
| 2006/0044927 A1 | 3/2006 | Han et al. |
| 2007/0028059 A1 | 2/2007 | Gregorius |

OTHER PUBLICATIONS

Chandra et al., "On using twisted-ring counters for testing embedded cores in system-on-a-chip designs", IEEE Instrumentation and Measurement Technology Conference, Budapest, Hungary, May 21-23, 2001, pp. 216-220.
Taiwanese Patent Application No. 100144204, Search Report dated May 14, 2015.
Taiwanese Patent Application No. 097147841, English Translation of Office Action dated Jul. 15, 2015.

* cited by examiner

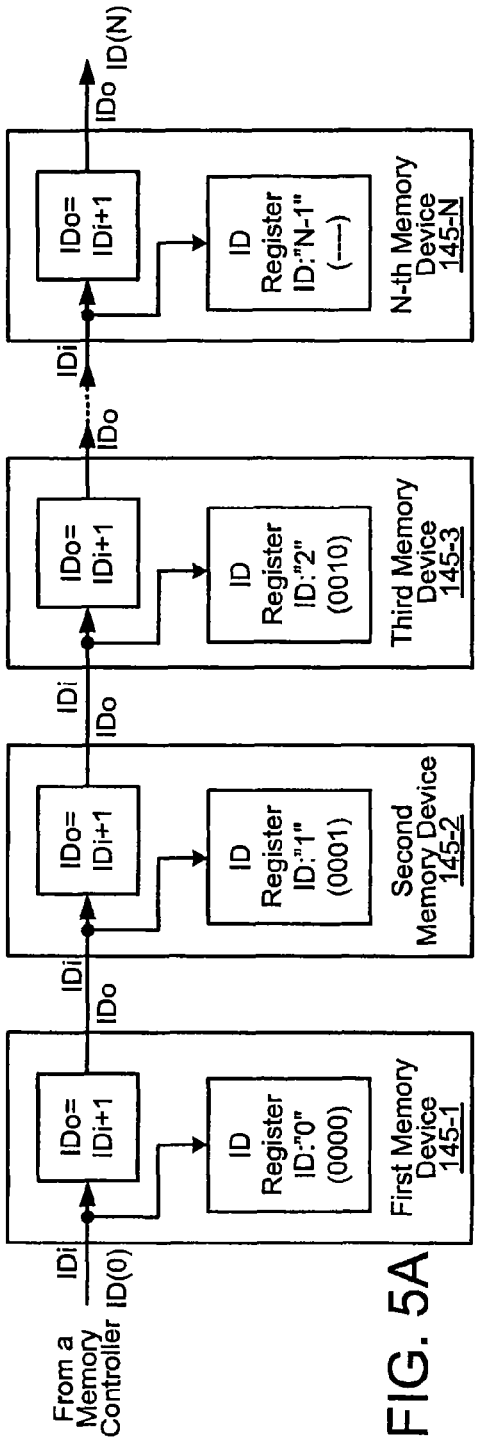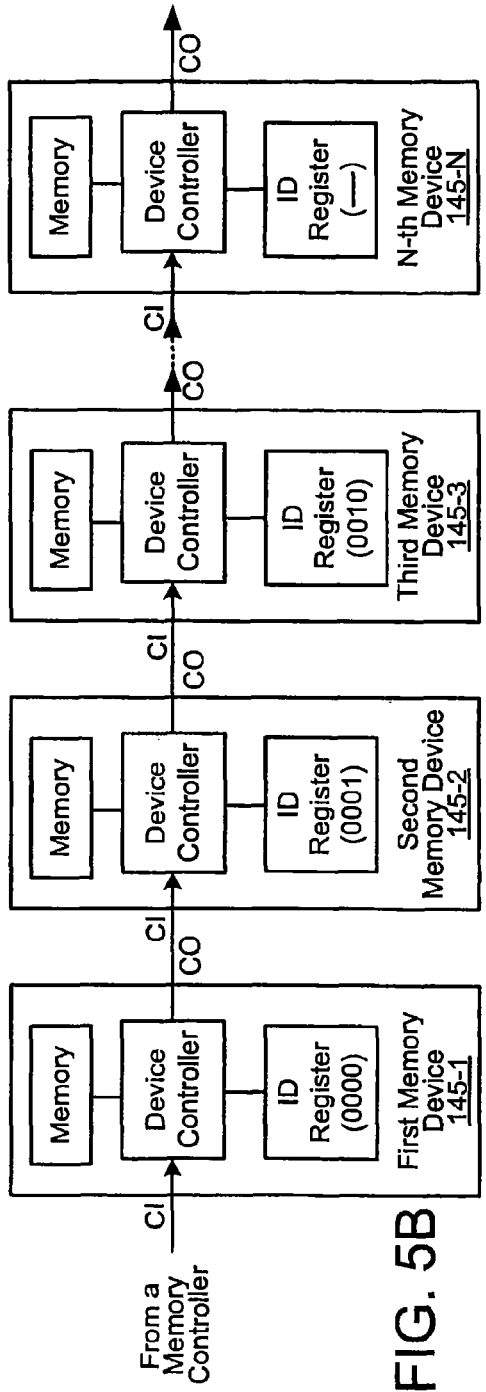
FIG. 5A
FIG. 5B

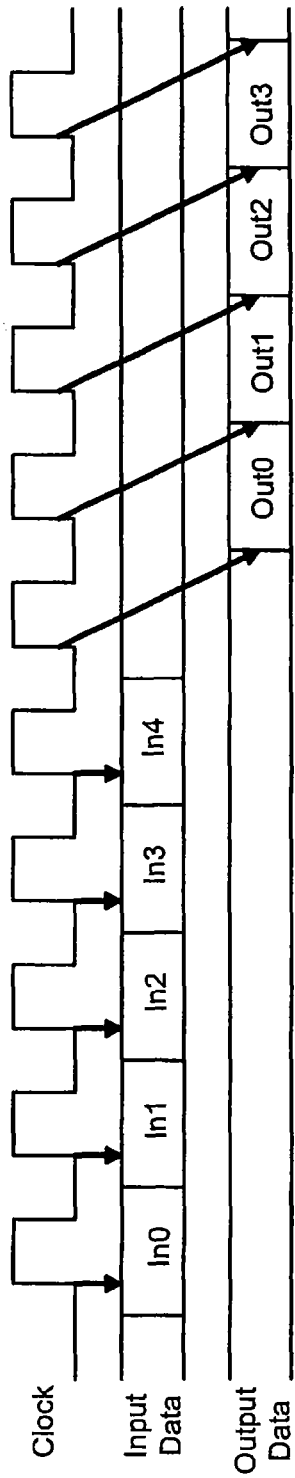
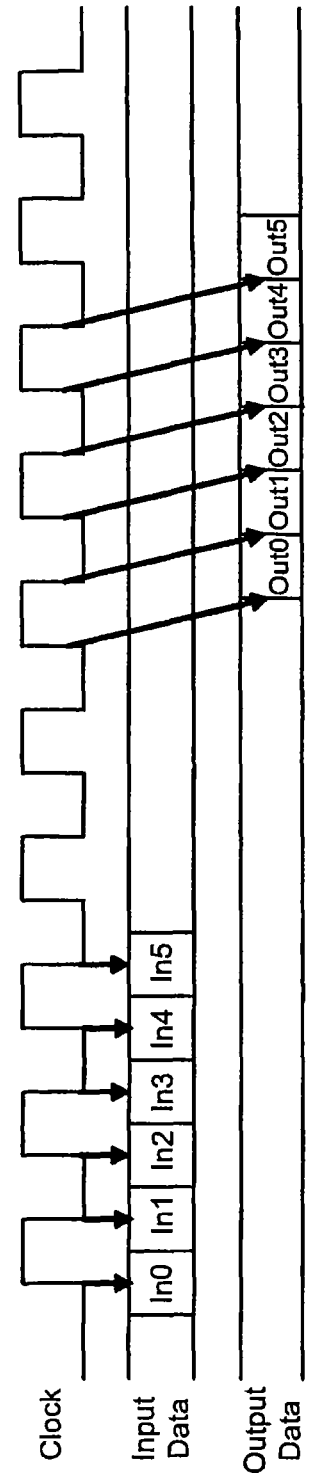
FIG. 7A
FIG. 7B

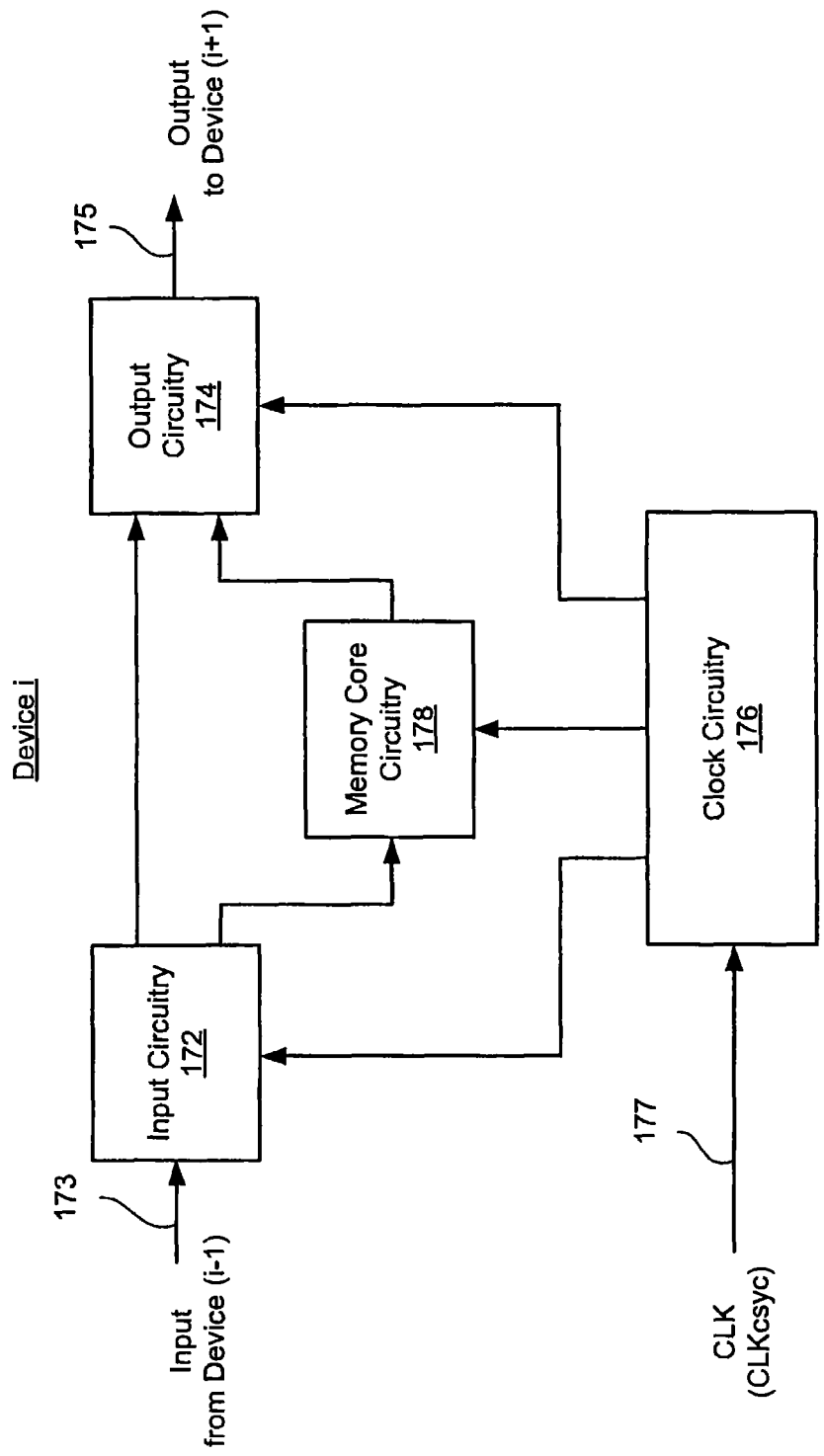

CLOCK REPRODUCING AND TIMING METHOD IN A SYSTEM HAVING A PLURALITY OF DEVICES

CROSS REFERENCE TO RELATED APPLICATIONS

This patent application is a continuation of U.S. patent application Ser. No. 12/168,091, filed on Jul. 4, 2008. U.S. patent application Ser. No. 12/168,091 claims the benefit of priority from U.S. Provisional Patent Application No. 61/013,784 filed Dec. 14, 2007; U.S. Provisional Patent Application No. 61/019,907 filed Jan. 9, 2008; and U.S. Provisional Patent Application No. 61/039,605 filed Mar. 26, 2008. U.S. patent application Ser. No. 12/168,091, U.S. Provisional Patent Application No. 61/013,784, U.S. Provisional Patent Application No. 61/019,907, and U.S. Provisional Patent Application No. 61/039,605 are incorporated herein by reference.

TECHNICAL FIELD

The present invention relates to a device. More particularly, it relates to a system having a plurality of devices and a method for reproducing clocks for use in such systems.

BACKGROUND

Electronic equipment uses semiconductor devices, such as, for example, memory devices. Memory devices may include random access memories (RAMs), flash memories (e.g., NAND flash device, NOR flash device), and other type memories for storing data or information.

Memory systems on circuit boards are designed to achieve both high density and high speed operation to meet the demands of various applications. Two design techniques that may be employed to realize a high density memory system on a circuit board include a serial cascade interconnection configuration and multi-drop bus interconnection configuration. These design techniques address the density issue by allowing many memory devices to be connected to a single memory control device. One design technique is a multi-drop bus interconnection configuration wherein a plurality of memory devices is connected in parallel to a memory controller. Another design technique is a serial connection of a plurality of memory devices.

SUMMARY

In accordance with one aspect of the present invention, there is provided a device for transferring data having a period defined by transitions of an input clock signal. The device comprises clock circuitry and synchronization circuitry. The clock circuitry is configured to provide a plurality of reproduced clock signals in response to the input clock signal. The phases of the plurality of reproduced clock signals are differently shifted with the data to each other. The clock circuitry is also configured to produce an output clock signal in response to at least one of the plurality of reproduced clock signals. The synchronization circuitry synchronizes the transfer of the data with at least one of the reproduced clock signals. The transition of the output clock signal occurs during the period of the data.

For example, each of the phases of the plurality of reproduced clock signals is phase shifted to each other. In response to the reproduced clock signals having differently shifted phases, the clock circuitry can produce an output clock signal having flexible phase shifts.

The clock circuitry may comprises: a phase-locked loop (PLL) for providing the plurality of reproduced clock signals in response to the input clock signal; and clock output circuitry for producing the output clock signal in response to at least one of the plurality of reproduced clock signals.

For example, the PLL is configured to be selectively enabled or disabled in response to a control signal having first and second logic states to cause the PLL to be enabled and disabled, respectively. In the case of the PLL being enabled, the PLL produces the plurality of reproduced clock signals in response to the input clock signal. The clock output circuitry produces the output clock signal in response to at least one of the plurality of reproduced clock signals. The synchronization circuitry synchronizes the transfer of the data with at least one of the reproduced clock signal. In the case of the PLL being disabled, the synchronization circuitry synchronizes the transfer of the data with the input clock signal.

Advantageously, the PLL is further configured to output the reproduced clock signal with the phase shift that is a multiple of 90° with the data.

For example, the device receives the input clock signal comprising one clock signal and its complementary clock signal. In response to the input clock signal, the clock circuitry provides an internal clock signal. The PLL produces the plurality of reproduced clock signals in response to the internal clock signal when the PLL is enabled. When the PLL is disabled, the synchronization circuitry synchronizes the transfer of the data with the internal clock signal.

The device may further comprise a holder for holding identification information associated with the device, the identification information be used for identifying the device. The control signal may be provided in response to the identification information held in the holder. The control signal is one of logic high and low causing the PLL to be enabled and disabled, respectively.

The device may further comprise access circuitry for accessing the memory in response to the identification of the device based on the identification information.

In accordance with another aspect of the present invention, there is provided an apparatus for transferring data from a first device to a second device, the data having a period defined by transitions of a clock signal. The first device comprises: first clock circuitry and first synchronization circuitry. The first clock circuitry is configured to: provide a plurality of first reproduced clock signals in response to a first input clock signal, the phases of the plurality of first reproduced clock signals being differently shifted with the data to each other, and produce a first output clock signal in response to at least one of the plurality of first reproduced clock signals. The first synchronization circuitry synchronizes the transfer of the data with at least one of the plurality of first reproduced clock signals, the transition of the first output clock signal occurring during the period of the data. The second device comprises: second clock circuitry configured to provide a plurality of second reproduced clock signals in response to a second input clock signal derived from the first output clock signal, the phases of the plurality of second reproduced clock signals being differently shifted with the data to each other, and first data input circuitry for receiving the data transferred from the first device in response to the second input clock.

For example, the first clock circuitry comprises; a first phase-locked loop (PLL) for providing the plurality of first reproduced clock signals in response to the first input clock signal; first clock output circuitry for producing the first output clock signal in response to at least one of the plurality of first reproduced clock signals. The second clock circuitry comprises: a second PLL for providing the plurality of second reproduced clock signals in response to the second input clock signal.

The first and second PLLs may be configured to be selectively enabled or disabled in response to first and second control signals, respectively. When the first PLL is enabled, the first PLL is response to the first input clock signal to produce the plurality of first reproduced clock signals. When the second PLL is enabled, the second PLL is response to the second input clock signal to produce the plurality of second reproduced clock signals.

In accordance with another aspect of the present invention, there is provided a system comprising: a controller; and a plurality of devices that are series-connected, the operation of which is synchronized with a clock signal. Each of the devices comprises: a phase-locked loop (PLL) configured to be selectively enabled, the PLL providing a plurality of reproduced clock signals in response to an input clock signal while enabled, the reproduced clock signals being differently phase shifted versions of the input clock signal; and synchronization circuitry for synchronizing the transfer of data with at least one of the reproduced clock signals.

In accordance with another aspect of the present invention, there is provided a method for use in a plurality of devices, each of the plurality of devices comprising a phase-locked loop (PLL), one device transferring data to another device in response to an input clock signal. The method comprises: selectively enable the PLL in response to a control signal, the enabled PLL outputting a plurality of reproduced clock signals in response to the input clock signal, the reproduced clock signals being differently phase shifted versions of the input clock signal.

In accordance with another aspect of the present invention, there is provided a method for transferring data clocked in accordance with a clock signal, the data having a period defined by transitions of the clock signal, the method comprising: selectively enabling or disabling a phase-locked loop (PLL); providing a reproduced clock signal in response to the input clock signal while the PLL is enabled, the reproduced clock signal being a phase shifted version of the input clock signal; and synchronizing the transfer of the data with the reproduced clock signal, the clock transition of the reproduced clock signal being during the period of the data.

In accordance with another aspect of the present invention, there is provided a method for transferring data from a first device to a second device, the data being clocked in accordance with a clock signal, the data having a period defined by transitions of the clock signal, the method comprising: providing a reproduced clock signal in response to a first input clock signal, the reproduced clock signal being a phase shifted version of the first input clock signal; synchronizing the transfer of the data with the reproduced clock signal, the clock transition of the reproduced clock signal being during the period of the data, the reproduced clock signal being provided as an output clock signal; providing a reproduced clock signal in response to the output clock signal from the first device, the reproduced clock signal being a phase shifted version of the output clock signal from the first device, and receiving the data transferred from the first device.

In accordance with another aspect of the present invention, there is provided a method for transferring data clocked in accordance with a clock signal, the data having a period defined by transitions of the clock signal. The method comprises: selectively enabling or disabling a phase-locked loop (PLL); providing a plurality of reproduced clock signals in response to the input clock signal while the PLL is enabled, the reproduced clock signals being differently phase shifted versions of the input clock signal; and synchronizing the transfer of the data with at least one of the reproduced clock signals.

In accordance with another aspect of the present invention, there is provided a method for transferring data from a first device to a second device, the data being clocked in accordance with a clock signal, the data having a period defined by transitions of the clock signal. At the first device, the method comprises: providing a plurality of reproduced clock signals in response to a first input clock signal, the reproduced clock signals being differently phase shifted versions of the first input clock signal; and synchronizing the transfer of the data with at least one of the reproduced clock signals, the clock transition of the reproduced clock signal being during the period of the data, the reproduced clock signal being provided as an output clock signal. At the second device, the method comprises: providing a plurality of reproduced clock signals in response to the output clock signal from the first device, the reproduced clock signals being differently phase shifted version of the output clock signal from the first device, and receiving the data transferred from the first device.

In accordance with an embodiment of the present invention, there is provided a device including a PLL that is selectively enabled or disabled. When enabled, the PLL provides a plurality of reproduced clock signals that are phase shifted by 90°, 180°, 270° and 360° with a reference clock signal defined by input clock signal and its complementary signal. The PLL is selectively enabled or disabled. In response to one of or a combination of the plurality of reproduced clock signals, the data is transferred. When disabled, no clocks are reproduced by the PLL and in response to the reference signal, the data is transferred.

In accordance with another embodiment of the present invention, there is provided a system including a memory controller and a plurality of memory devices that are series-connected to the memory controller. The plurality of memory devices is divided to a plurality of groups. The memory controller provides a clock signal for synchronizing the operations of the devices. The devices of one group are clocked by the clock signals provided by the source synchronous and the common synchronous clock structures. Each of the devices includes a PLL that is selectively enabled by an enable signal. When the PLL is enabled, it outputs a plurality of reproduced clock signals that are phase shifted a multiple of 90° with data. Each of the devices having enabled PLLs operates with the reproduced clock signal. When the PLL is disabled, that device operates with the input clock signal. The devices of the disabled PLLs cause less power consumption. In response to the reproduced clock signals provided by the enabled-PLL, an output clock signal is provided to a next device of the series-connection for the source synchronous clocking. The devices of groups are structured by multiple chip packages. The clock phase shift provides a center-edge clock with data to be transmitted, with the results that some kinds of skew are not considered as degradation factors.

For example, the memory device includes memory or data storage element for storing data. The memories include random access memories (RAMs), flash memories (e.g., NAND flash device, NOR flash device), and other type memories for storing data or information.

Other aspects and features of the present invention will become apparent, to those ordinarily skilled in the art, upon review of the following description of specific embodiments of the invention.

BRIEF DESCRIPTION OF THE DRAWINGS

Embodiments of the present invention will now be described with reference to the attached drawings in which:

FIG. 5A is a block diagram of the arrangement of FIG. 3 showing the operation of device identifier (ID) assignments;

FIG. 5B is a block diagram of the arrangement of FIG. 3 showing normal mode operation;

FIG. 7A is a timing diagram for single data rate (SDR) operation;

FIG. 7B is a timing diagram for double data rate (DDR) operation;

FIG. 9 is a block diagram of one of the memory devices shown in FIGS. 8A and 8B;

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

As described above, the multi-drop and serial connection configurations are known design techniques to address the density issue.

Figure 1:
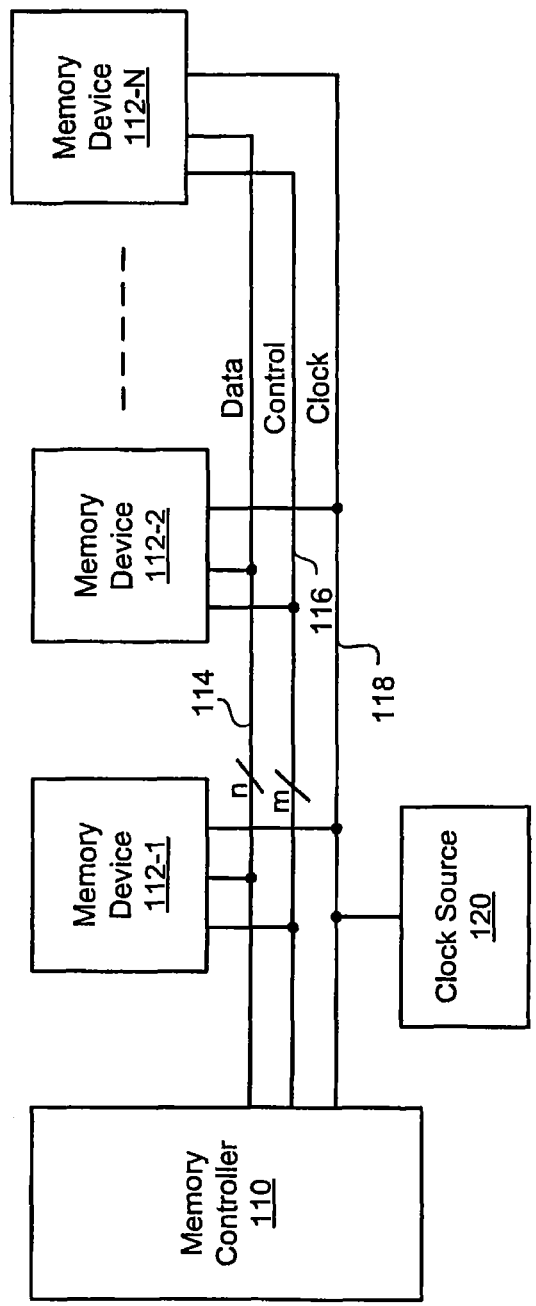
FIG. 1 is a block diagram of a prior art system having a plurality of memory devices connected in a multi-drop fashion.

FIG. 1 shows a system having a plurality of memory devices connected in a multi-drop fashion. The system implements a common synchronous clock structure to conform a parallel clock distribution. In the illustrated system, a memory controller 110 communicates with a plurality (N) of memory devices 112-1, 112-2, - - -, 112-N, N being an integer greater than one. The memory controller 110 and the N memory devices are connected through n-bit data lines 114 and m-bit control lines 116. The data transfers and control signals are synchronized with common clocks on common clock line 118 that is connected to the memory controller 110 and the N memory devices 112-1-112-N. Synchronous clocks are provided by a clock source 120 to the common clock line 118. Because of parallel nature of the bus, the clock signal is heavily loaded and distorted.

One example of the serial connection of multiple memory devices is "RamLink", which became an IEEE standard in 1996. RamLink actually specifies two alternate methods of interconnections. One method is RingLink which consists of series-connected devices with point-to-point communication between them, providing a high degree of expandability, but long latency. The other method is SyncLink which consists of a multi-drop interconnection of a small number of devices.

A hybrid RamLink configuration is also part of the IEEE standard. A memory system based on the RamLink configuration consists of a processor or memory controller and one or more memory modules. The memory controller is typically either incorporated within the processor itself or fabricated as part of a companion chipset for the processor. Each memory module has a slave interface that has one link input and one link output. The memory modules are arranged in a RamLink signaling topology known as RingLink with unidirectional links between components. A control interface on each module interfaces the slave interface with memory devices (RAMs). In this system, another RamLink signaling topology known as a SyncLink is used between the slave interfaces and memory devices. Data is transferred between the processor and modules in packets that circulate along the RingLink. The processor or memory controller is responsible for generating all request packets and scheduling the return of slave response packets.

The hybrid RamLink configuration can only operate as fast as the module level component connections. It is limited in frequency by the SyncLink connections within a single module due to multi-drop bus, the same method illustrated in FIG. 1. In a RingLink slave interface circuit, source-synchronous strobing is used to clock the incoming data signals. That is, a strobe signal "strobein", which accompanies the incoming data signals, is used to sample the incoming data. The circuit uses a phase-locked loop (PLL) to generate a stable local clock signal from a reference clock signal.

The present invention relates generally to a system having a controller and a plurality of devices that are connected, the devices being synchronously clocked. Example systems having series-connected semiconductor devices will be described.

Figure 2:
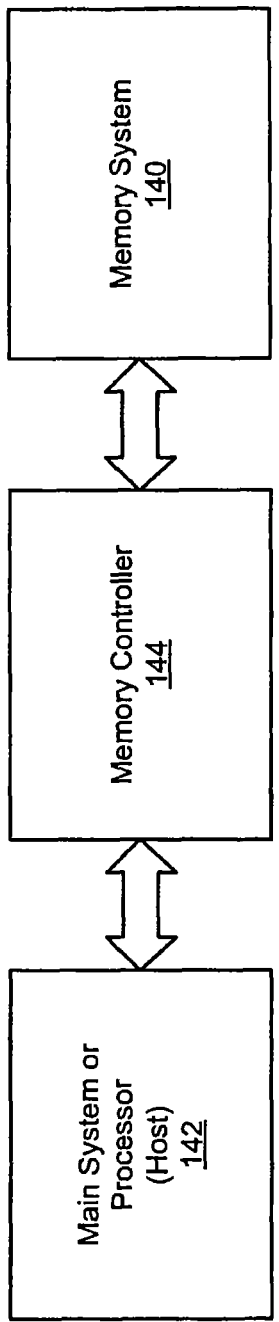
FIG. 2 is a block diagram of a global system with flash memories to which embodiments of the present invention are applicable.

FIG. 2 shows a global system with flash memories. Referring to FIG. 2, a memory system 140 communicates with a main system or processor (a host system) 142 via a memory controller 144. The memory system 140 includes a plurality of memory devices that are series- or parallel-connected. Examples of the memory devices are flash devices.

Figure 3:
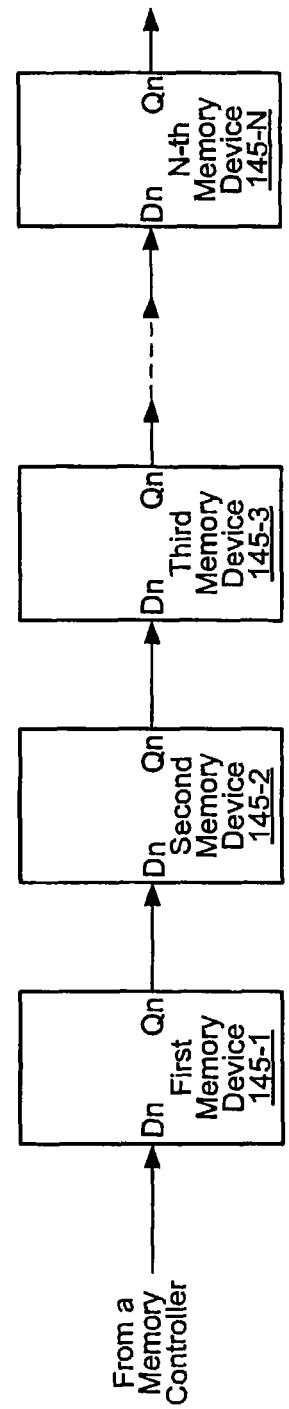
FIG. 3 is a block diagram of an arrangement of a plurality of memory devices that are series-connected to which embodiments of the present invention are applicable.

FIG. 3 shows an arrangement of a plurality of memory devices that are series-connected. Referring to FIG. 3, the arrangement includes N memory devices 145-1, 145-2, 145-3, - - -, and 145-N that are series-connected, N being an integer. The series-connected memory devices 140-1-140-N correspond to the memory system 140 of FIG. 2. A memory controller (not shown) which corresponds to the memory controller 144 of FIG. 2 sends a group of signals of data and information to the memory devices of the arrangement. Data or information to be processed is sent to the data input Dn of the first device 145-1 and propagated through the devices of the series-connected arrangement. In one implementation, the data output Qn of the last device 145-N is connected to another device or system (not shown) for use the propagated data or information therein. In another implementation, the output of the last device 145-N is connected to the memory controller, so that the memory controller can use the data returned from the last device 145-N.

Figure 4:
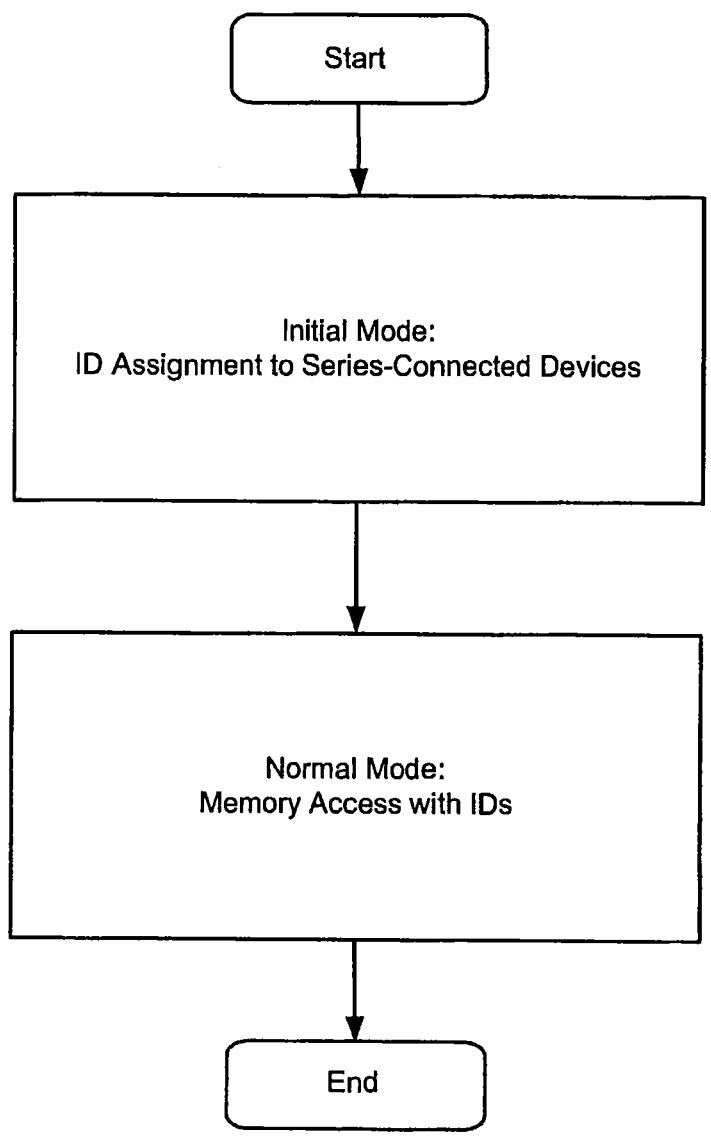
FIG. 4 is a flow chart showing the operations of the devices shown in FIG. 3.

The operations of the devices 145-1-145-N of the arrangement are shown in FIG. 4. The devices of the arrangement shown in FIG. 4 operate with an initial mode and a normal mode as shown in FIG. 4. In the initial mode, the devices are assigned with device addresses (DAs) or device identifier (ID) numbers. Thereafter, in the normal mode, a device designated by an ID number performs an operation specified by a command (e.g., data write, data read).

FIG. 5A shows the arrangement of FIG. 3 showing the ID assignments. Referring to FIGS. 3, 4 and 5A, in the initial mode, the memory controller provides the initial ID (="0") to the first device 145-1. Each of the memory devices 145-1, 145-2, 145-3, - - -, and 145-N of the arrangement stores the input ID, IDi, in its ID register and performs an addition (i.e., IDi+1) to produce the output ID, IDo, for the next device. In the illustrated example, the device 145-1, 145-2, 145-3, - - -, and 145-N are assigned with the IDs that are successive numbers "0", "1", "2", - - -, and "N" represented by binary numbers "000", "0001", "0010", - - -, and " - - - ", respectively. Each device has its MSB (most significant bit) first and has its LSB (least significant bit) last. In another implementation, the ID can be changed to the LSB first and the MSB last. Also, the IDs can be successive numbers from another value (e.g., "1"). Furthermore, the IDs can be decremented numbers from a maximum value. Examples of the ID assignment in a plurality of memory devices which are series-connected are provided in International Publication No. WO2007/0109886 A1 (4 Oct. 2007) and International Publication No. WO2007/0134444 A1 (29 Nov. 2007), the disclosures of which are incorporated by reference in their entirety.

FIG. 5B shows the arrangement of FIG. 3 showing the normal mode operation. Referring to FIGS. 3, 4 and 5B, in the normal mode, the memory controller issues control information (CI) including a specific device ID number, an operation instruction and others as a command. The device controller included in each memory device performs the ID match determination comparing the input IDi to the assigned ID in the ID register. In the case of ID match, the device controller executes the command included in the CI to access the memory of that device. Examples of the operation of the command are memory accesses and data processes. Each command includes an ID number (i.e., a device address) and a command OP code (hereinafter simply "OP code"), and may also include address information and/or data. If there is no match between the input ID and the registered ID, the device will transfer the CI as output command CO to the next device. In response to the transferred CO received as the CI, the next device performs similar operations as the previous device.

Figure 6:
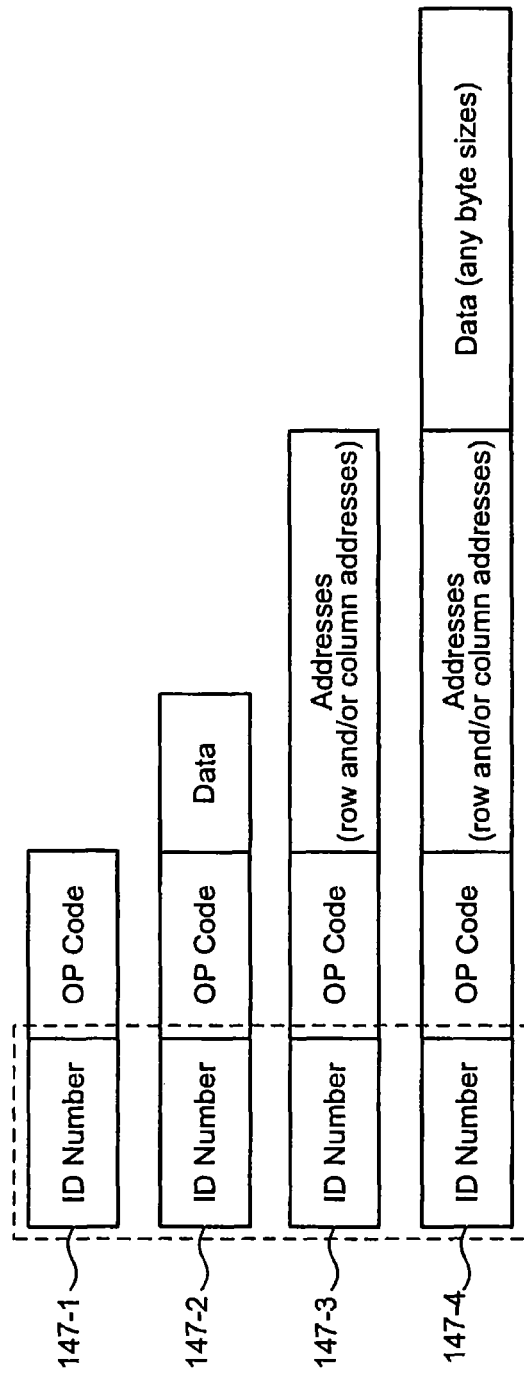
FIG. 6 is a block diagram of example command formats for use in the arrangement as shown in FIG. 3.

FIG. 6 is a schematic of example command formats for use in the memory devices that are series-connected as shown in FIG. 3. Referring to FIG. 6, a first command format 147-1 includes an ID number and an OP code. The ID number is used to identify a selected memory device, while the OP code field contains the OP code to be executed by the selected device. Commands with the first command format 147-1 may for example be used for commands containing OP codes for reading a register value. A second command format 147-2 includes an ID number, an OP code and data. Commands with the second command format 147-2 may for example be used for commands containing OP codes for writing data to a register. A third command format 147-3 includes an ID number, an OP code, and additional addresses. The additional addresses may for example include row and/or column addresses for addressing a location in memory cells. Commands with the third command format 147-3 may for example be used for commands containing OP codes for reading data from memory cells of a selected memory device. A fourth command format 147-4 includes an ID number, an OP code, additional addresses, and data. Commands with the fourth command format 147-4 may for example be used for commands containing OP codes for writing data to the memory cells of a selected memory device. Note that all four example command formats 147-1, 147-2, 147-3, 147-4 start with an ID number for addressing purposes. It should be understood from the foregoing that the term "command" as used herein does not merely refer to a command OP code, as a command may include an ID number, an OP code, additional addresses, data, or any other information relating to the control of an arrangement of memory devices that are series-connected. Examples of the command formats are disclosed in U.S. patent application Ser. No. 12/018,272 filed Jan. 23, 2008, the disclosure of which is incorporated by reference in its entirety. Examples of commands and operations are disclosed in International Publication No. WO2007/036048 A1 (5 Apr. 2007) and U.S. patent application Ser. No. 12/034,686 filed Feb. 21, 2008, the disclosure of which is incorporated by reference in its entirety.

For applications requiring large memory space (or mass storage system), the flash memory system using a plurality of flash memory devices can be implemented. The memory controller can access each of the flash memory devices and only one flash memory can be selected at a time.

In order to improve the signal integrity on large number of flash devices implemented in flash memory systems such as, for example, USB flash drives, flash memory cards and solid state drives (SSDs) for HDD replacement, series-connected NAND flash memories may be implemented. Series-connected NAND flash memory is advanced and provides high performance flash device using point-to-point, serial device connection.

Data can be transferred or captured in response to the clock signal. The operation can be performed in response to rising edges and/or falling edges of the clock signal. The memory devices can perform single data rate (SDR) operation and double data rate (DDR) operation as shown in FIGS. 7A and 7B, respectively. Also, the memory devices may operate with more than twice during the clock cycle.

Figure 8A:
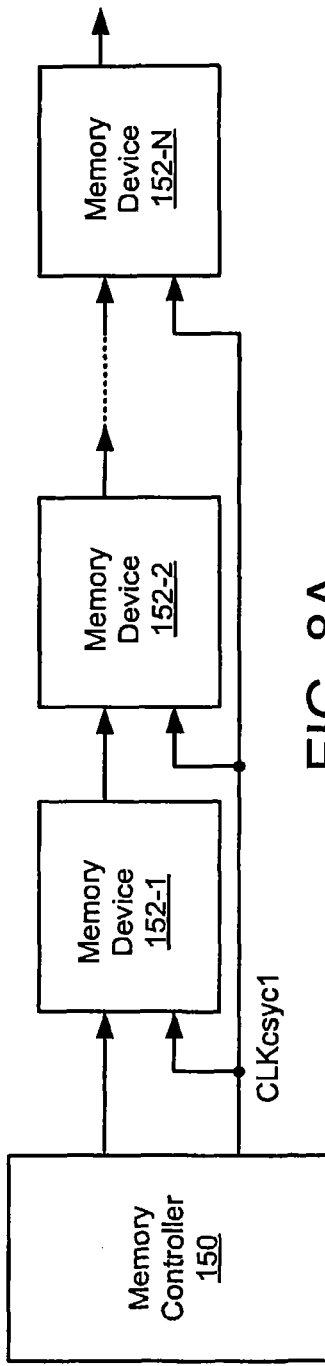
FIG. 8A is a block diagram of an example of a system having a plurality of memory devices that are series-connected, with a common synchronous clock structure.

FIG. 8A shows a system having a plurality of memory devices that are series-connected, with a common synchronous clock structure conforming a parallel clock distribution topology. Referring to FIG. 8A, a memory controller 150 communicates with a plurality (N) of memory devices 152-1, 152-2, - - - , 152-N, N being an integer greater than one. The memory controller 150 is connected to a first memory device 152-1 to send information on control and/or data which is propagated through the remaining memory devices 152-2- 152-N in response to a common synchronous clock signal CLKcsyc1 provided by the memory controller 150. The propagated information is provided from the last device 152-N to another device or apparatus (not shown) for further processing thereby.

Figure 8B:
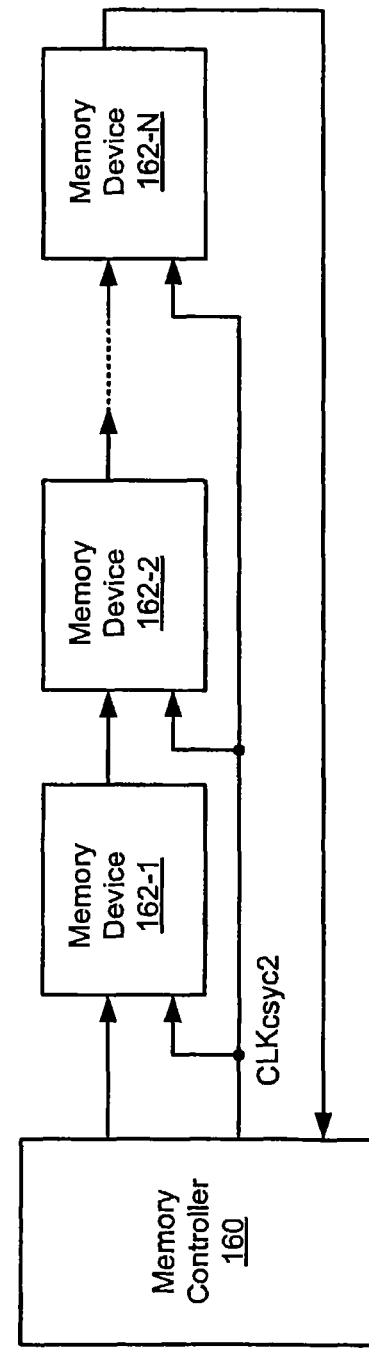
FIG. 8B is a block diagram of another example of a system having a plurality of memory devices that are series-connected, with the common synchronous clock structure.

FIG. 8B shows another system having a plurality of memory devices that are series-connected, with the common synchronous clock structure, the system forming a ring structure. In the illustrated example system, a memory controller 160 communicates with a plurality (N) of memory devices 162-1, 162-2, - - - , 162-N. The memory controller 160 is connected to a first memory device 162-1 to send information on control and/or data which is propagated through the remaining memory devices 162-2-162-N in response to the common synchronous clock signal CLKcsyc2 provided by the memory controller 160. In the system, the last (the N-th) memory device 162-N feedbacks the propagated information to the memory controller 160, so that the system forms a ring type connection. If necessary, the propagated control signals will be returned to the memory controller 160.

FIG. 9 shows details of one of the memory devices shown in FIGS. 8A and 8B. Each of the memory devices shown in FIGS. 8A and 8B has the same structure. Referring to FIG. 9, Device i, which represents any one of the devices shown in FIGS. 8A and 8B, has input circuitry 172 for receiving an input signal 173 from a previous device, Device (i−1); output circuitry 174 for providing an output signal 175 to the next device, Device (i+1); clock circuitry 176 and memory core circuitry 178. In response to an input common synchronous clock signal CLKcsyc 177, the clock circuitry 176 delivers clocks to the input circuitry 172, the memory core circuitry 178 and the output circuitry 174 for their operations. The input circuitry 172 and the output circuitry 174 perform interface operations in response to the clock signal CLKcsyc.

Figure 10A:
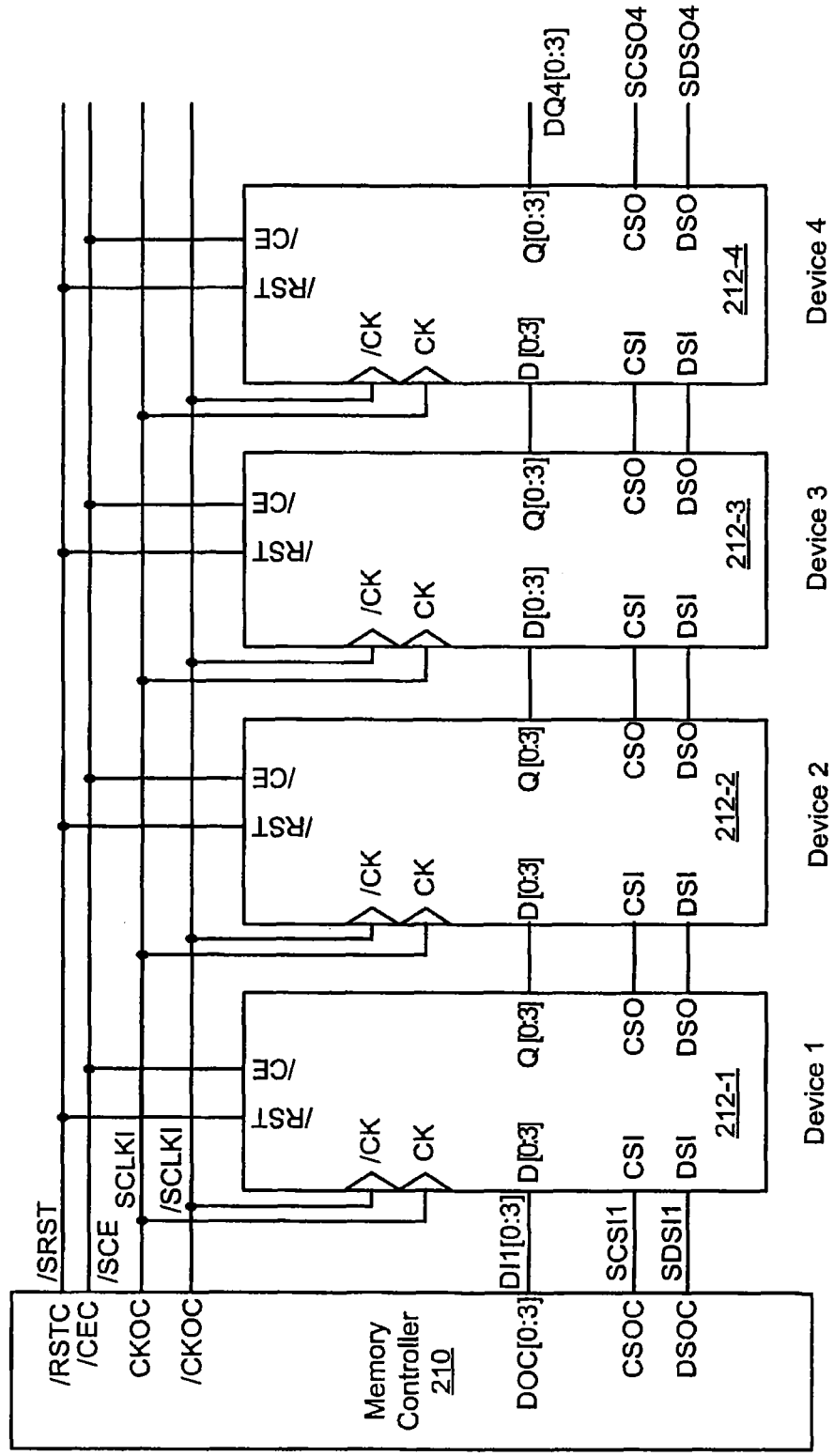
FIG. 10A is a block diagram of an example of a system having a memory controller and a plurality of memory devices that are series-connected.

FIG. 10A shows details of the system of FIG. 8A. The particular example includes a memory controller 210 and a plurality of memory devices 212-1-212-4 that are series-connected. The example system has series-connected memory devices implementing the common synchronous clock structure. The illustrated example shows four devices, but any number of the devices may be series-connected.

Referring to FIG. 10A, each of the memory devices 212-1-212-4 has a device ID number that is hard wired or pre-assigned, so that one device can be selected at a time in the normal mode operation based on the ID match determination. The memory devices have point-to-point connections. The memory controller 210 has a plurality of outputs connected to the devices for transmitting various information. Each of the devices has a plurality of inputs and outputs for receiving and transferring various information.

The memory controller 210 has data outputs DOC[0:3], a command strobe output CSOC, a data strobe output DSOC, a chip select output /CEC and a reset output /RSTC. Also, the memory controller 210 has a pair of clock outputs CKOC and /CKOC. Each of the devices has data inputs D[0:3], a command strobe input CSI, a data strobe input DSI, a reset input /RST, a chip enable input /CE and a pair of clock inputs CK and /CK. Also, each of the devices has data outputs Q[0:3], a command strobe output CSO, a data strobe output DSO. The data output Q[0:3], the command strobe output CSO and the data strobe output DSO of one device are coupled to the data input D[0:3], the command strobe input CSI and the data strobe input DSI of the next device, respectively.

The devices receive a chip enable signal /SCE (hereinafter referred to as "/SCE signal") and a reset signal /SRST (herein after referred to as "/SRT signal"). Also, the devices receives a pair of clock signal SCLKI (hereinafter referred to as "SCLKI signal") and complementary clock signal /SCLKI (hereinafter referred to as "/SCLKI signal"). The /SCE, /SRST, SCLKI and /SCLKI signals are commonly provided to the devices 212-1-212-4 by the memory controller 210.

The data output DOC[0:3] of the memory controller 210 provides input data DI1[0:3] to data input D[0:3] of the first device 212-1, Device 1. The first device 212-1 transfers output data DQ1[0:3] to the next device. The second device 212-2, Device 2, receives the output data DQ1[0:3] as its input data DI2[0:3] transmitted from the previous device, Device 1. The command strobe input CSI and data strobe input DSI of one device receive the command strobe input signal SCSI and the data strobe input signal SCSO, respectively. Also, the command strobe output CSO and the data strobe output DSO of one device transmit the command strobe output signal SCSO and the data strobe signal SDSO, respectively, to the next device. The data transfer is controlled by the command strobe input and data strobe input signals in each device.

Each of the devices provides delayed versions of the command strobe input signal SCSI (hereinafter referred to as "SCSI signal") and the data strobe input signal SDSI (hereinafter referred to as "SDSI signal"), the command strobe output signal SCSO (hereinafter referred to as "SCSO signal") and the data strobe output signal SDSO (hereinafter "SDSO signal"), to a next device. The transfers of the data and SCSI, SDSI are performed in response to the SCLKI and /SCLKI signals.

Example details of an architecture featuring devices that are series-connected are provided in U.S. Patent Application Publication No. 2007/0076502 A1 (Apr. 5, 2007); and International Publication No. WO 2007/036048 A1 (5 Apr. 2007), the disclosures of which are hereby incorporated by reference in its entirety. Other example details of an architecture feature devices that are series-connected are provided in International Publication No. WO/2008/067652 A1 (12 Jun. 2008) and International Publication No. WO2008/022454 A1 (28 Feb. 2008), the disclosures of which are hereby incorporated by reference in their entirety.

Figure 10B:
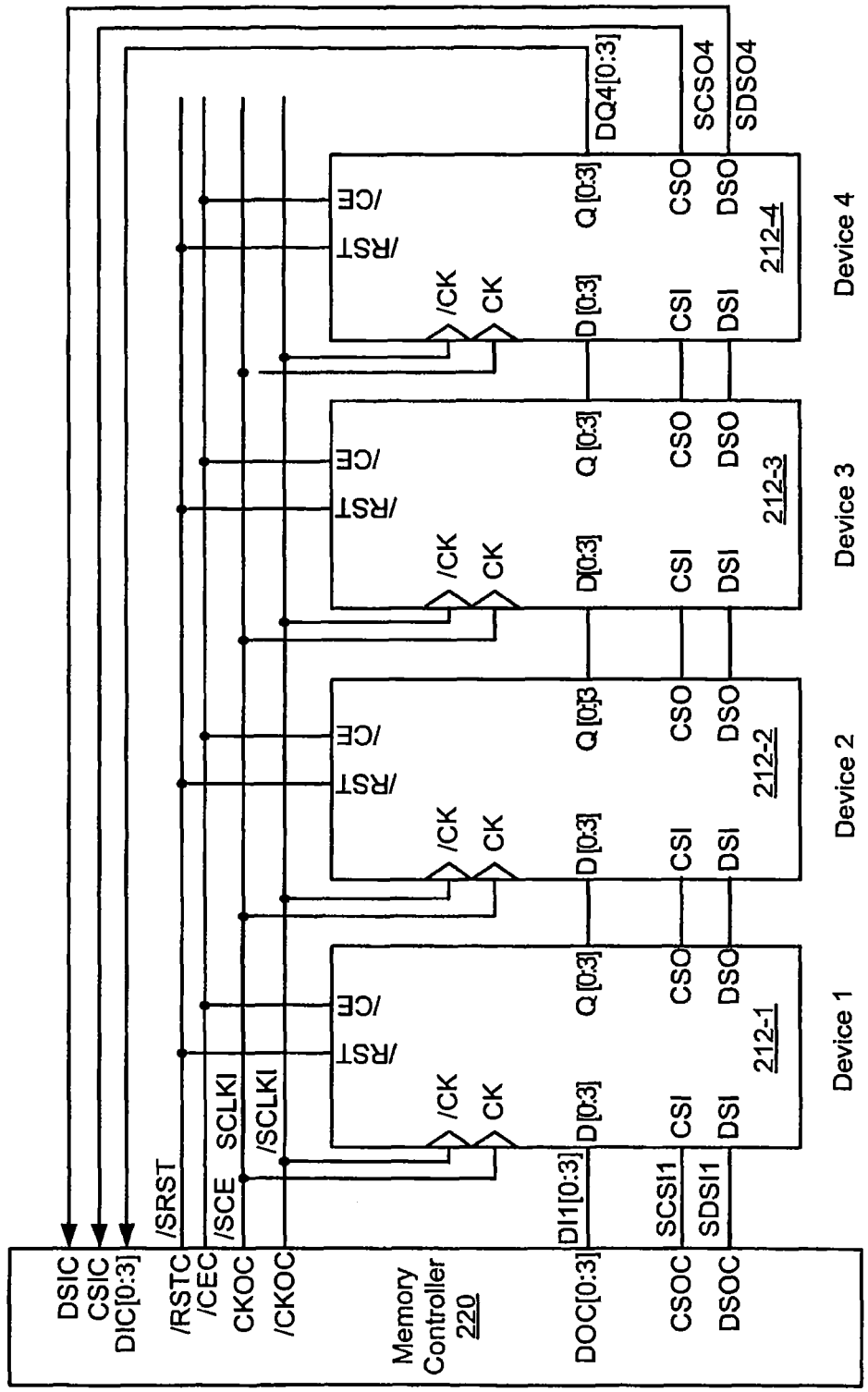
FIG. 10B is a block diagram of another example of a system having a memory controller and a plurality of memory devices that are series-connected.

FIG. 10B shows details of the system of FIG. 8B. The connections and structure of the system shown in FIG. 10A are almost the same as those of the system shown in FIG. 10A. The difference is that the output data DQ4[0:3] and the SCSO4, SDSO4 signals of the last device (i.e., Device 4) of the series-connection are fed to a memory controller 220. The SCSO4 and SDSO4 signals are optionally provided to the memory controller 220 to detect the valid data positions.

In the particular examples, the SCK and /SCK signals are provided by the memory controller to each memory device in a multi-drop fashion. Therefore, even though incoming data is transmitted to a single component (that is, a series-connected memory device, or any other series-connected memory) with a point-to-point interface, clocks signals are loaded by multiple memory components. As a result, a practical implementation of this technique may have an operating frequency limitation of, for example, 200 MHz or less.

Figure 11:
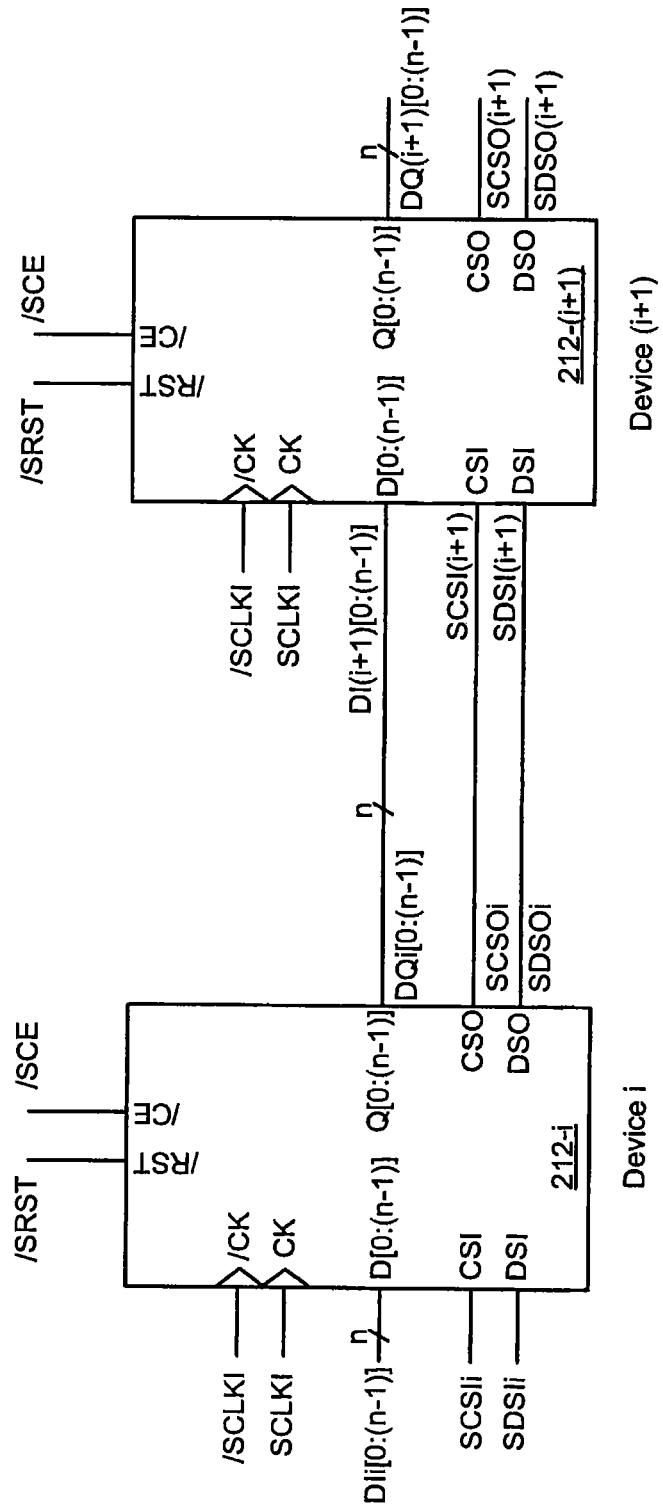
FIG. 11 is a block diagram of two devices shown in FIGS. 10A and 10B.

FIG. 11 shows details of the devices shown in FIGS. 10A and 10B. FIG. 11 shows a general implementation of the devices. The input and output data is n-bit parallel data.

Referring to FIG. 11, depicted are two of the devices of the systems shown in FIG. 10A or 8B. Referring to FIG. 11, an i-th device 212-i, Device i, and a next device 212-(i+1), Device (i+1), commonly receive the reset signal /SRST, the chip enable signal /SCE and the pair of clock signals SCLKI and /SCLKI. The data input D[0:(n−1)] of Device i receive the input data DIi[0:(n−1)] from a previous device, Device (i−1) (not shown), and outputs output data DQi[0:(n−1)] from its data output Q[0:(n−1)]. The output data DQi[0:(n−1)] from Device i is fed as input data DI(i+1)[0:(n−1)] to the data input D of Device (i+1). Device (i+1) outputs output data DQ(i+1)[0:(n−1)] from its data output Q that is transmitted to a next device, Device (i+1) (not show). The command strobe input CSI and the data strobe input DSI of Device i receive the command strobe input signal SCSIi and the data strobe input signal SDSIi, respectively, from the previous device, Device (i−1). Device i outputs the command strobe output signal SCSOi from its command strobe output CSO and the data strobe output signal SDSOi from its data strobe output DSO, respectively. The command strobe output signal SCSOi and the data strobe output signal SDSOi from Device i are fed to the command strobe input CSI and the data strobe input DSI of Device (i+1), as the command strobe input signal SCSI(i+1) and the data strobe input signal SDSI(1+1), respectively. Device (i+1) outputs the command strobe output signal SCSO(i+1) and the data strobe output signal SDSO(i+1), respectively, to the next device, Device (i+2) (not shown).

Figure 12:
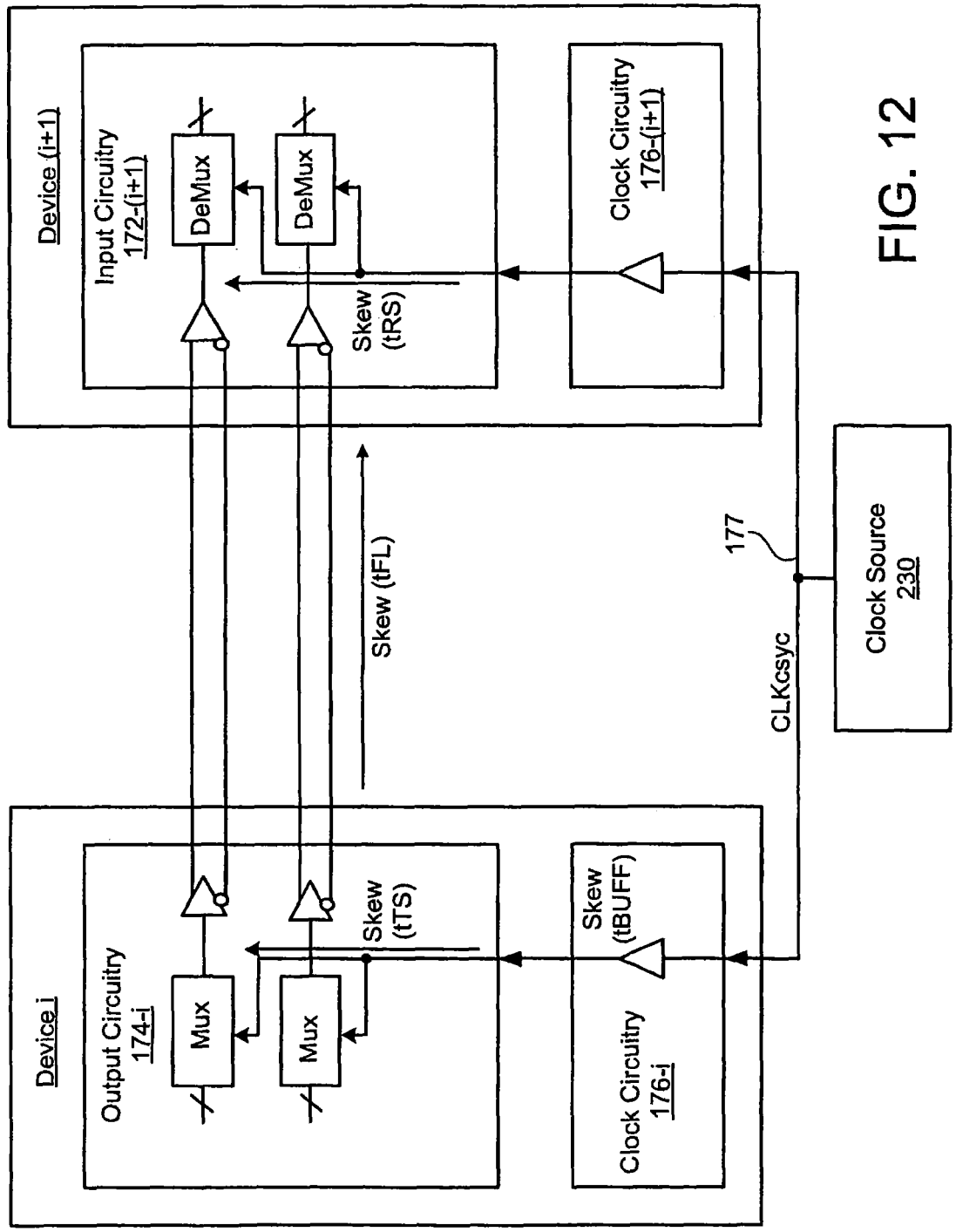
FIG. 12 is a block diagram of two devices with the common synchronous clock structure having a common clock source.

FIG. 12 depicts the common synchronous clock structure. The illustrated example includes two devices that are interconnected. Each of the devices has the structure as shown in FIG. 9. In the illustrated example, the devices have the same structure. One of the devices shows its output interface circuitry and the other shows its input interface circuitry in details. Referring to FIG. 12, one device, Device i, has a plurality of multiplexers (Muxs). Similarly, the other device, Device (i+1), has a plurality of demultiplexers (DeMuxs). In the illustrated example, Device i functions as a "transmitter". Similarly, Device (i+1) functions as a "receiver". A clock source 230 provides the common synchronous clock signal CLKcsyc to both devices, Devices i and Device (i+1). The data transfers from Device i and the data received by Device (i+1) are synchronized by the clock signal CLKcsyc.

In Device i, the clock signal CLKcsyc is fed to buffers which in turn provides buffered output clock signal CLKb0 commonly to the multiplexers for multiplexing operation. Data (n bits) is multiplexed by the multiplexers and multiplexed data output from each of the multiplexers is output through each of differential output buffers. Each differential output data is transmitted through a pair of pins of Device to lines that are connected to a pair of pins of Device (i+1).

In Device i, the clock signal CLKcsyc is fed to a buffer which in turn provides buffered output clock signal CLKb1 commonly to the demultiplexers for demultiplexing operation. The data received at the pair of pins is provided to a corresponding input differential buffer that provides buffered output data to the corresponding demultiplexer. The demultiplexed data (n bits) from each of the demultiplexers is provided. The operations of the multiplexers of Device i and the demultiplexers of Device (i+1) are synchronized by the common synchronous clock signal CLKcsyc.

The common synchronous clock structure has several skew factors as illustrated in FIG. 12, such as, for example:

(i) difference between tBUFF (clock insertion time from clock input pad to the final clock driver placed into the synchronous circuitry) in transmitting and receiving devices, (ii) delays in the signal propagation path including tTS (transmitter output delay), (iii) tRS (receiver input delay), (iv) tFL (flight time between transmitter and receiver), as well as differences between these delays among multiple signals, and (v) tJITTER (clock jitter due to many factors including power level fluctuations, instantaneous electrical characteristic changes on the clock signal line, and noise from other signals present in the system).

Therefore, it has a limited operating frequency range when many devices are connected in a multi-drop fashion.

The common synchronous clock structure has drawbacks due to the signal integrity issues like slow transition, low noise immunity, clock phase shift, and clock waveform distortion from the transmission line effect and memory device loading. Therefore, the common synchronous clock structure with the single clock source as shown in FIG. 1 may not be applicable to high-speed applications, if many devices are driven by a common clock.

In order to enhance performance, differential clocks may be used. DDR dynamic random access memory (DRAM) products employing differential clocks have been introduced. With strict timing conditions and restrictions on the distance between devices and modules, a parallel (multi-drop) clock distribution method can be employed. However, the multi-drop clock is used only for capturing address and control information which transferred at SDR. DDR data is captured using the source synchronous clocks which are driven by whichever devices is providing data, in both read and write operations.

In order to solve the problems with the parallel distributed clock structure, another approach is the source synchronous clock distribution method. The source synchronous clock distribution method provides more timing margin because many of the sources of skew in the multi-drop clock structure are eliminated. In the source synchronous clock structure, the clock may be adjusted by a clock regenerator, such as, for example, a phase-locked loop (PLL) or a delay-locked loop (DLL). In the case of series-connected devices having the source synchronous clock structure, a PLL is beneficial since there is no short-term jitter accumulation and in fact can provide a jitter filtering function on the input clock. A PLL is however more complex compared to a DLL and loop stability must be considered.

Figure 13:
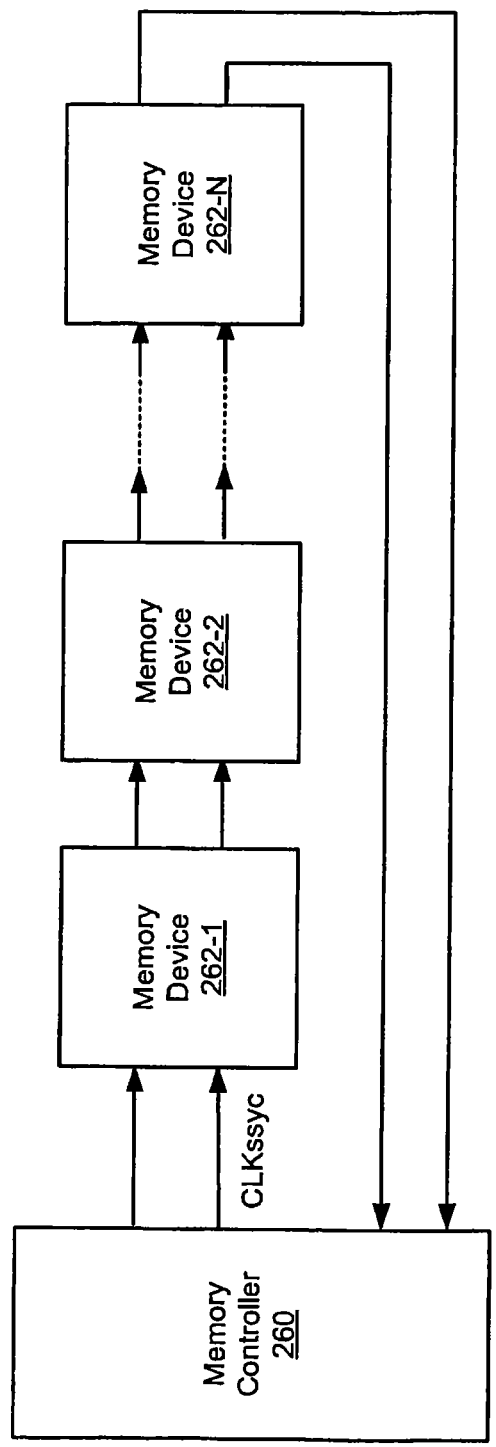
FIG. 13 is a block diagram of a system having a plurality of memory devices that are series-connected, with a source synchronous clock structure.

FIG. 13 shows a system having a plurality of memory devices that are series-connected, with a source synchronous clock structure that conforms a serial clock distribution topology, the system forming a ring structure. In the illustrated example system, a memory controller 260 communicates with a plurality (N) of memory devices 262-1, 262-2, - - -, 262-N. The memory controller 260 is connected to a first memory device 262-2 to send information on control and/or data which is propagated through the remaining memory devices 262-2-262-N in response to a source synchronous clock signal CLKssyc. An initial source synchronous clock signal CLKssyc is provided by the memory controller 260 and a synchronized clock signal is provided by device to the next device. In the system, the last (the N-th) memory device 262-N feedbacks the propagated information to the memory controller 260, so that the system forms a ring type connection. If necessary, the propagated control signals will be returned to the memory controller 260.

Figure 14:
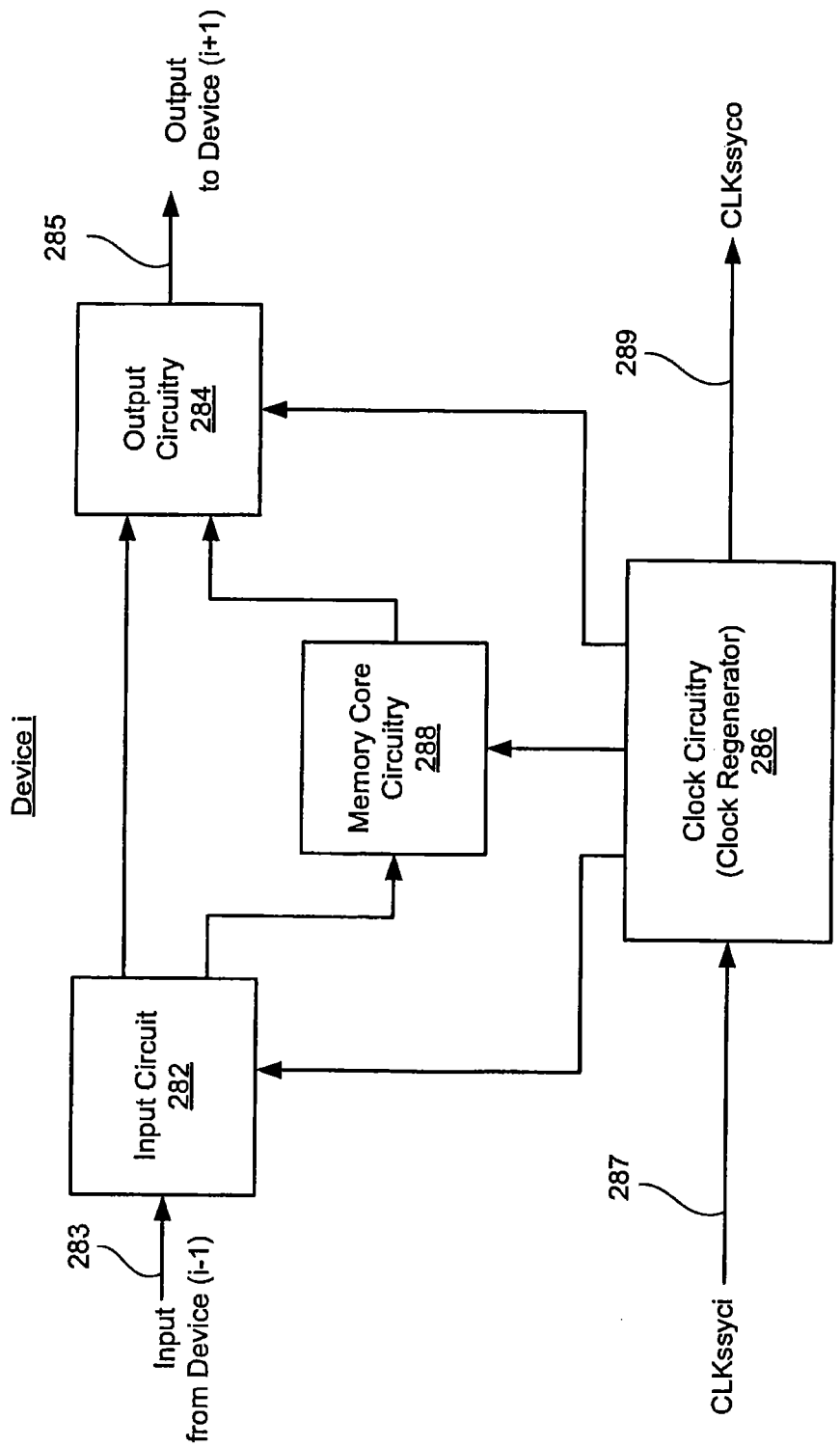
FIG. 14 is a block diagram of one of the memory devices shown in FIG. 13.

FIG. 14 shows details of one of the memory devices shown in FIG. 13. Referring to FIG. 14, Device i has input circuitry 282 for receiving an input signal 283, output circuitry 284 for providing an output signal 285, clock circuitry 286 and memory core circuitry 288. The clock circuitry 286 includes a clock reproducer for adjusting the delay, of incoming clock signal and producing properly synchronized clock signals. For this purpose, there are various possible implementations for the clock reproducer, for example, using a PLL or DLL, to adjust or synchronize clocks. In response to an input source synchronous clock signal CLKcsyci 287, the clock circuitry 286 delivers clocks to the input circuitry 282, the memory core circuitry 288 and the output circuitry 284 for their respective operation. The clock regenerator of the clock circuitry 286 provides an output source synchronous clock signal CLKcsyco 289 synchronized with the input source synchronous clock signal CLKssyci 287 to the next device. The output clock signal CLKssyco 289 is the reproduced version of the input clock signal CLKssyci. The input circuitry 222 and the output circuitry 284 perform interface operations in response to the clocks provided by the clock circuitry 286.

Figure 15:
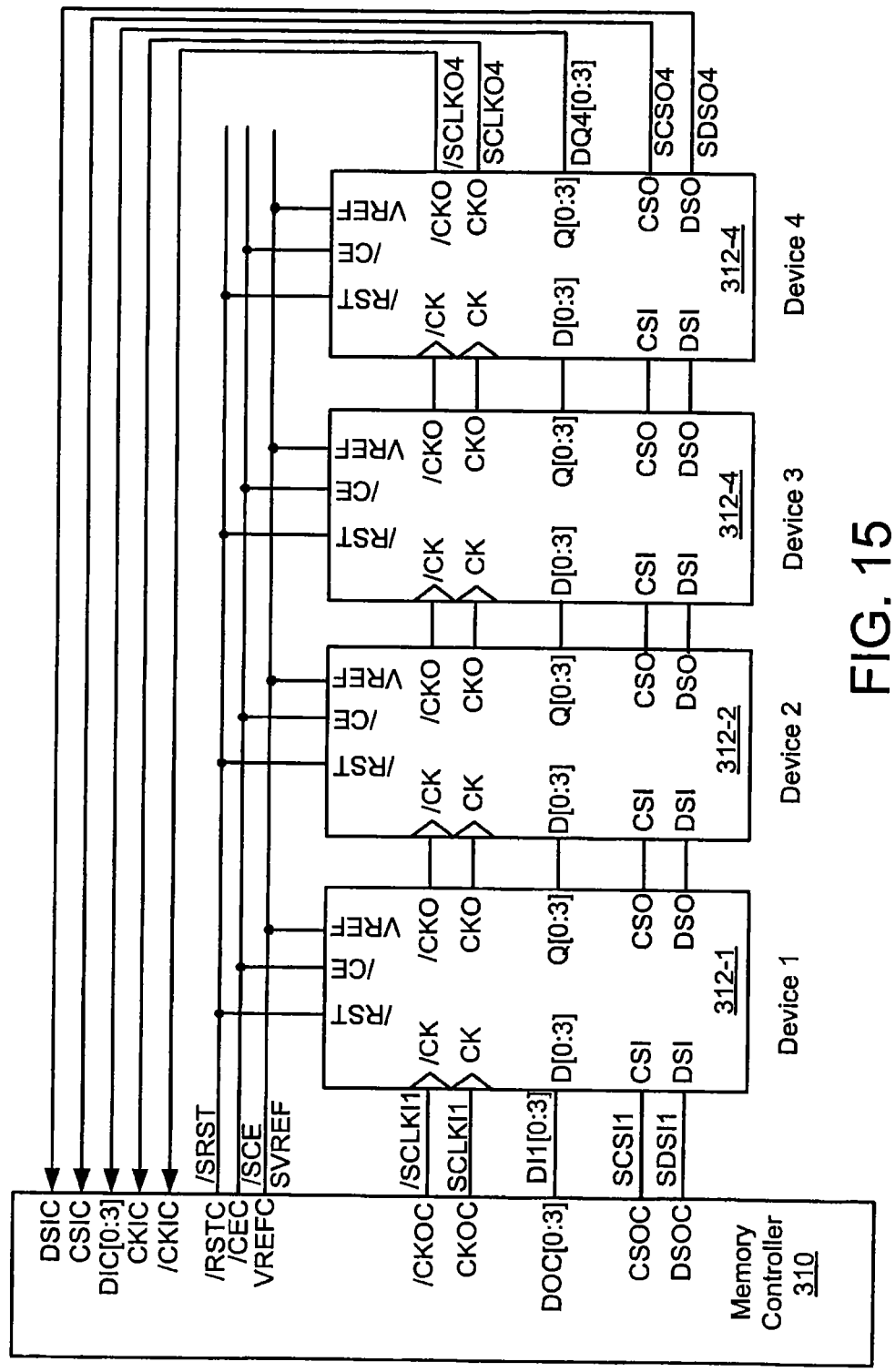
FIG. 15 is a block diagram of a system having a memory controller and a plurality of memory devices that are series-connected, with the source synchronous clock structure.

FIG. 15 shows a system having a memory controller and a plurality of memory devices that are series-connected as shown in FIG. 13. The system has the source synchronous clock structure. In the system the last device is connected to the controller. Referring to FIG. 15, a system includes a memory controller 310 and a plurality of memory devices 312-1-312-4 that are series-connected, with the source synchronous clock structure. Each device is similar to that of FIG. 10A, but clocking is different from that of FIG. 10A. Each device receives a clock signal from the previous component (a memory device or the memory controller for the first memory device or Device 1). Each device has a PLL (not shown) for producing an internal clock. Example details of an architecture featuring devices having PLL for clock synchronization are provided in International Publication No. WO/2008/067636 A1 (12 Jun. 2008), the disclosure of which is incorporated by reference in its entirety.

In the example illustrated in FIG. 15, the source synchronous clock structure requires a PLL in each component (e.g., a device) to provide a phase shifted internal clock to capture incoming data or to provide a phase shifted output clock. If, for example, received clock edges are co-incident with received data transitions, the PLL is required to create a 90° clock phase shift to center received input SCLKI and /SCLKI signals within the data valid window of data input signals D[0:3]. On the other hand, if received clock edges of the SCLKI and /SCLKI signals are centered within the received data valid window, a 90° phase shifted clock is required to generate an output clock signal SCLKO and a complementary output clock signal /SCLKO (hereinafter referred to as "SCLKO signal" and "/SCLKO signal, respectively). It will be assumed the memory devices operate in this latter mode in the following explanation.

In write operation, the memory controller 310 transmits a write command and write data (Q[0:3]) to the first device (Device 1, 312-1) in the series-connection of devices. The first device 312-1 captures the incoming data D[0:3] with the input clock which is a center-aligned with incoming data from the controller 310. If the first device 312-1 is the "target" or "designated" device of the write operation as determined by the device ID issued as part of the write command by the memory controller 310, upon device ID match determination, the captured data will be written into the memory array (not shown) of that device. In this case the write command and write data may optionally be prevented from being re-transmitted to the next device in the series connection of devices. The ID number for designating a specific device is shown in FIG. 6, e.g., referenced by "147-2" and the input data DI1[0:3] is "data" of the command format 147-2.

If the first device 312-1 is not the "target" or "designated" device of the write operation as determined by the device ID issued as part of the write command by the memory controller 310, the incoming data must be re-transmitted to the second component (Device 2, 312-2) along with 90° shifted clock outputs CKO and /CKO. The second component (Device 2, 312-2) receives the re-transmitted data from the first component (Device 1, 312-1) with a clock that is center-aligned with incoming data. By this method, data is passed from the first component (the first device 312-1) to the last component (the last device 312-3).

Output data DQ[0:3], the SCLKO, /SCLKO, SCSO and SDSO signals from the last device (i.e., Device 4) of the series-connection of devices are fed back to the memory controller 310. The SCSO and SDSO signals are provided to the memory controller 310 to detect the valid point of data. Unlike the parallel distributed clock, the controller 310 does not know the exact latency from the series-connected devices so that the SCSO and SDSO signals along with the SCLKO, /SCLKO signals are required as inputs.

In read operation, the memory controller 310 issues a read command with an ID number of a designated device to the first device of the series-connection of the devices. Again, if the designated device is Device 1, upon device ID match determination, Device 1 will process the command (i.e., read) to access the memory array in that device. The read result of the first device is transmitted to the second component (Device 2, 312-2) along with output of a 90° shifted clock. Then, the second component (Device 2, 312-2) receives the read result of the first component along with a clock which is center-aligned with input data. By this flow, the read data is passed through from the remaining devices to the memory controller 310. The ID number is given by the format 147-3 shown in FIG. 6. The access is performed in accordance with the addresses included in that command format.

Figure 16:
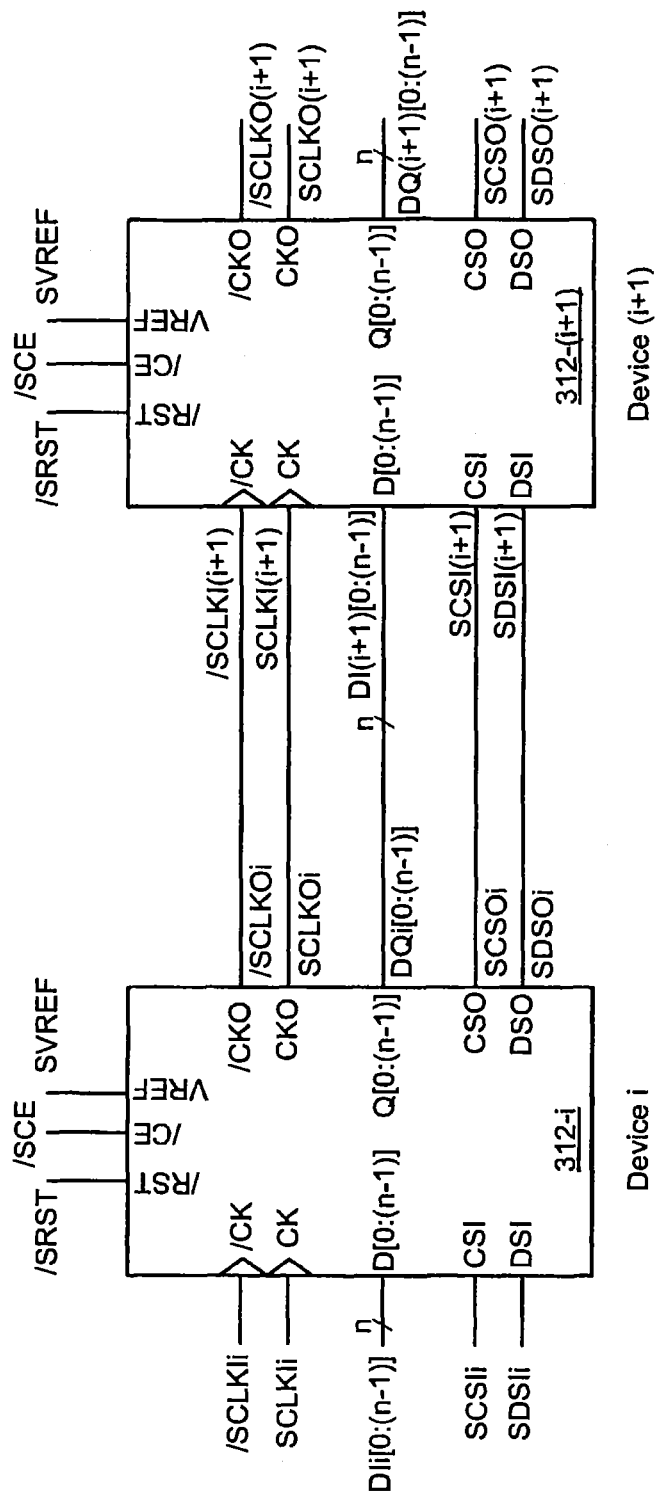
FIG. 16 is a block diagram of two devices shown in FIG. 15.

FIG. 16 shows two devices shown in FIG. 15. Referring to FIG. 16, one device, Device i, and the next device, Device (i+1), commonly receive the reset signal /SRST, the chip enable signal /SCE and the pair of the clock signals SCLKI and /SCLKI.

The clock inputs CK and /CK of Device i receive the input clock signals SCLKIi and /SCLKIi, respectively, from a previous device, Device (i−1) (not shown), and outputs the corresponding output clock signals SCLKOi and /SCLKOi from its clock outputs CKO and /CKO, respectively. Device (i+1) receives the output clock signals SCLKOi and /SCLKOi from Device i, as the input clock signals SCLKI(i+1) and /SCLKI (i+1), respectively, and outputs the output clock signals SCLKO(i+1) and /SCLKO(i+1) from its clock outputs CKO and /CKO, respectively, that are transferred to a next device, Device (i+2) (not shown).

The data input D of Device i receives the input data DIi[0:(n−1)] from the previous device, Device (i−1), and outputs output data DQi[0:(n−1)] from its data output Q. The output data DQi[0:(n−1)] from Device i is fed as input data Di(i+1)[0:(n−1)] to the data input D of Device (i+1). Device (i+1) outputs output data DQ(i+1)[0:(n−1)] from its data output Q that is transmitted to the next device, Device (i+1). The command strobe input CSI and the data strobe input DSI of Device i receive the command strobe input signal SCSIi and the data strobe input signal SDSIi, respectively, from the previous device, Device (i−1). Device i outputs the command strobe output signal SCSOi from its command strobe output CSO and the data strobe output signal SDSOi from its data strobe output DSO, respectively. The command strobe output signal SCSOi and the data strobe output signal SDSOi from Device i are fed to the command strobe input CSI and the data strobe input DSI of Device (i+1), as the command strobe input signal SCSI(i+1) and the data strobe input signal SDSI(i+1), respectively. Device (i+1) outputs the command strobe output signal SCSO(i+1) and the data strobe output signal SDSO(i+1), respectively, to the next device, Device (i+2) (not shown).

Figure 17:
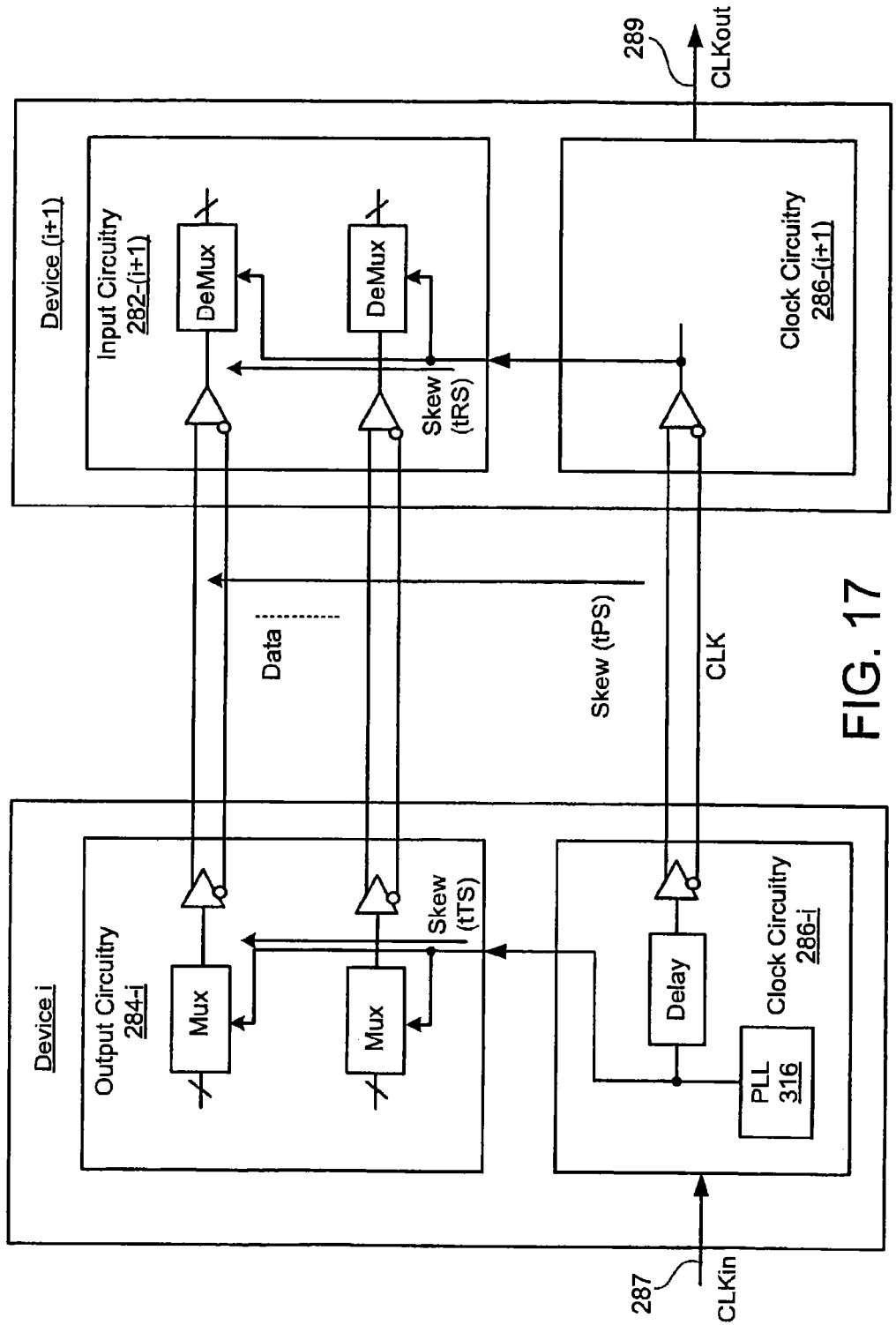
FIG. 17 is a block diagram of two devices with the source synchronous clock structure.

FIG. 17 shows the source synchronous clock structure with PLL. The illustrated example includes two devices that are interconnected. One of them functions as a transmitter and the other functions as a receiver. Each of the devices has a structure as shown in FIG. 14. In the illustrated example, the devices have the same structure. One of the devices shows its output interface circuitry and the other shows its input interface circuitry in details. Refereeing to FIG. 17, one device 312-i, Device 1, (a transmitter) has a plurality of multiplexers (Muxs), a PLL 316, a clock multiplexer, a differential input buffer and a plurality of differential output buffers.

The other device 312-(i+1) (a receiver), Device (i+1), includes a plurality of demultiplexers (DeMuxs), a plurality of differential input buffers.

A differential clock signal CLKi (CK and /CK) 287 is input through the differential input buffer to the PLL of Device i which in turn provides a regenerated internal clock to the multiplexers to synchronize the operations of the multiplexers. The regenerated clock is also fed to the clock multiplexer that generates an output clock in exactly the same way output data is generated to match the delay between data and clock paths. The output clock is provided to drive the output clock signal for transmission to Device (i+1). Device (i+1) receives the clock and provides it to demultiplexers to synchronize the operations of the demultiplexers.

Compared to the multi-drop clock structure, the source synchronous clock structure with PLL has fewer skew components. It does not have a significant clock insertion delay issue (tBUFF skew) because the internal regenerated clock is locked in phase to the input clock. Fly time skew (tFL) between two devices i and ((i+1) is no longer an issue because output clock and output data follow identical paths. In addition, tJITTER may be reduced due to the filtering action of the PLL.

The source synchronous clock structure provides a higher frequency operating range than that of the multi-drop clock structure. For example, operation at frequencies exceeding 800 MHz may be achieved if PLL jitter and phase error are well controlled. For these reasons, the source synchronous clock structure is adopted in a system having series-connected memories in order to provide higher data read bandwidth.

An example of the source synchronous clock structure is disclosed in "Designing High Data Rate Interfaces", IEEE 2004 VLSI Circuits Symposium, Jun. 16, 2004.

Figure 18A:
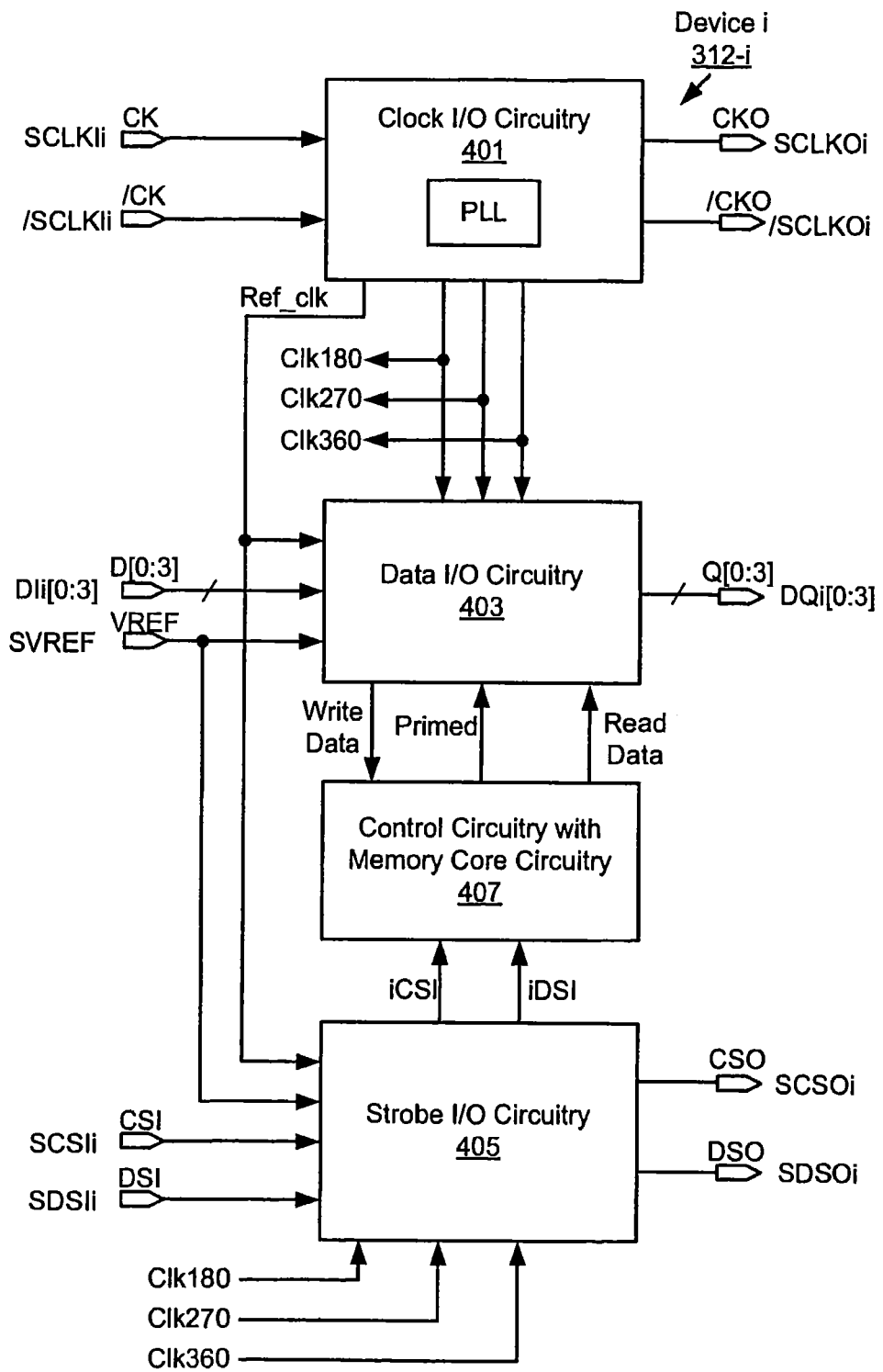
FIG. 18A is a block diagram of one device of the series-connected devices shown in FIG. 15.

FIG. 18A shows one of the series-connected devices shown in FIG. 15. Referring to FIG. 18A, various input signals (e.g., the SCLKIi, /SCLKIi, SCSIi, SDSIi signals) and input data DIi[0:3] are provided to an i-th device "Device i" 312-i of the series-connected devices and that device provides various output signals (e.g., the SCLKOi, /SCLKOi, SCSOi, SDSOi signals) and output data DQi[0:3]. In the particular example, the data has four bits [0:3]. The data may have another number of bits.

The device 312-i includes clock I/O circuitry 401 having a phase-locked loop (PLL), data I/O circuitry 403, strobe I/O circuitry 405 and control circuitry with memory core circuitry 407. The clock I/O circuitry 401 receives the SCLKIi, /SCLKIi signals at the clock inputs CK and /CK and outputs the SCLKOi, /SCLKOi signals through the clock outputs CKO and /CKO. The clock I/O circuitry 401 provides a reference clock signal Ref_clk to the data I/O circuitry 403 and the strobe I/O circuitry 405. The reference clock signal Ref_clk is provided as an internal clock signal. The clock I/O circuitry 401 produces a plurality of clock signals. In the particular example, the clock I/O circuitry 401 outputs phase shifted clock signals of 180°, 270° and 360° to the data I/O circuitry 403 and the strobe I/O circuitry 405.

A signal SVREF of a reference voltage Vref from the memory controller (e.g., the memory controller 310 shown in FIG. 15) is provided to the data I/O circuitry 403 and the strobe I/O circuitry 405. The data I/O circuitry 403 receives input data DIi[0:3] and outputs output data DQi[0:3]. The strobe I/O circuitry 405 receives the SCSIi and SDSIi signals and outputs the SCSOi and SDSOi signals. The control circuitry 407 receives an internal command strobe input signal iCSI and an internal data strobe input signal iDSI from the strobe I/O circuitry 405 and data to be written "write data" from the data I/O circuitry 403. The control circuitry 407 provides "read data" read from its memory (not shown) to the strobe I/O circuitry 405.

Figure 18B:
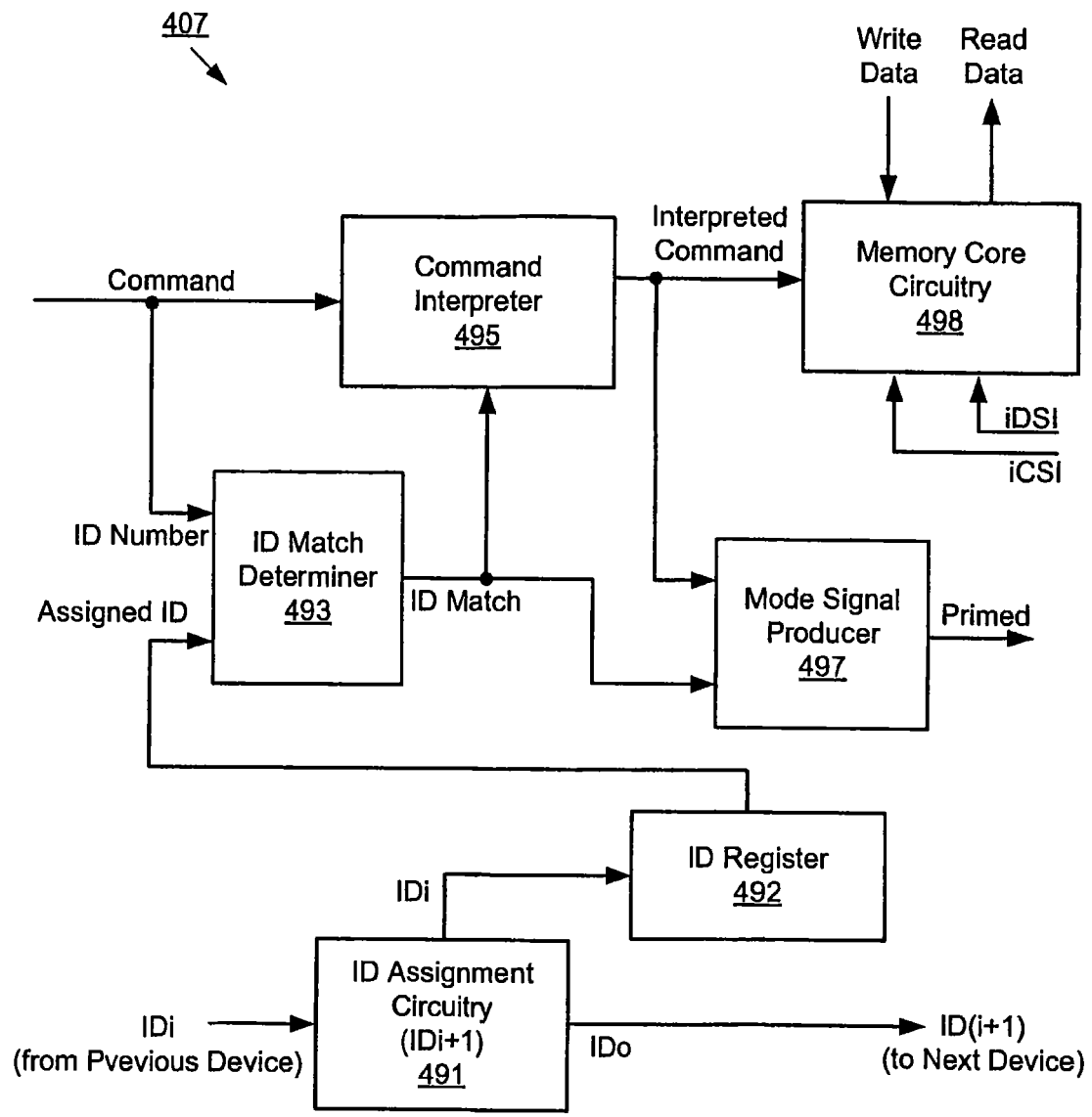
FIG. 18B is a block diagram of control circuitry with memory core circuitry of the device shown in FIG. 18A.

FIG. 18B shows an example of the control circuitry with memory core circuitry 407 shown in FIG. 18A. The control circuitry 407 performs ID assignment operations in the initial mode as shown in FIG. 4 and FIG. 5A and memory access operations in the normal mode as shown in FIG. 4 and FIG. 5B.

Referring to FIGS. 18A and 18B, ID assignment circuitry 491 performs an ID assignment and an ID number calculation in the initial mode. The number of an input ID, IDi, is registered in an ID register 492. The number of the calculation result (i.e., IDi+1) is provided by Device i as an output IDo to the next device. The ID register 492 holds the assigned ID. Thereafter, in the normal mode, a command having a format as shown in FIG. 6 is fed to an ID match determiner 493 and a command interpreter 495. The ID match determiner 493 determines whether the input ID number matches the assigned ID held in the ID register 491 and if they match, an ID match signal, ID Match, of logic "high" will be provided. If there is no match, the ID match signal will be logic "low". In the event of the ID match determination with IDi, Device i is a designated or target device. In the event of no ID match, Device i is not a designated device. The command interpreter 495 including an OP code decoder decodes the OP code contained in the input command and provides an interpreted command (e.g., write, read), in response to the "high" ID match signal. In response to the interpreted command and the ID match signal, a mode signal producer 497 provides a "Primed" signal. In the particular example, the Primed signal is logic "low" when there is no ID match. When there is an ID match, the Primed signal is "high" and "low", the OP code is "read" (i.e., the command is a data read command) and "write" (i.e., the command is a data write command), respectively. In response to the interpreted command, for example, data is written to or data is read from memory core circuitry 498 that receives the internal command strobe input signal iCSI and the internal data strobe input signal iDSI. An example of the command interpreter is disclosed in International Publication No. WO/2008/067659 A1 (12 Jun. 2008), the disclosure of which is expressly incorporated herein by reference in its entirety. An example of an ID match determiner is disclosed in U.S. patent application Ser. No. 12/034, 686 "Serial Data Flow Control In Multiple Independent Serial Port" filed Feb. 21, 2008, the disclosure of which is incorporated by reference in its entirety.

Figure 18C:
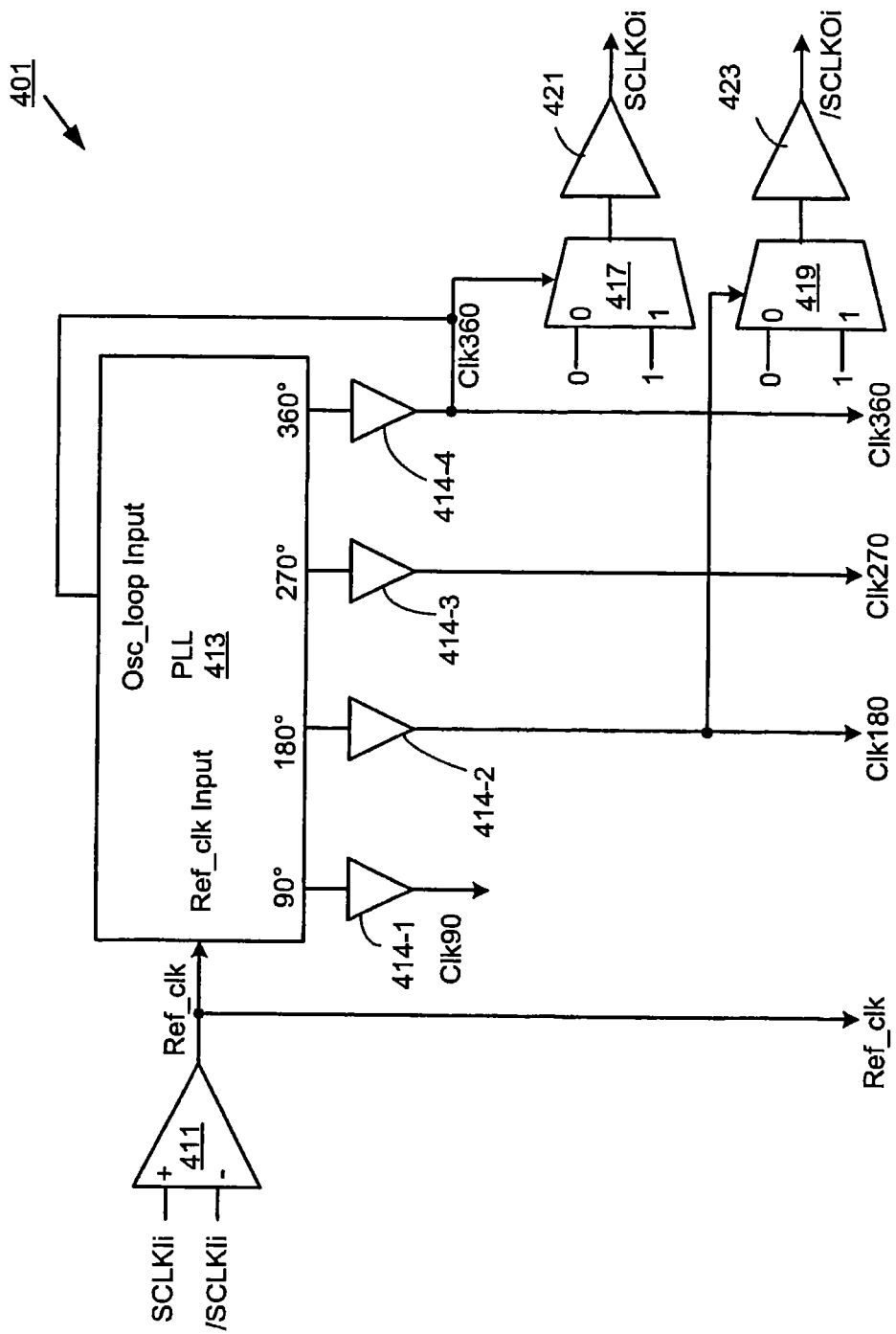
FIG. 18C is a block diagram of clock I/O circuitry of the device shown in FIG. 18A.

FIG. 18C shows details of the clock I/O circuitry 401 shown in FIG. 18A. Referring to FIGS. 18A and 18C, the SCLKIi and /SCLKIi signals are fed to "+" and "−" inputs of an input buffer 411 which in turn provides the reference clock signal Ref_clk to a reference clock input "Ref_clk input" of a PLL 413. The reference clock signal Ref_clk transitions at a time when the SCLKIi signal transitions (e.g., from "high" to "low") and the /SCLKIi signal transitions in an opposite direction (e.g., from "low" to "high"). The PLL 413 operates in synchronization with the transitions of the reference clock signal Ref_clk.

The PLL 413 includes an oscillator and produces four clock signals phase shifted by 90°, 180°, 270° and 360°, with respect to the input reference clock signal Ref_clk, through buffers 414-1, 414-2, 414-3 and 414-4, respectively. The four phase shifted clock signals of 90°, 180°, 270° and 360° referenced by Clk90, Clk180, Clk270 and Clk360 are hereinafter referred to as "Clk90 signal", "Clk180 signal", "Clk270 signal" and "Clk360 signal", respectively. The Clk360 signal is fed to an oscillation input "Osc_loop Input" of the PLL 413. The Clk360 and Clk180 signals are fed to selection inputs of selectors 417 and 419, respectively. Each of the selectors 417 and 419 receives logic "0" and "1" signals at its "0" and "1" inputs, respectively. In the selector 417, its "0" or "1" input is selected in responses to the Clk360 signal, the output signal of which is provided as the SCLKOi signal through an output buffer 421. Similarly, in the selector 419, its "0" or "1" input is selected in response to the Clk180 signal, the output signal of which is provided as the /SCLKOi signal through an output buffer 423. The SCKO and /SCKO signals are therefore complementary differential clock signals which are 180° out of phase. The selectors 417 and 419 are to match the delay between clock and data paths.

Figure 18D:
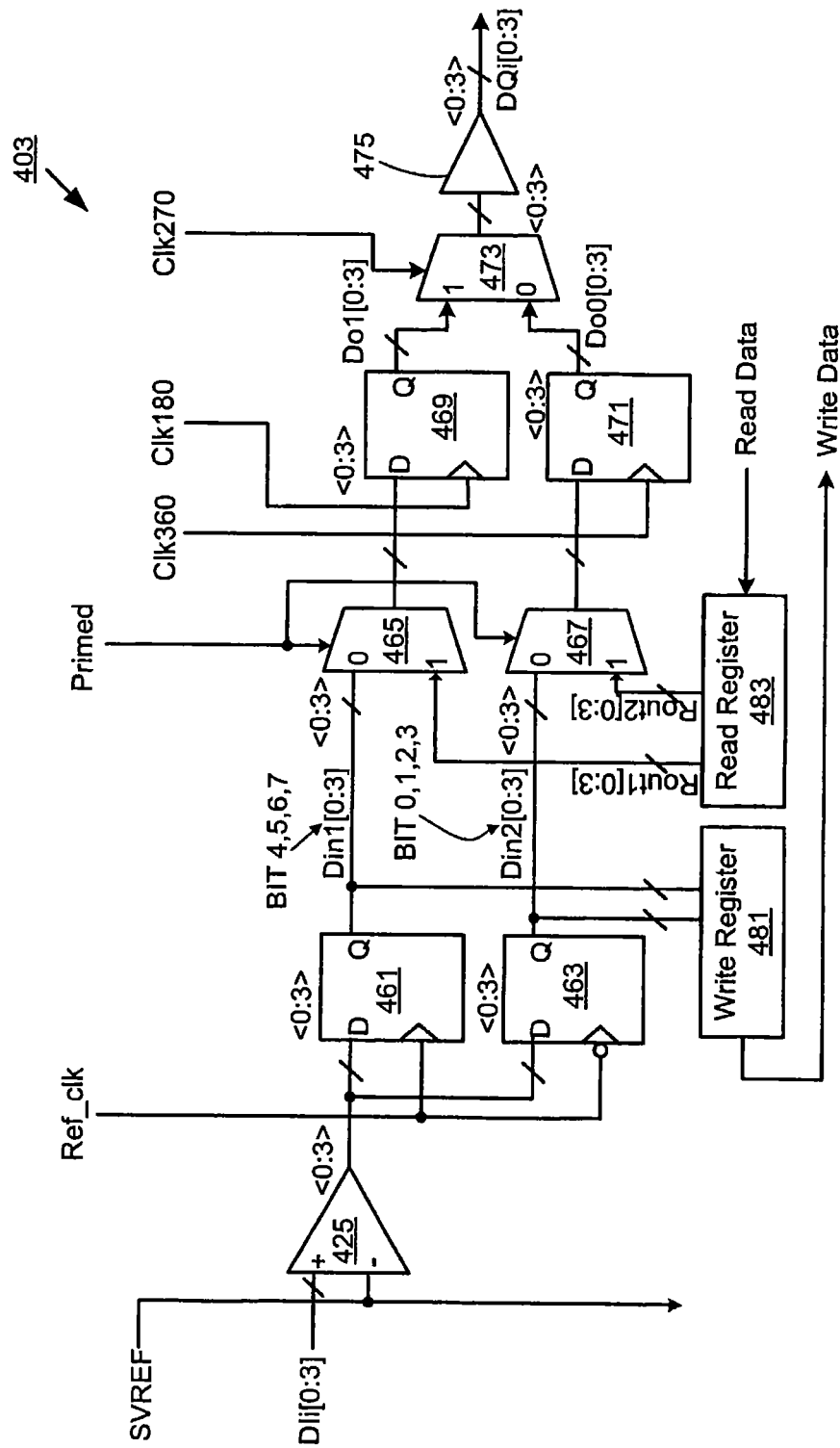
FIG. 18D is a block diagram of data I/O circuitry of the device shown in FIG. 18A.

FIG. 18D shows the data I/O circuitry 403 shown in FIG. 18A. Referring to FIGS. 18A and 18D, the reference voltage signal SVREF is provided to "−" input of an input buffer 425. The input data DIi[0:3] is fed to "+" input of the input buffer 425, the output <0:3> of which is fed to data input "D" of D-type flip-flops (D-FFs) 461 and 463 that are clocked by positive and negative edges of the reference clock signal Ref_clk to capture DDR data. Although the device has a four-bit data path, the circuitry for only a single bit is shown. Each of the circuit elements processing data is replicated four times in the actual devices. The four-bit output Din1 [0:3] of the D-FF 461 comprises bits 4, 5, 6 and 7 and is fed to "0" input of a selector 465. Similarly, the four-bit output Din2 [0:3] of the D-FF 463 comprises bits 0, 1, 2 and 3 and is fed to "0" input of a selector 467. The "1" inputs of the selectors 465 and 467 receive read data, as Rout1[0:3] (bits 4, 5, 6 and 7) and Rout2[0:3] (bits 0, 1, 2 and 3), respectively. The selectors 465 and 467 perform selection operation in accordance with a "Primed" signal. The Primed signal becomes "high" when the device is selected and "low" when not selected in accordance with the ID match determination, while the device is selected by the /SCE signal. The selected output signals from the selectors 465 and 467 are fed to data inputs D of D-FFs 469 and 471 that are clocked by the Clk180 and Clk360 signals, respectively, for data latching operation. Internally latched output data Do1[0:3] of the D-FF 469 and internally latched output data Do0[0:3] of the D-FF 471 are fed to "1" and "0" inputs of a selector 473, respectively, that performs selection operation in response to the Clk270 signal. Selected output <0:3> from the selector 473 is provided through an output buffer 475 as the output data DQi[0:3].

Figure 18E:
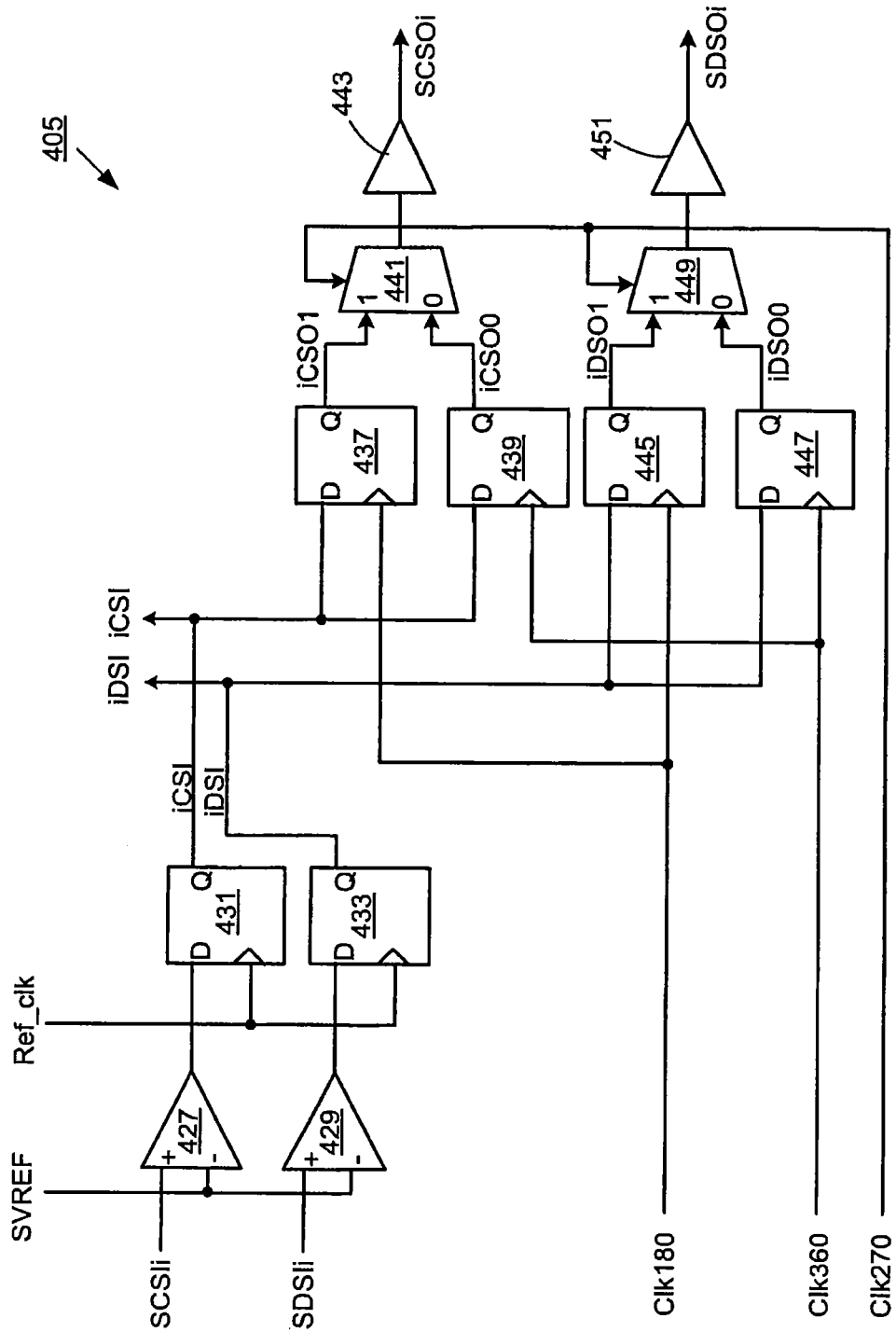
FIG. 18E is a block diagram of strobe I/O circuitry of the device shown in FIG. 18A.

FIG. 18E shows the strobe I/O circuitry 405 shown in FIG. 18A. Referring to FIGS. 18A and 18E, the reference voltage signal SVREF is provided to "−" input of input buffers (comparators) 427 and 429. The SCSIi and SDSIi signals are fed to "+" inputs of the input buffers 427 and 429, respectively, the outputs of which are provided to D inputs of D-FFs 431 and 433. The D-FFs 431 and 433 perform latching operation in response to the reference clock signal Ref_clk. The D-FFs 431 and 433 output the internal command strobe input signal iCSI (hereinafter referred to as "iCSI signal") and the internal data strobe input signal iDSI signal (hereinafter referred to as "iDSI signal") that are provided to the core logic circuitry 407.

The iCSI signal is fed to D inputs of the D-FFs 437 and 439 that are clocked by the Clk180 and Clk360 signals, respectively. The D-FFs 437 and 439 output iCSO1 and iCSO0 signals that are fed to "1" and "0" inputs of a selector 441, respectively. In response to the Clk270 signal, a selected output signal from the selector 441 is provided through an output buffer 443 as the SCSOi signal. The iDSI signal is fed to D inputs of the D-FFs 445 and 447 that are clocked by the Clk180 and Clk360 signals, respectively. Similarly, the iDSO1 signal output from the D-FF 445 and the iDSO0 signal output from the D-FF 447 are fed to "1" and "0" inputs of a selector 449 which in turn selects one of the iDSO1 and iDSO0 in response to the Clk270 signal. A selected output signal from the selector 449 is provided through an output buffer 451 as the SDSOi signal.

Figure 19:
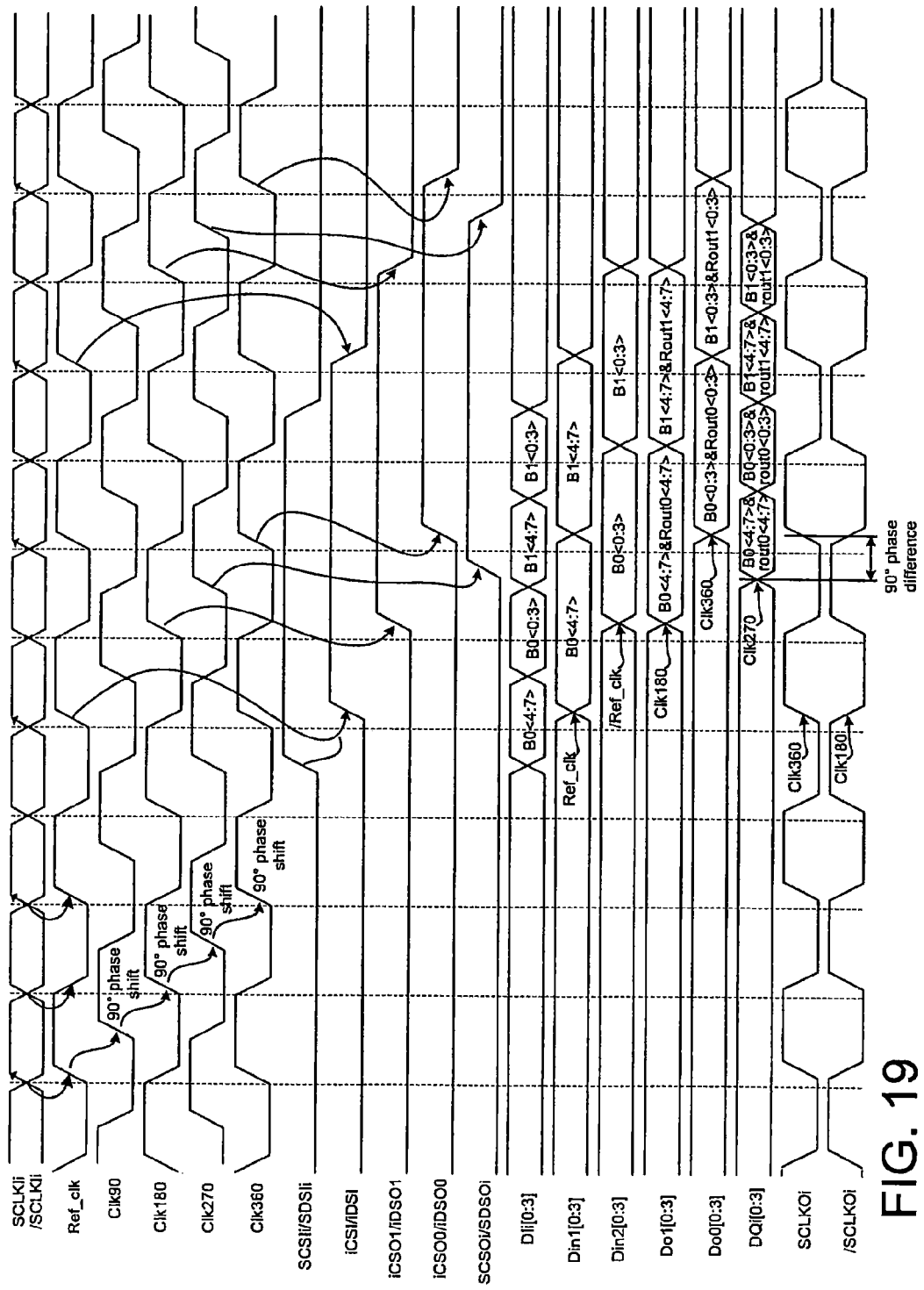
FIG. 19 is a timing diagram for the source synchronous clock structure as shown in FIGS. 18A-18E.

FIG. 19 shows various signals and data for the source synchronous clock structure as shown in FIGS. 18A-18E. Referring to FIGS. 18A-18E and 19, each device includes a PLL that establishes 90° phase difference between the SCLKOi, /SCLKOi signals and output data DQi[0:3], the SCSOi and SDSOi signals in order to provide a centered clock for next device. As shown in FIG. 19, there is 90° phase difference between output data DQi[0:3] and the SCLKOi, /SCLKOi signals.

As mentioned previously, in the normal operation mode, the Primed signal has the logic "low (i.e., 0)" or "high (i.e., 1)" state depending upon the ID match determination and the operation mode. In the non-ID match determination, Device i merely forwards the data to next device (i+1). The Primed signal is in logic "0" and thus, the latched data from the D-FFs 461 and 463, Din1[0:3] (i.e., bits 4, 5, 6, and 7) and Din2[0:3] (i.e., bits 0, 1, 2 and 3) are selected by the selectors 465 and 467 and output data DQi[0:3] is provided to the next memory device. Also, the latched data from the D-FFs 461 and 463, Din1[0:3] (i.e., bits 4, 5, 6, and 7) and Din2[0:3] (i.e., bits 0, 1, 2 and 3) are not written into a write register 481 by the "Primed" signal control (not shown). Upon non-ID match determination, the written data of 8-bits (bits 0-7) is not provided to the core logic circuitry 407. However, in the case of the ID match determination and the write operation mode, the latched data from the D-FFs 461 and 463, Din1[0:3] (i.e., bits 4, 5, 6, and 7) and Din2[0:3] (i.e., bits 0, 1, 2 and 3) are written into the memory core circuitry 498 through the write register 481).

In the case of the ID match determination and the read operation mode (the Primed signal being logic "1"), the core logic circuitry 407 accesses the data store elements therein and reads the data and the read data is written into a read register 483. Read data, as Rout1[0:3] (bits 4, 5, 6 and 7) and Rout2[0:3] (bits 0, 1, 2 and 3) are selected by the selectors 465 and 467, respectively, and eventually output data DQi[0:3] is provided to the next device.

When a system having a series-connected memory devices is adopted to some applications, PLLs in all of the series-connected memory devices are to be turned on to transmit the input data to the next device because all input and output buffers are used. Therefore, if there are a great number of memory devices in the system, it will consume much power because of the PLL operations.

The example addresses this power consumption issue, for example for multi-stacked chip based memory with hybrid synchronous clocking such as, for example, non-volatile flash memory, which is generally packaged with multi-chips to reduce the area of mounting memories on the system board. Along with this, the fully source synchronous clocking with an alternate PLL on and off control feature is introduced.

As described above, a plurality of memory devices is connected. Such devices can be divided to form groups, each group being characterized with clock structure, among others.

A system including series-connected devices having PLLs is disclosed in U.S. patent application Ser. No. 12/032,249 filed Feb. 15, 2008, the disclosure of which is incorporated herein by reference in its entirety. In the disclosed system, the PLLs of all devices turned on and if unnecessary, the PLLs of all devices will be turned off to save power consumption.

Figure 20A:
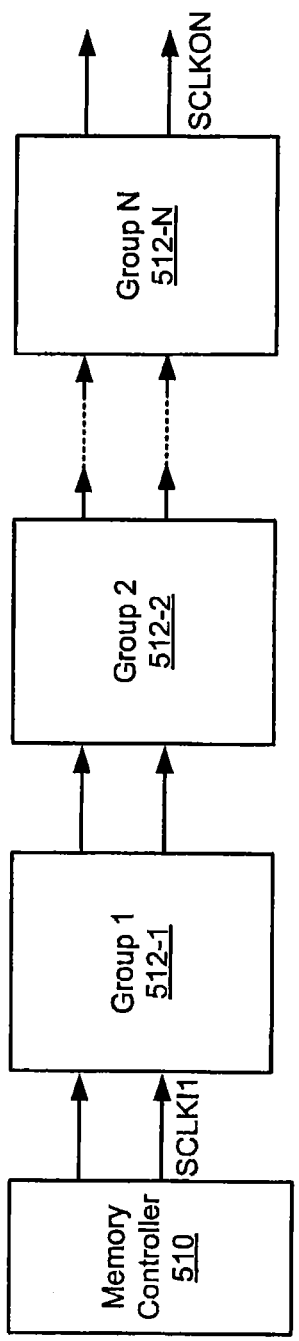
FIG. 20A is a block diagram of a system having a memory controller and a plurality of memory devices that are series-connected, with the source synchronous clock structure and the common synchronous clock structure.

FIG. 20A shows a system having a memory controller and a plurality of memory devices that are series-connected. In the illustrated example, the devices are grouped, each group having a combination of the source synchronous clock structure and the common synchronous clock structure. The last device of the last group is not connected to the source controller, but connected to other controller or logic (not shown). Referring to FIG. 20A, a memory controller 510 communicates with a plurality of memory devices included in groups 1-N, 512-1-512-N. In each of groups 1-N, a plurality of devices (e.g., four devices) are series-connected as shown in FIG. 15. The memory controller 510 sends an input clock signal SCLKI1 to group 1, 512-1, with data and other information. Each of groups 1-N outputs its output clock signal to the next group. Group N outputs an output clock signal SCLKON of the series-connection.

Figure 20B:
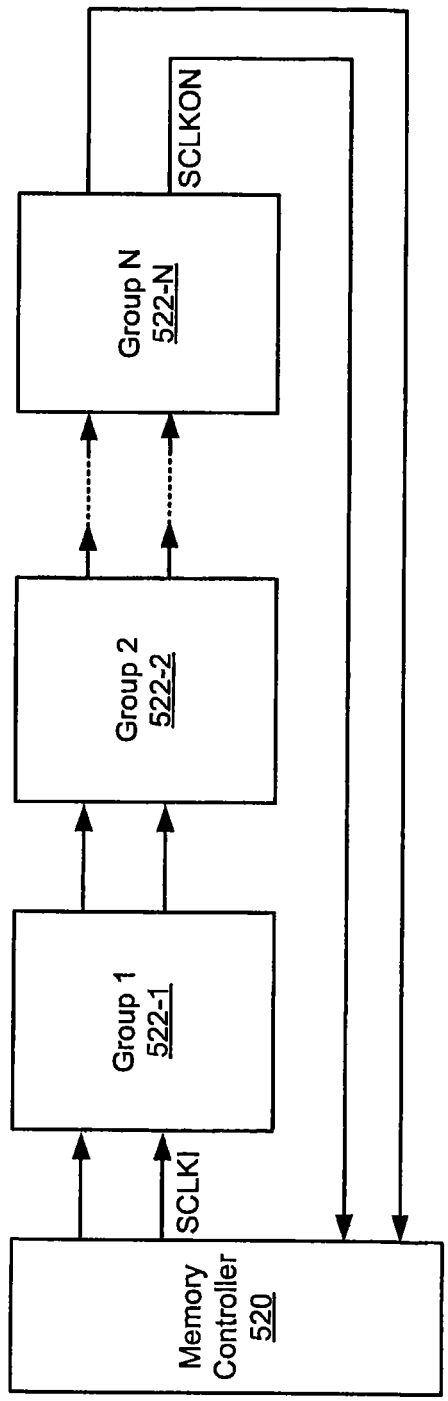
FIG. 20B is a block diagram of another system having a memory controller and a plurality of memory devices that are series-connected, with the source synchronous clock structure and the common synchronous clock structure.

FIG. 20B shows a system having a memory controller and a plurality of memory devices that are series-connected, the devices being grouped. In the system, each group has a combination of the source synchronous clock structure and the common synchronous clock structure and the last device of the last group is connected to the controller. In the illustrated example, a memory controller 520 communicates with a plurality of memory devices included in groups 1, 2, - - -, N. In each of groups 1-N, a plurality of devices (e.g., four devices) are series-connected as shown in FIG. 15. A clock transfer path is similar to that of FIG. 20A. The output cock signal SCLKON from group N is provided to the memory controller 520. Also, a propagated signal containing data and other information is fed back from the last device of group N to the memory controller 520.

In the systems as shown in FIGS. 20A and 20B, the clock structure within one group may be different from that of another group. Individual devices within one group may also be clocked using a different clock structure from that of another group. Each memory device may comprise a single die or chip, or multiple dies or chips in the form of a multi-chip module (MCM) or a multi-chip package (MCP).

Figure 21A:
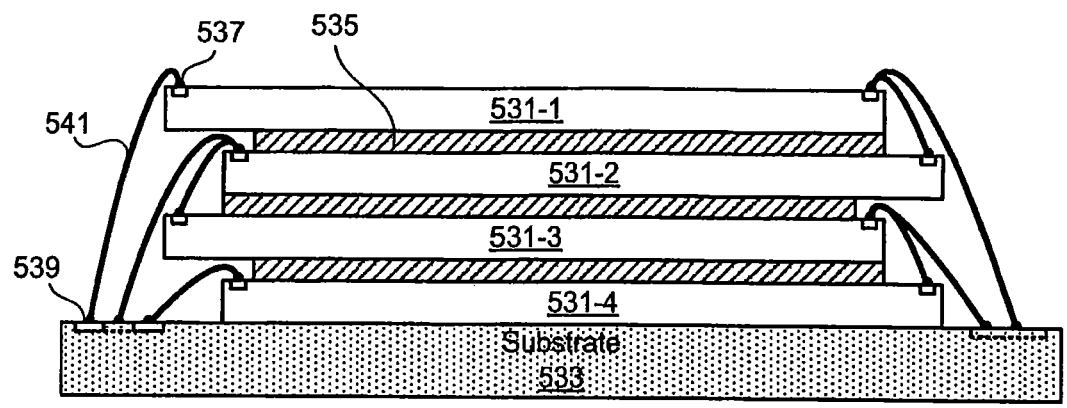
FIG. 21A is a sectional view of an example of MCP (Multiple-Chip Package) structure with wire bonding.

FIG. 21A shows an exemplary system as implemented in a multiple-chip package (MCP) structure with wire bonding. Referring to FIG. 21A, the system has a plurality of memory devices 531-1-531-4, in a vertical stack mounted on a substrate 533 which is a wiring board. The devices are separated by an insulator 535. The devices 531-1-531-4 have multiple connection pads 537. The substrate 533 has multiple connection pads 539. The pads 537 of the devices 531-1-531-4 are connected to the pads 539 of the substrate 533 and those of the other devices by wires 541. The devices 531-1-531-4, the substrate 533 and the wires 541 are housed within an MCP enclosure (not shown). The MCP enclosure may comprise a sealing medium or resin that encases system components at all sides, thereby providing a rigid package in which the components are fixed. The substrate 533 has other connection pads or terminals (not shown) at the opposite side to the devices. The other terminals are connected to another MCP or the memory controller to send or receive signals. The devices 531-1-531-4 are capable of communicating with the devices of the other MCP or the memory controller. In the particular example, the system includes four chips (i.e., four memory devices), but the system includes any number of chips.

Figure 21B:
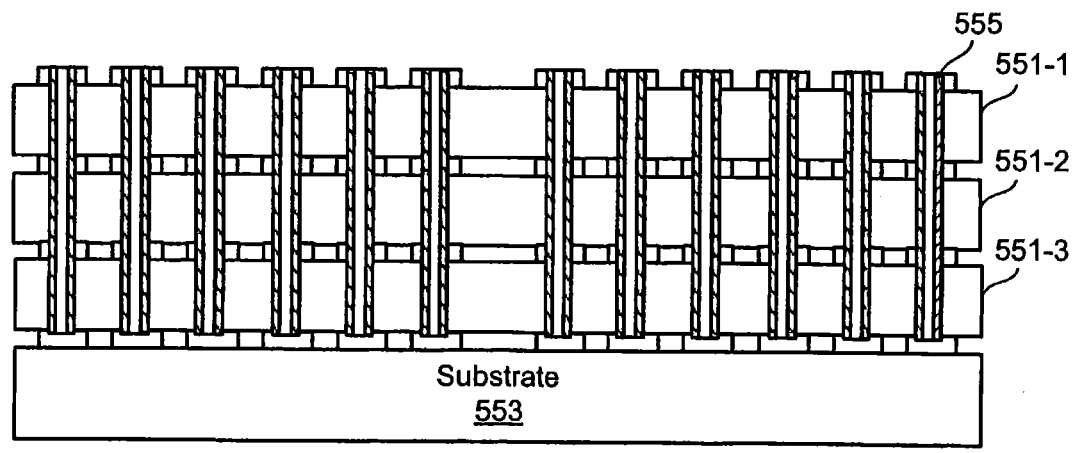
FIG. 21B is a sectional view of another example of MCP structure with silicon-through-holes.

FIG. 21B shows another example of MCP structure with silicon-through-holes. Referring to FIG. 21B, the memory devices 551-1-551-3 are placed horizontally alongside one another over a substrate 553 inside an enclosure (not shown). Each of the devices has connection lines and terminals on a silicon substrate. The terminals between the devices are connected by silicon-through connectors 555, so that the devices send and receive signals.

Within the package, the loading effect from chip input and output pads and associated ESD (Electro-Static Discharge) structures are major factors contributing to interconnected capacitance. However, the loading effect is much less severe in the case of connection within a module compared to a connection from package to package on a board. The distance between two chips in an MCP is much shorter than that of a package-to-package connection. Therefore, the common synchronous clock structure may be a suitable solution within an MCP, while the source synchronous clock structure may be used for a package-to-package interconnection for high frequency operations, for example, over 200 MHz. Using this approach, one does not have to turn on all PLLs within an MCP. It is possible to achieve both high frequency operation and relatively low power consumption.

Figure 22:
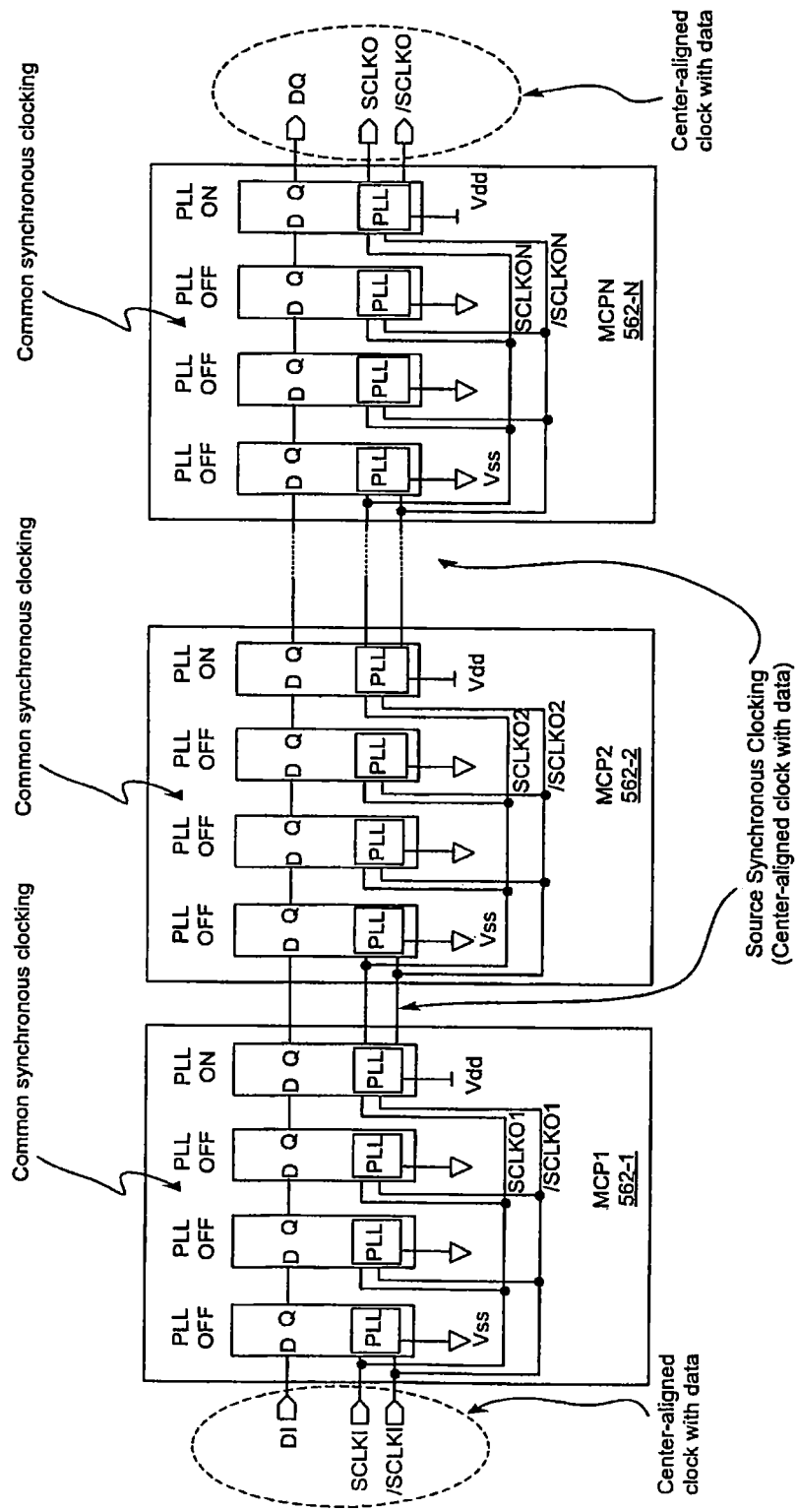
FIG. 22 is a block diagram of a system with a hybrid synchronous clock structure for MCP devices.

FIG. 22 shows a system with a hybrid synchronous clock structure for MCP devices based on the source synchronous clocking between MCPs and the common synchronous clocking within in an MCP. Referring to FIG. 22, a plurality (N) of MCP 1-MCPN, 562-1-562-N is series-connected and communicates with a memory controller (not shown). In the particular example, each of the MCPs has four devices that are series-connected.

Each device has data input D and data output Q for receiving input data and transferring output data. Each device includes PLL for reproducing clock signals. The memory controller sends input data signal DI containing various information on data and instruction to MCP1, 562-1. Also, the memory controller sends a pair of input clock signals SCLKI and /SCLKI to MCP1, the input clock signals SCLKI and /SCLKI being commonly fed to all devices of MCP1. The data signal DI is fed to the data input D of the first device of MCP1 and propagated through the devices in MCP1 in response to the clock signals SCLKI and /SCLKI.

In the particular example shown in FIG. 22, in each of MCP 1-MCPN, the PLLs of the first to third devices are off (i.e., disabled) and the PLL of the fourth device is on (i.e., enabled). Logic "low" and "high" level voltages "Vss (e.g., 0 volt)" and "Vdd (e.g., a positive voltage)" are provided to the PLLs to be turned off and on, respectively. The last device of each MCP performs the function of clock reproducing and the reproduced clock signals are provided to the next MCP. In the particular example shown in FIG. 22, the clock structure in each MCP is the common synchronous clocking. However, the first devices of MCP2-MCPN, 562-2-562-N receive the reproduced clock signals from the last devices of the previous MCP and therefore, the first devices of MCP1-MCPN are clocked by the source synchronous clock structure. The input data signal DI containing various information on data and instruction is propagated through the devices of MCP1-MCPN and the last device of MCPN outputs output data DQ. Also, output clock signals SCLKO and /SCLKO are output from the last device of MCPN.

In the system shown in FIG. 22, the last device (chip or component) of MCP has enabled PLL to transmit output data with center-aligned clock for data to the next MCP, in order to optimize the operation performance with high frequency. The PLL of the last device in each MCP is turned on by a voltage Vdd of logic level "high" and the PLL is enabled. The PLLs of the other devices in each MCP are turned off by the voltage Vss of logic "low" and thus, the PLLs are disabled.

In the system shown in FIG. 22, the devices in each MCP are common synchronous clocking. The inputs and outputs of all MCPs operate with the center-aligned clock with data. The MCPs operates with the source synchronous clocking.

In the example illustrated in FIG. 22, only one PLL within each MCP is enabled. The same clock structure could also be applied to individual devices mounted directly on a printed circuit board (PCB). No clock needs to be regenerated within every device or module. A common synchronous clock structure can drive more than a single device, allowing the PLL in some devices to be turned off to save power.

It is apparent to those of ordinary skill in the art that the number of the devices within one MCP is not limited to four and more than one devices can be connected in on MCP.

Figure 23A:
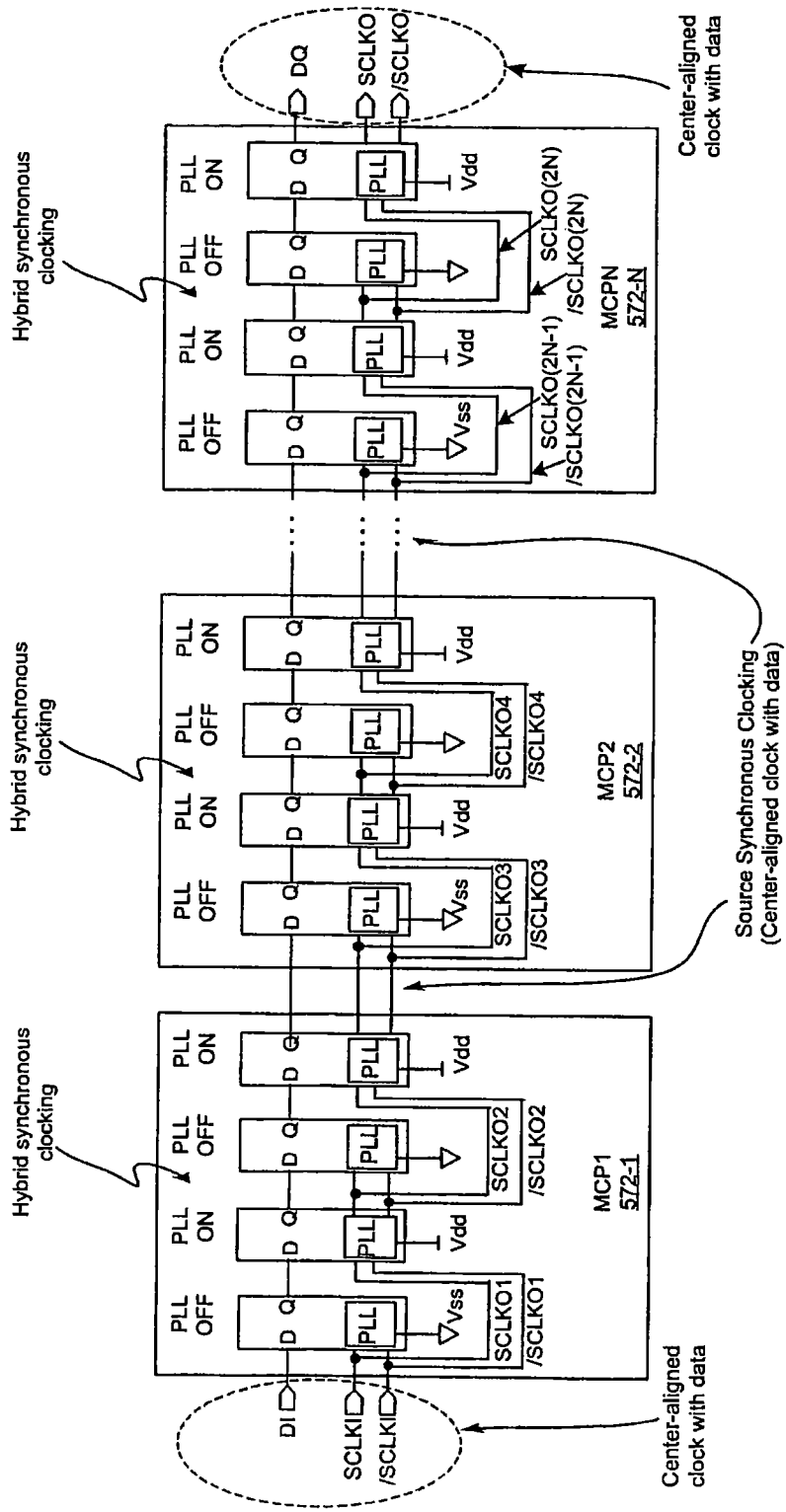
FIG. 23A is a block diagram of another system with an alternate hybrid synchronous clock structure for MCP devices.

FIG. 23A shows another system with a hybrid synchronous clock structure for MCP devices based on a series-connection. Referring to FIG. 23A, a plurality (N) of MCP 1-MCPN, 572-1-572-N is series-connected and communicates with a memory controller (not shown). Each of the MCPs has a plurality of devices (e.g., four) that are series-connected. Each device has data input D and data output Q for receiving input data and transferring output data. Each device includes PLL for reproducing clock signals.

In the particular example shown in FIG. 23A, in each of MCP 1-MCPN, the PLLs of the first and third devices are off (i.e., disabled) by the logic "low" voltage Vss and the PLLs of the second and fourth devices on (i.e., enabled) by the logic "high" voltage Vdd. Here, every second PLL is turned off.

The memory controller sends input data signal DI containing various information on data and instruction to MCP1, 572-1. Also, the memory controller sends a pair of input clock signals SCLKI and /SCLKI to MCP1, the input clock signals SCLKI and /SCLKI being commonly fed to the first and second devices of MCP1. The second device (the enabled PLL) provides reproduced clock signals SCLKO2 and /SCLKO2 commonly to the third and fourth devices. The fourth device (the enabled PLL) outputs reproduced clock signals that are provided to the next MCP, MCP2.

In MCP1, the third device is clocked by the source synchronous clock structure and the second and fourth devices are clocked by the common synchronous clock structure. In each of the other MCPs, the second and fourth devices are clocked by the common synchronous clock structure and the first and third devices are clocked by the source synchronous clock structure.

The data signal DI is fed to the data input D of the first device of MCP1 and propagated through the devices in MCP1 in response to the clock signals SCLKI and /SCLKI. The input data signal DI containing various information on data and instruction is propagated through the devices of MCP1-MCPN and the last device of MCPN outputs output data DQ. Also, the SCLKO and /SCLKO signals are output from the last device of MCPN.

Figure 23B:
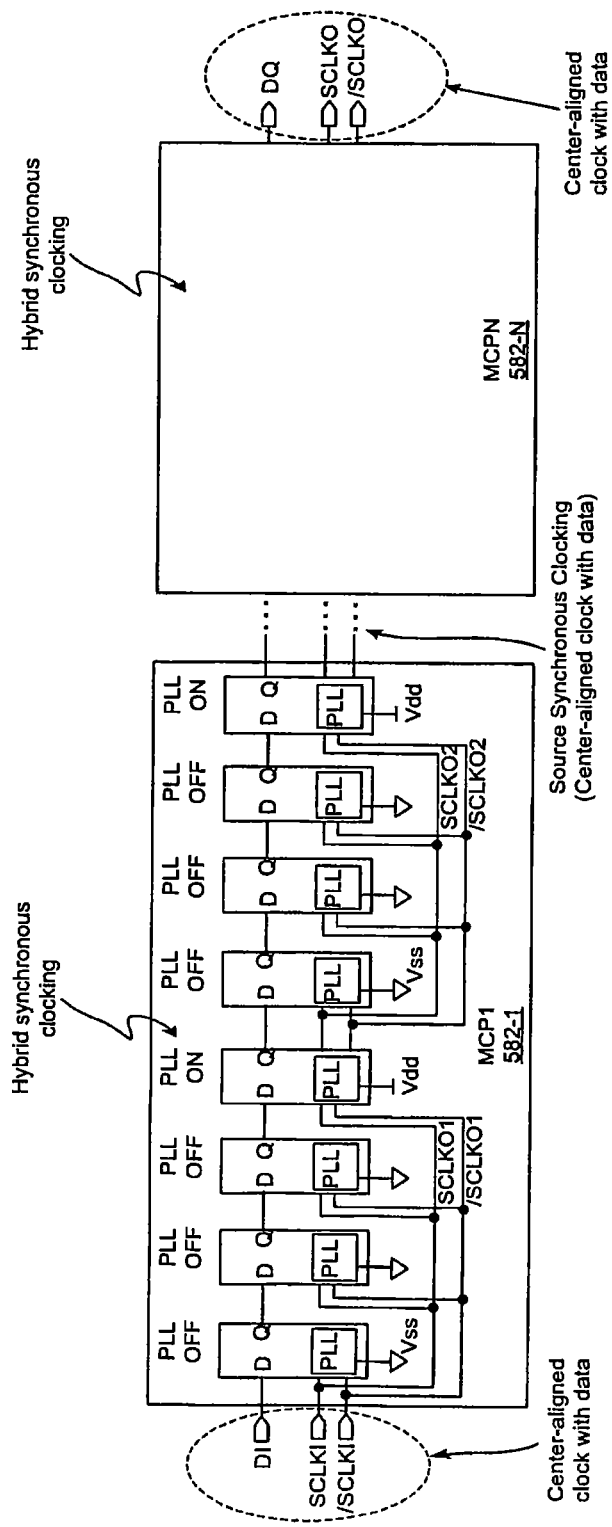
FIG. 23B is a block diagram of another system with a further alternate hybrid synchronous clock structure for MCP devices.

FIG. 23B shows another system of a hybrid synchronous clock structure for MCP devices based on series-connection. Referring to FIG. 23B, a plurality (N) of MCPs, MCP1-MCPN, 582-1 to 582-N, are series-connected. In the particular example, each MCP includes eight devices that are series-connected. In each MCP, the PLLs of the first to third and the fifth to seventh devices are off (i.e., disabled) by the logic "low" voltage Vss. The PLLs of the fourth and eighth devices are on (i.e., enabled) by the logic "high" voltage Vdd. Each of the enabled PLLs outputs reproduced clock signals to the next device in response to the input clock signals. The system of FIG. 23B is an eight-chip package base. Any number of devices and MCPs can be connected, if the maximum operating frequency can be applied to the shown cases without signal integrity problem.

In the systems shown in FIGS. 23A and 23B, two devices (chips or components) in each MCP are on, in order to achieve high-speed operations.

In order to achieve the hybrid synchronous clock structure as described above, a device selection method of whether or not the PLL of each chip is turned on is required before starting the normal operation. An example method for selecting PLLs of the chips (or components) is to use an external pin for each chip (or component) into the MCP. FIGS. 22, 23A and 23B show how to select one of four and one of two devices along with two of eight cases, by constant voltage Vss, Vdd.

In the source synchronous clock structure, it is assumed that the SCLKI and /SCLKI signals are aligned at the center of the input data windows and the SCLKO and /SCLKO signals also aligned at the center of output data for a next series-connected component. Such alignment with data is achieved by PLLs with phase shifts.

In the hybrid synchronous clock structure, the source synchronous clock structure is the same as the previously mentioned one to transmit the center-aligned input and output data with clocks. A 90° clock phase shift of clocks is done at the output stage as shown in FIGS. 18A-18D and 19. This is required to use the source synchronous clock structure globally at the outside of the MCP along with the common synchronous clock structure locally, i.e., at the inside of MCP.

By this way, the chip (or component) which has a disabled PLL in the hybrid synchronous clock structure takes input signals with the common synchronous clock structure while a device with enabled PLL regenerates clocks to do duty cycle correction and 90° clock phase shift before transmitting output data to the next device with a disabled PLL.

In the example systems shown in FIGS. 22, 23A and 23B, the first MCP receives the center-aligned clock with data from another device, for example, a memory controller. Examples of the center-aligned clock with data provided by a memory controller are disclosed in U.S. Provisional Patent Application No. 61/013,784 filed Dec. 14, 2007; and U.S. Provisional Patent Application No. 61/039,605 filed Mar. 25, 2008, the disclosures of which are expressly incorporated herein by reference in their entirety.

Figure 24A:
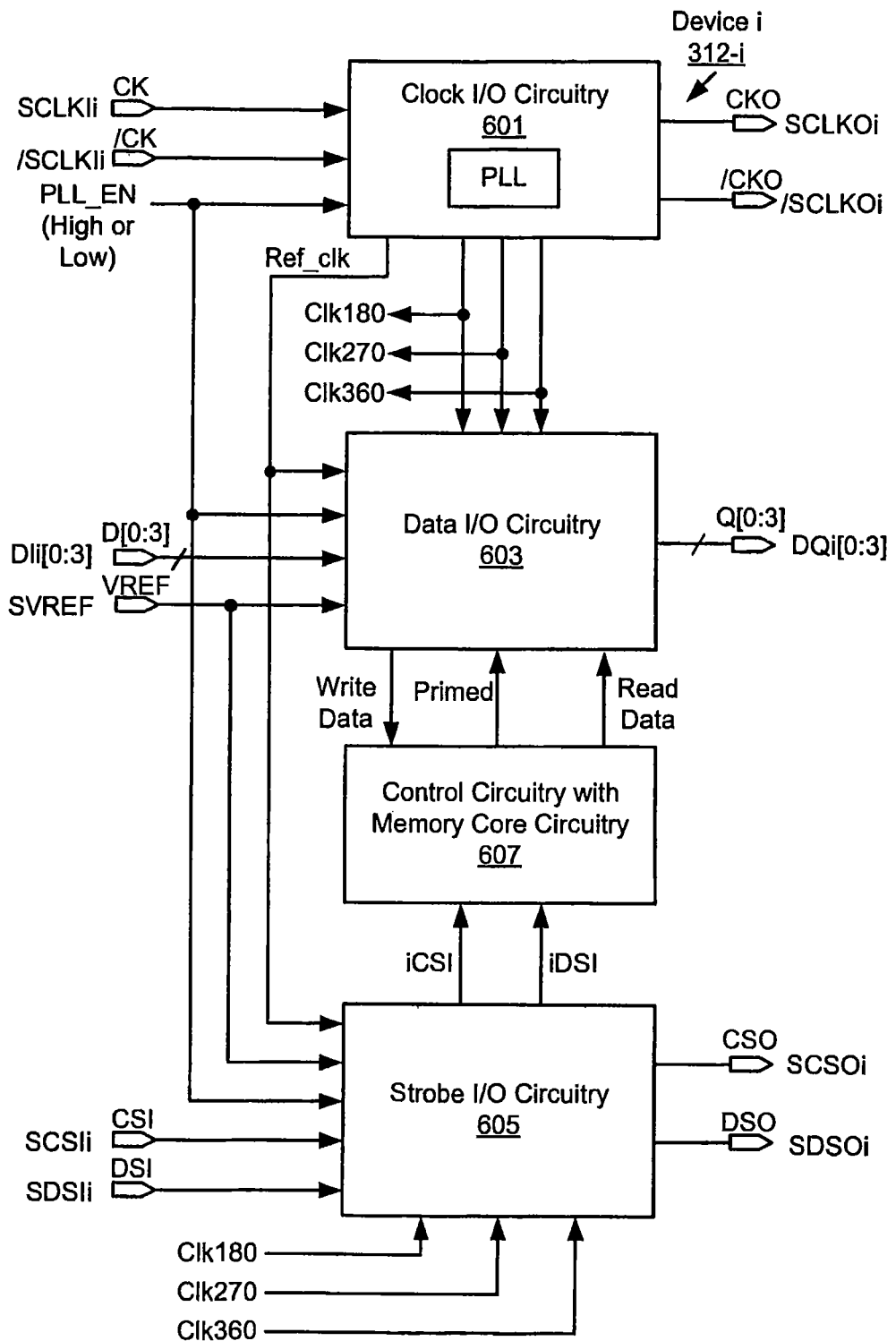
FIG. 24A is a block diagram of one memory device that receives a center-aligned clock to capture input data and optionally provides a center-aligned source synchronous clock output.

FIG. 24A shows an example of one of the devices that are series-connected as shown in FIG. 15. The device is for use in a hybrid synchronous clock structure.

In the particular example, the clock is center-aligned. In the example, when a PLL enable signal PLL_EN (hereinafter referred to as "PLL_EN signal") is provided to control the PLL to be selectively enabled or disabled. When the PLL_EN signal is logic "high" or "low", the PLL is enabled (on) or disabled (off). In the illustrated example, various input signals (e.g., the SCLKIi, /SCLKIi, SCSIi, SDSIi signals) and data DIi[0:3] are input to the one device and various output signals (e.g., the SCLKOi, /SCLKOi, SCSOi, SDSOi signals) and data DQi[0:3] are output from the one device.

The structure of the device of FIG. 24A is similar to that of FIG. 18A. The circuitry of the device shown in FIG. 24A is further responsive to the PLL_EN signal and performs additional functions of data and control signal selections. Therefore, elements, circuitry, signals and information corresponding to those of the device of FIG. 18A are shown by the same reference signs.

Referring to FIG. 24A, the device includes clock I/O circuitry 601 having a PLL, data I/O circuitry 603, strobe I/O circuitry 605 and control circuitry with memory core circuitry 607. The clock I/O circuitry 601 receives the SCLKIi, /SCLKIi signals and the PLL_EN signal. The clock I/O circuitry 601 outputs the SCLKOi, /SCLKOi signals. The clock I/O circuitry 601 provides a reference clock signal Ref_clk to the data I/O circuitry 603 and the strobe I/O circuitry 605. The clock I/O circuitry 601 including a PLL outputs phase shifted clock signals of 180°, 270° and 360°. The PLL_EN signal is also provided to the data I/O circuitry 603 and the strobe I/O circuitry 605. The reference voltage signal SVREF is provided to the data I/O circuitry 603 and the strobe I/O circuitry 605. The data I/O circuitry 603 receives the input data DIi[0:3] and the phase shifted clock signals of 180°, 270° and 360°. The data I/O circuitry 603 provides the output data DQi[0:3]. The strobe I/O circuitry 605 receives the SCSIi, SDSIi signals and the phase shifted clock signals of 180°, 270° and 360°. The strobe I/O circuitry 605 outputs the SCSOi, SDSOi signals. The control circuitry 607 receives an internal command strobe input signal iCSI and an internal data strobe input signal iDSI from the strobe I/O circuitry 605 and data to be written from the data I/O circuitry 603. The control circuitry 607 provides read data to the data I/O circuitry 603.

The structure of the control circuitry with memory core circuitry 607 is similar to that of the control circuitry with memory core circuitry 407 shown in FIG. 18B. The control circuitry 607 provides a Primed signal of logic "high" or "low".

Figure 24B:
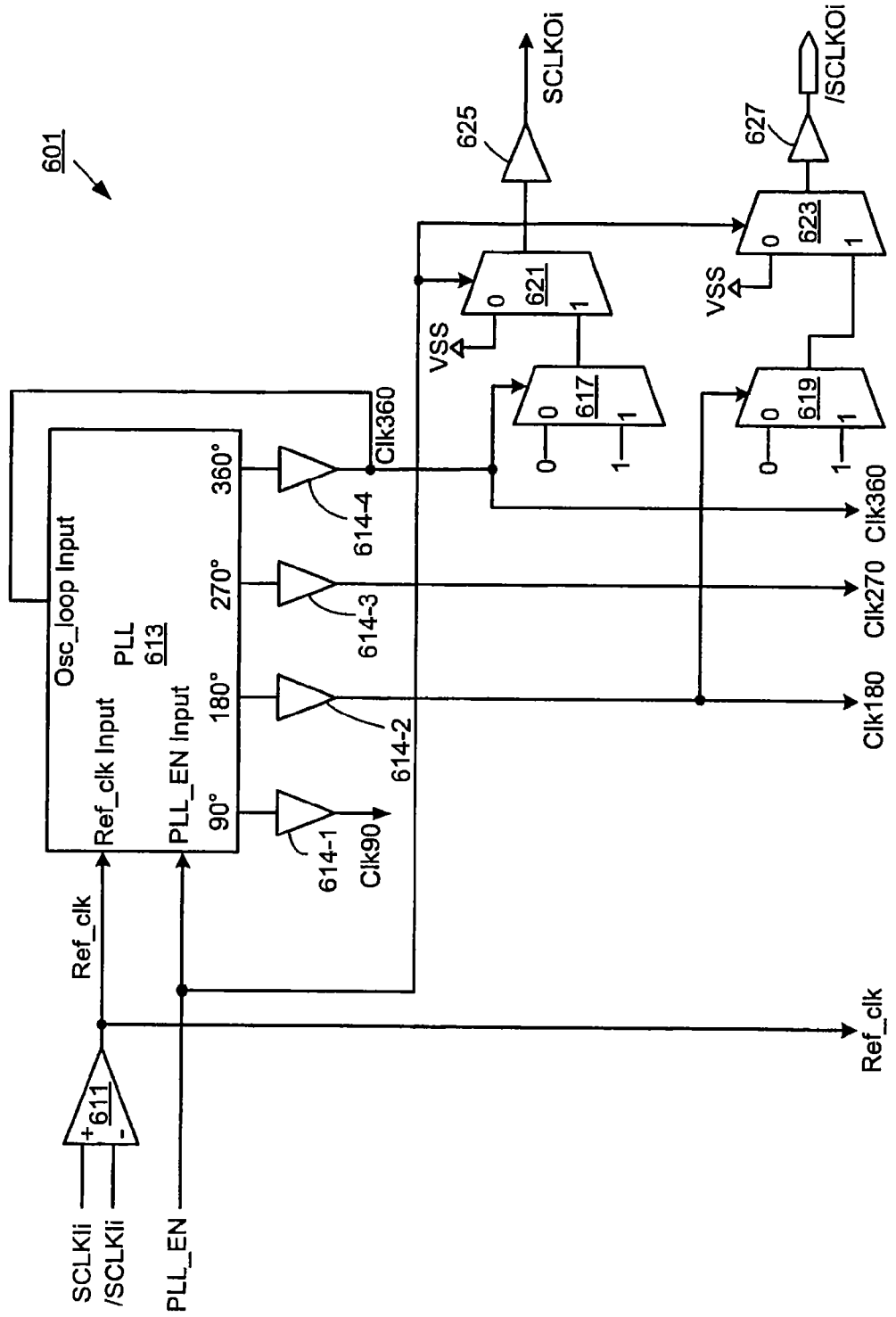
FIG. 24B is a block diagram of clock I/O circuitry of the device shown in FIG. 24A.

FIG. 24B shows details of the clock I/O circuitry 601 shown in FIG. 24A. Referring to FIGS. 24A and 24B, the SCLKIi and /SCLKIi signals are fed to "+" and "−" inputs of an input buffer 611 which in turn provides the reference clock signal Ref_clk. The reference clock signal Ref_clk and the PLL_EN signal are fed to a PLL 613 including an oscillator. The PLL 613 is turned on and off in response to the PLL_EN signal being logic "high" and "low", respectively. Four clock signals phase shifted by 90°, 180°, 270° and 360°, with respect to the reference clock signal Ref_clk, are output through buffers 614-1, 614-2, 614-3 and 614-4, respectively. The PLL_EN signal is fed to selection inputs of selectors 621, 623 that are inserted between the selectors 617, 619 and output buffers 625, 627, respectively. The "0" and "1" inputs of each of the selectors 617 and 619 are provided with logic "0" and "1" voltages, respectively. The "1" inputs of the selectors 621 and 623 receive the selected output signals from the selectors 617 and 619, respectively. The "0" inputs of the selectors 621 and 623 are provided with a low level voltage Vss (logic "0"). The phase shifted clock signal of 360° (i.e., Clk360 signal) is provided to an oscillation loop input of the PLL 613 and the selection input of the selector 617. The selected outputs from selectors 621 and 623 are provided through the output buffers 625 and 627 as the SCLKOi and /SCLKOi signals, respectively. The three phase shifted clock signals of 180°, 270° and 360° (i.e., Clk180 signal, Clk270 signal and Clk360 signal) are provided from the clock I/O circuitry 601.

Figure 24C:
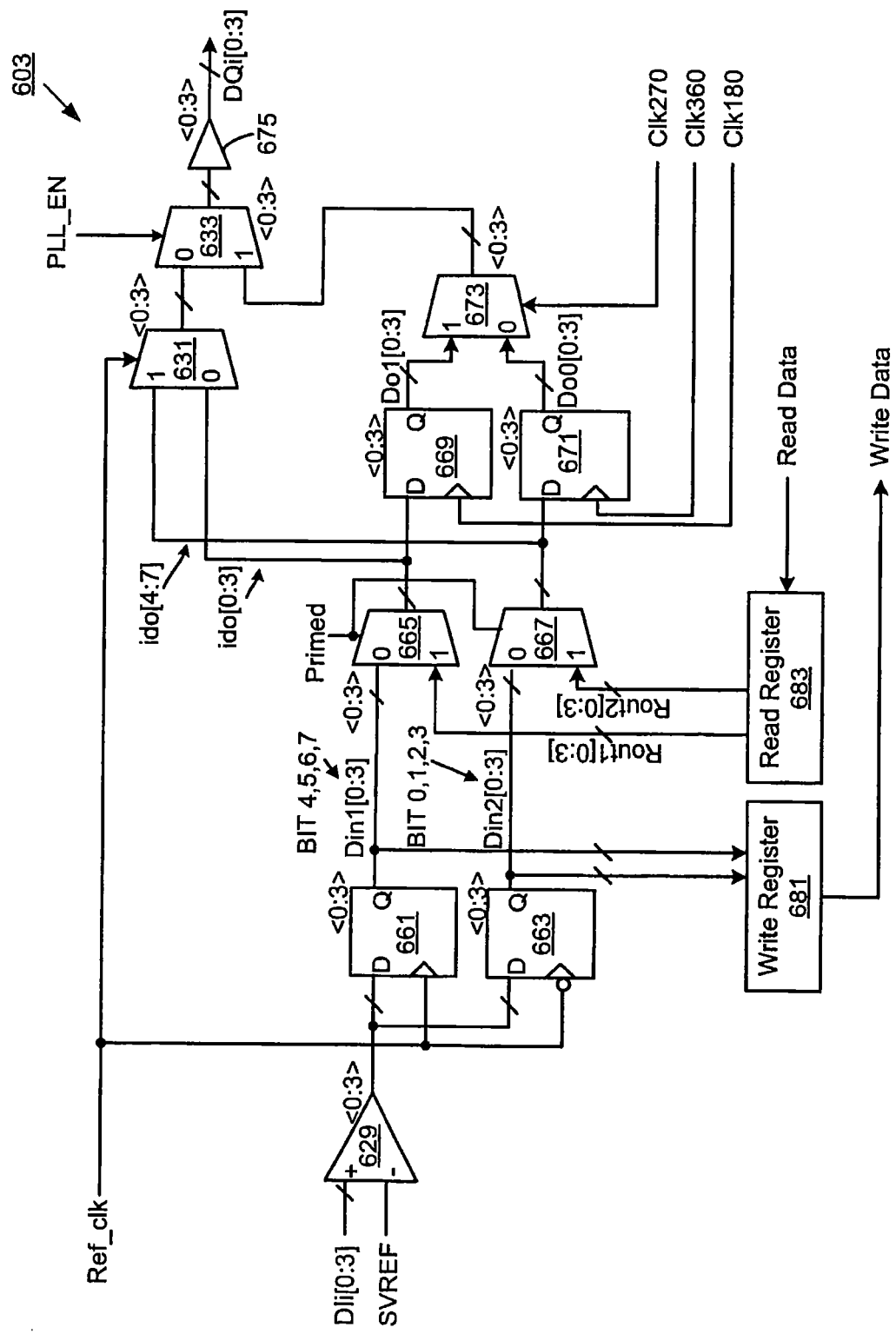
FIG. 24C is a block diagram of data I/O circuitry of the device shown in FIG. 24A.

FIG. 24C shows details of the data I/O circuitry 603 shown in FIG. 24A. Referring to FIGS. 24A and 24C, the reference voltage signal SVREF is provided to the "−" input of an input buffer 629. The input data DIi[0:3] is fed to the "+" input of the input buffer 629, the output <0:3> of which is fed to data input "D" of D-FFs 661 and 663 that are clocked by positive and negative edges of the reference clock signal Ref_clk to capture DDR data. Although the device has a four-bit data path, the circuitry for only a single bit is shown. Each of the circuit elements processing data is replicated four times in the actual devices. The four-bit output Din1[0:3] of the D-FF 661 comprises bits 4, 5, 6 and 7 and is fed to "0" input of a selector 665. Similarly, the four-bit output Din 2 [0:3] of the D-FF 663 comprises bits 0, 1, 2 and 3 and is fed to "0" input of a selector 667. The selectors 665 and 667 perform selection operation in accordance with a "Primed" signal. The Primed signal becomes "high" when the device is selected in accordance with the ID match determination and the data read operation mode, while the device is enabled by the /SCE signal. The selected outputs from the selectors 665 and 667 are fed to data inputs D of D-FFs 669 and 671 that are clocked by the Clk180 and Clk360 signals, respectively, for data latching operation. Internally latched output data Do1[0:3] of the D-FF 669 and data Do0[0:3] of the D-FF 671 are fed to "1" and "0" inputs of the selector 673, respectively, that performs selection operation in response to the Clk270 signal. Selected output <0:3> from the selector 673 is fed to "1" input of a selector 633.

The reference clock signal Ref_clk is fed to a selection input of a selector 631, the "0" and "1" inputs of which receive internal output data ido[0:3] and ido[4:7] from outputs of the selectors 665 and 667, respectively. Selected output signal from the selector 631 is provided to "0" input of a selector 633 that is inserted between the selector 631 and an output buffer 675. In response to the PLL_EN signal, the selector 633 selects the output signal form the selector 631 or the selector 673 and the selected output data <0:3> is output as the output data DQi[0:3] through the output buffer 675.

Figure 24D:
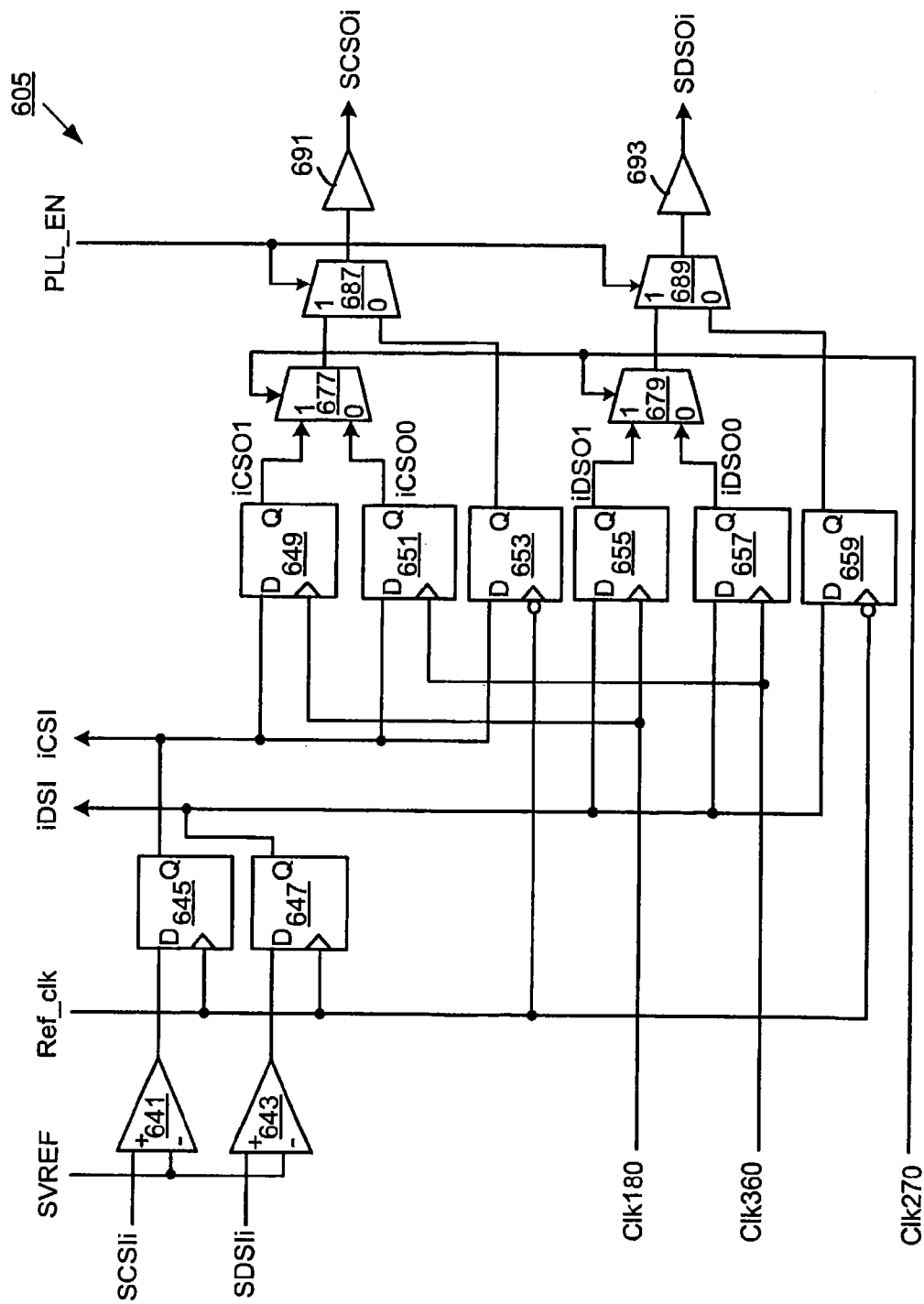
FIG. 24D is a block diagram of strobe I/O circuitry of the device shown in FIG. 24A.

FIG. 24D shows details of the strobe I/O circuitry 605 shown in FIG. 24A. Referring to FIGS. 24A and 24D, the reference voltage signal SVREF is provided to the "−" inputs of input buffers 641 and 643. The SCSIi and SDSIi signals are fed to the "+" inputs of input buffers 641 and 643, respectively, the outputs of which are provided to D inputs of D-FFs 645 and 647. The D-FFs 645 and 647 perform latching operation in response to the reference clock signal Ref_clk. The D-FFs 645 and 647 output the internal command strobe input signal iCSI (hereinafter referred to as "iCSI signal") and internal data strobe input signal iDSI signal (hereinafter referred to as "iDSI signal") that are provided to the control circuitry with memory core circuitry 607.

The iCSI signal is fed to D inputs of D-FFs 649, 651 and 653. The iDSI signal is fed to D inputs of the D-FFs 655, 657 and 659. The D-FFs 649 and 655 are clocked by the Clk180 signal. The D-FFs 651 and 657 are clocked by the Clk360 signal. The D-FFs 653 and 659 are clocked by the inverted version of the reference clock signal Ref_clk. The D-FFs 649 and 651 output iCSO1 and iCSO0 signals that are fed to the "1" and "0" inputs of a selector 677, respectively. In response to the Clk270 signal, the iCSO1 or iCSO0 is selected by the selector 677 and the selected output signal is provided to the "1" input of a selector 687, the "0" input of which receives the output signal of the D-FF 653.

The D-FFs 655 and 657 output iDSO1 and iDSO0 signals that are fed to the "1" and "0" inputs of a selector 679, respectively. In response to the Clk270 signal, the iDSO1 or iDSO0 is selected by the selector 679 and the selected output signal is provided to the "1" input of a selector 689, the "0" input of which receives the output signal of the D-FF 659.

In response to the PLL_EN signal, the D-FF 687 selects the output signal of the selector 677 or the D-FF 653 and the selected output signal is provided as the SCSOi signal through an output buffer 691. Similarly, in response to the PLL_EN signal, the selector 689 selects the output signal of the selector 679 or the D-FF 659 and the selected output signal is provided as the SCSOi signal through an output buffer 693.

Figure 25:
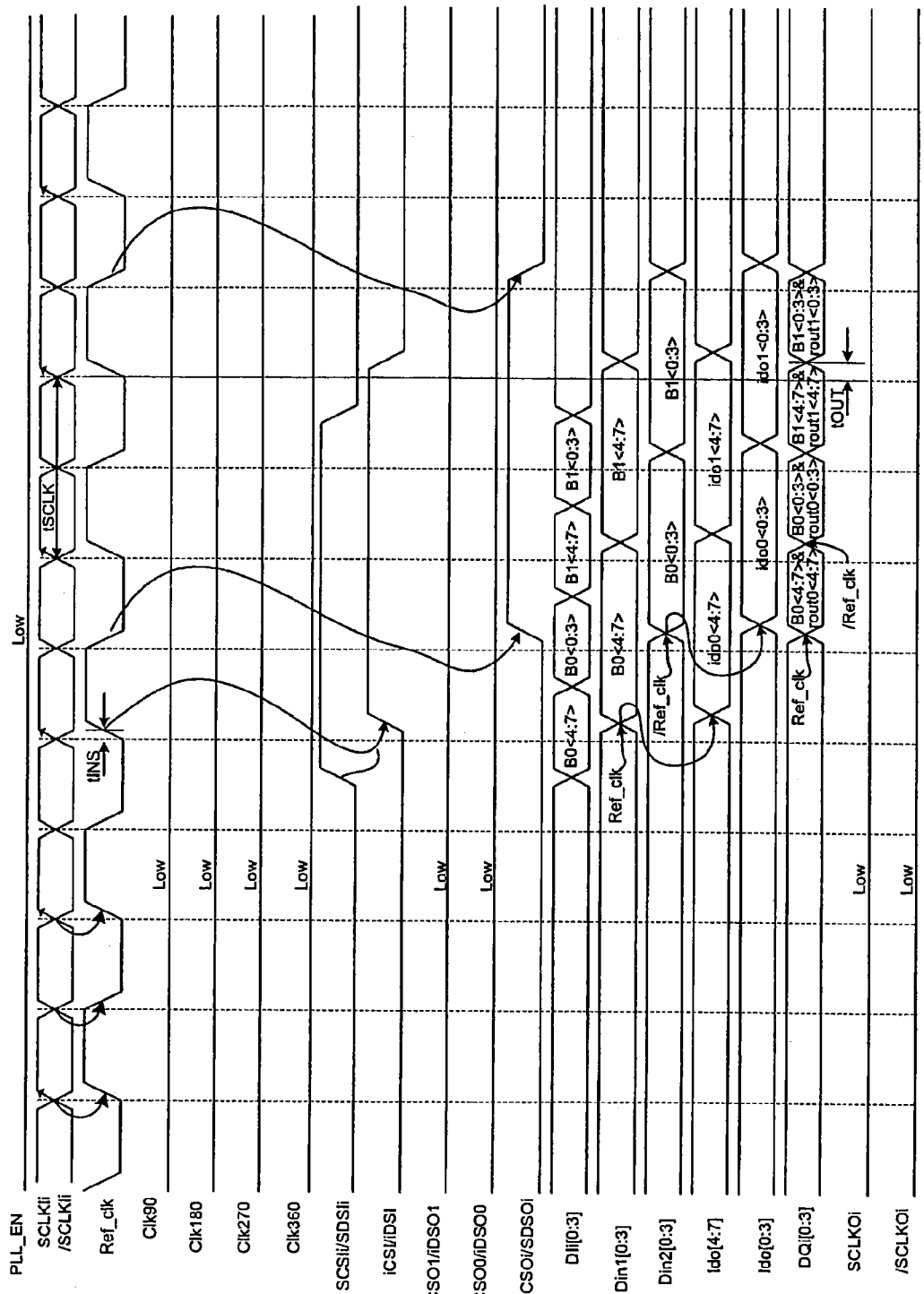
FIG. 25 is a timing diagram for the device shown in FIGS. 24A-24D in operation with the disabled phase-locked loop (PLL)

FIG. 25 shows various signals for the device shown in FIGS. 24A-24D. In the illustrated example in FIG. 25, in the event of the PLL_EN signal being "low", the PLL 613 is off (or disabled) and Clk90 signal, Clk180 signal, Clk270 signal and Clk360 signal are not generated. The input data capture in the device of the disabled PLL is performed during the overlap period of the SCSI signal and the reference clock signal. Between the devices of the disabled PLLs, there is no clock phase shift, but the hold time tHOLD and the setup time tSETUP of data are ensured by following relations:

$$tHOLD = tOUT - tINS + tDTD \quad (1)$$

$$tSETUP = tCK \times 0.5 - tHOLD \quad (2)$$

Where tOUT is a delay of reference-clock to output buffer; tINS is a clock insertion delay; tDTD is a device-to-device delay; and tCK is a clock period.

As described above, timing margin is varied according to the buffer path delay and device-to-device distance so that the common synchronous clock structure is only used internally in MCP or the group.

Figure 26:
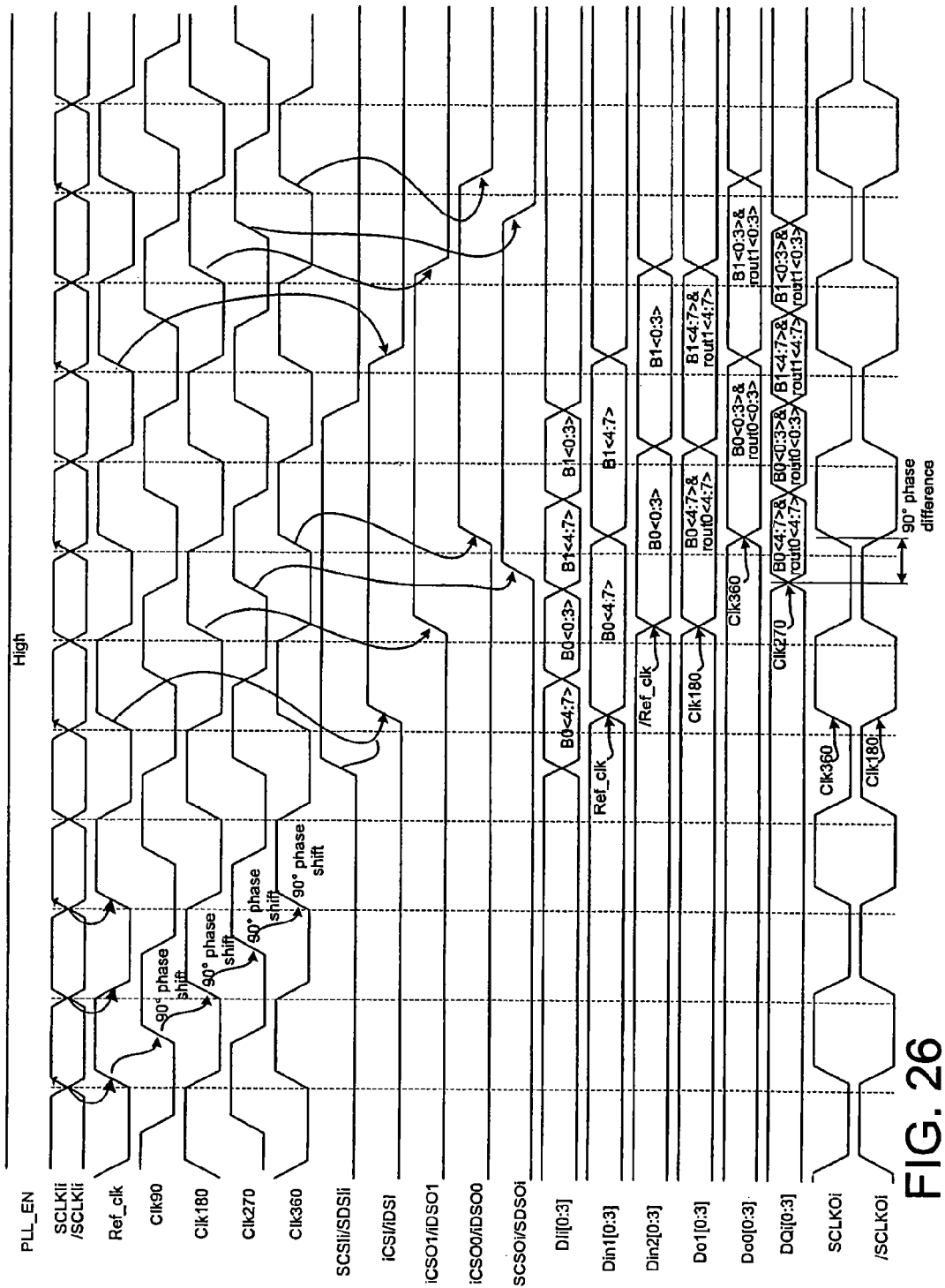
FIG. 26 is a timing diagram for the devices shown in FIGS. 24A-24D in operation with the enabled PLL.

FIG. 26 shows various signals for the device shown in FIGS. 24A-24D. In the particular example, the clock is center-aligned. In the example, the PLL_EN signal is logic "high" that causes PLLs are to be on or enabled.

Referring to FIGS. 24A-24D, 25 and 26, in the event of the PLL_EN signal being "high", the PLL 613 is on and the Clk90 signal, the Clk180 signal, the Clk270 signal and the Clk360 signal are generated.

Unlike the common synchronous clock structure, the source synchronous clock structure provides a regenerated clock with 90° phase shift and delay match between clock and data path using 2-input selector as shown in FIGS. 24B-24D. Because of this delay match with 90° phase shift of clock, always setup and hold time are same as tCK×0.25 value in DDR operation.

There is a hybrid synchronous clock structure. The first approach is based on the center-aligned clock with data from memory controller and at in-between two MCPs. The other way for an edge-aligned clock with data is to be described here. In the case of center-aligned clock with data, it has unbalanced loading between the input data and the SCLKI and /SCLKI signals as shown in FIG. 22 and FIGS. 23A, 23B. Due to this unbalanced loading effect (see "D" and the CK and /CK connections), the phase difference between clock and data can be altered from the start point at the memory controller. Therefore, this alternative way provides a solution for that. It is assumed that all input data and output are edge-aligned with clock except for in-between of two disabled PLL components.

Figure 27:
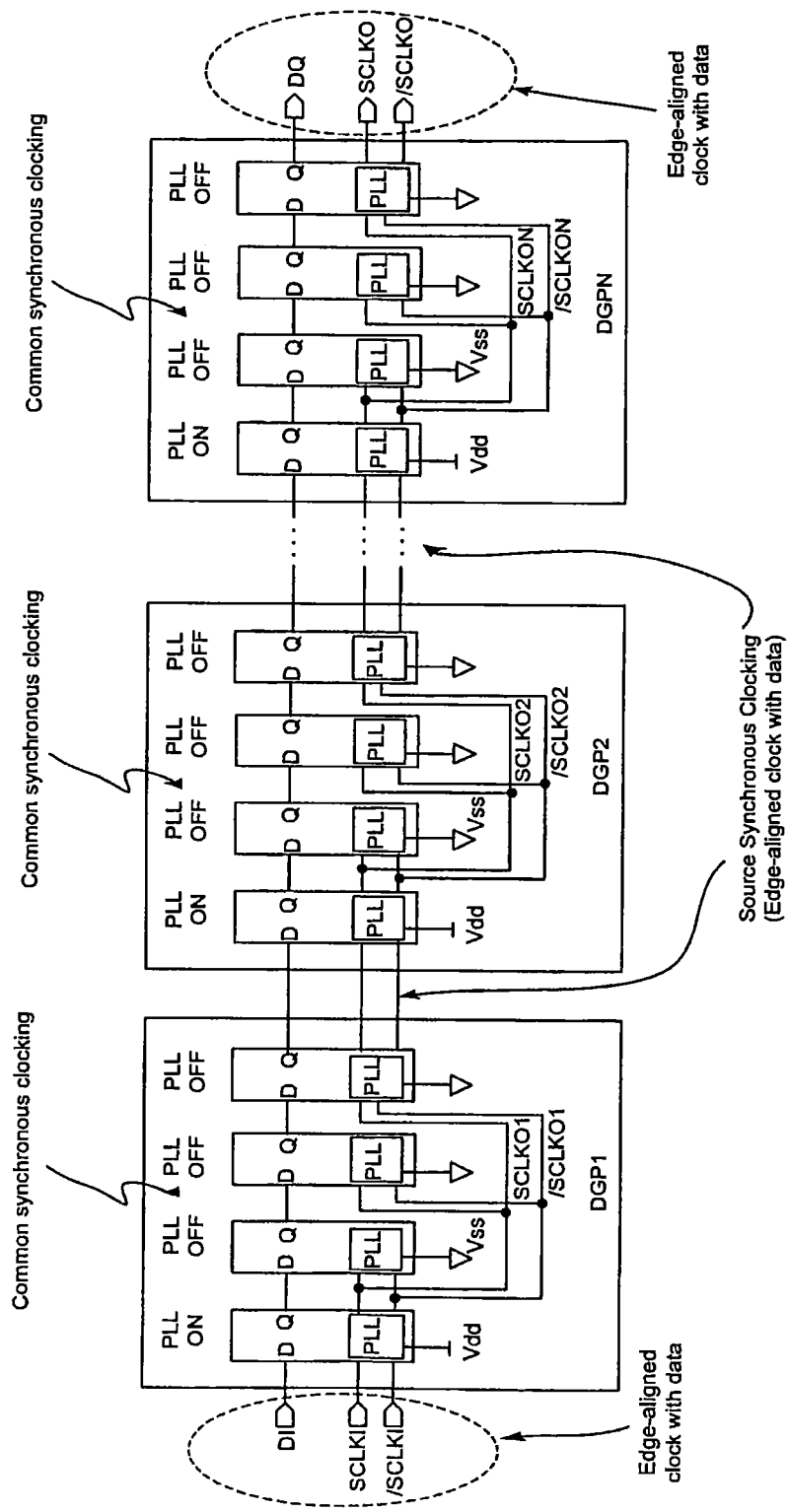
FIG. 27 is a block diagram of a system with an alternate clock structure for MCP devices based on the source synchronous clock structure and the common synchronous clock structure.

FIG. 27 shows another system according to an embodiment of the present invention. The system includes a plurality (N) of device groups, DGP1-DGPN. The system implements the hybrid synchronous clock structure having an edge-aligned clock with data. Each device group has the same structure as that of the MCP based system shown in FIG. 22. In the particular example shown in FIG. 27, each device group includes four devices having PLLs. The PLLs of the first devices are on (enabled) and the PLLs of the second to fourth devices are off (disabled). The first devices are clocked by the source synchronous clock structure and the second to fourth devices are clocked by the common synchronous clock structure, by the reproduced clock signals SCLKO and /SCLKO output by the first devices. The input data DI and the pair of input clock signals SCLKI and /SCLKI have the same loading effect in the input side of MCP, so that they can keep easily the same phase shift for connection loading from the controller to the first MCP.

Figure 28:
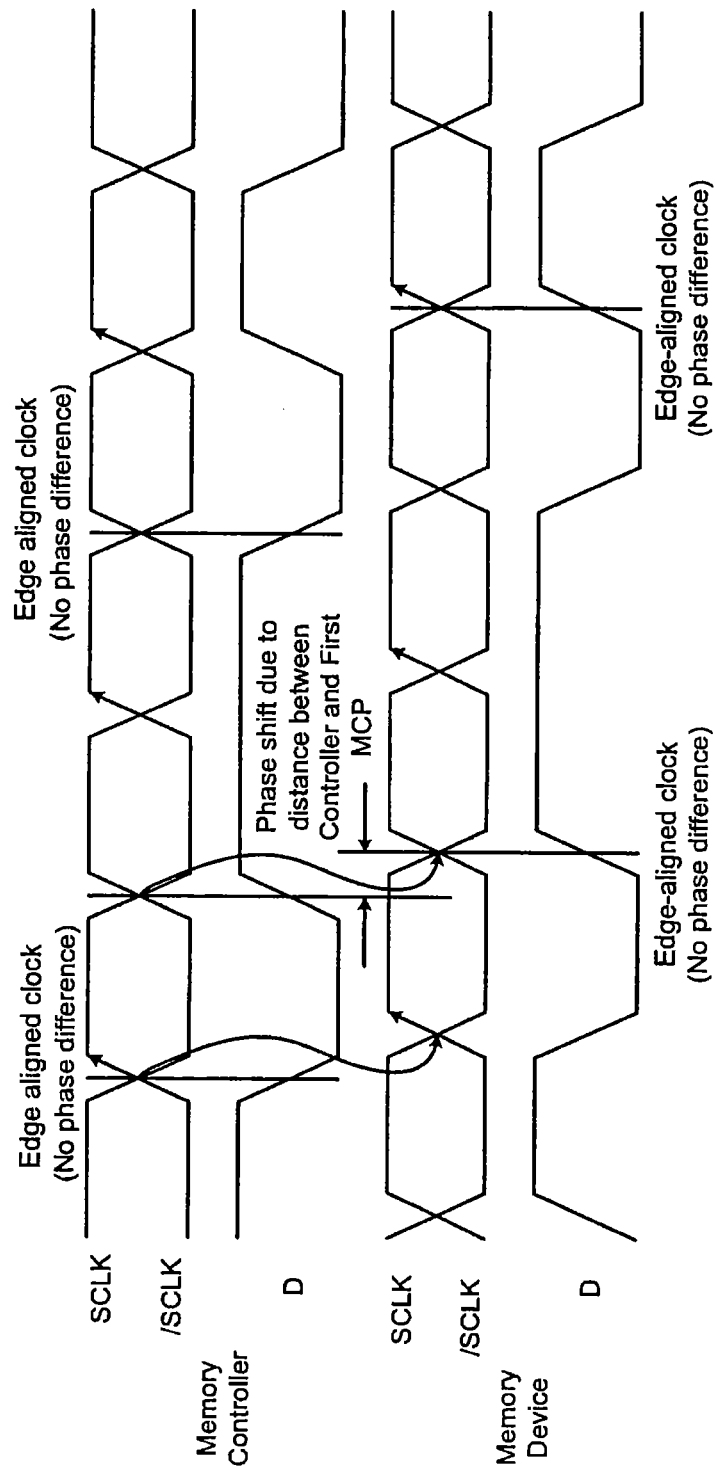
FIG. 28 is a timing diagram showing the relationship between the source synchronous signals at the controller and the first memory device.

FIG. 28 shows various signals communicated between the controller and the memory device.

In order to make the edge-aligned clock with data, the last component of each MCP provides a clock to the next MCP. Without PLL or DLL, the edge-aligned clock with data can be implemented with delay path match between output clock and output data.

Figure 29A:
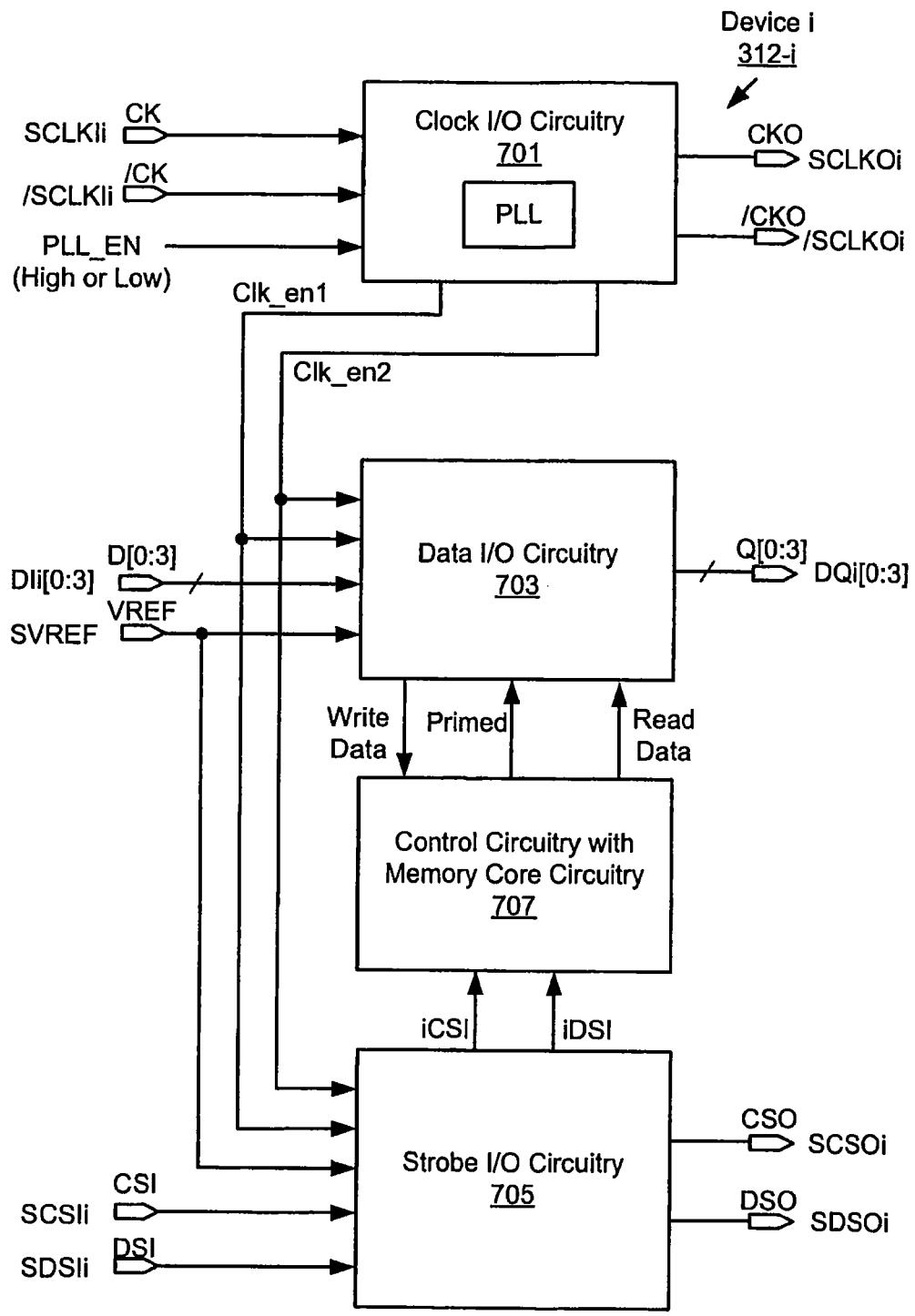
FIG. 29A is a block diagram of one memory device that is able to receive input data using either an edge-aligned clock or a center-aligned clock.

FIG. 29A shows another example of one device having an interface of hybrid synchronous clock structure.

In the illustrated example, various input signals (e.g., the SCLKIi, /SCLKIi, SCSIi, SDSIi signals) and data DIi are input to the one device and various output signals (e.g., the SCLKOi, /SCLKOi, SCSOi, SDSOi signals) and data DQi are output from the one device. Referring to FIG. 29A, the device includes clock I/O circuitry 701 including a PLL, data I/O circuitry 703, strobe I/O circuitry 705 and control circuitry with memory core circuitry 707. The clock I/O circuitry 701 receives the SCLKIi, /SCLKIi signals and the PLL_EN signal. The clock I/O circuitry 701 outputs two internally produced clock signals Clk_en1 and Clk_en2 (hereinafter referred to as "Clk_en1 clock signal and "Clk_en2 clock signal", respectively) to the data I/O circuitry 703 and the strobe I/O circuitry 705. The reference voltage signal SVREF is provided to the data I/O circuitry 703 and the strobe I/O circuitry 705. The data I/O circuitry 703 receives the input data DIi[0:3] and provides the output data DQi[0:3]. The strobe I/O circuitry 705 receives the SCSIi, SDSIi signals and outputs the SCSOi, SDSOi signals. The control circuitry 707 receives an internal command strobe input signal iCSI1 and an internal data strobe input signal iDS1 from the strobe I/O circuitry 705 and data to be written from the data I/O circuitry 703. The control circuitry 707 provides read data to the data I/O circuitry 703.

The structure of the control circuitry with memory core circuitry 707 is similar to the control circuitry with memory core circuitry 407 shown in FIG. 18B. The control circuitry 707 provides a Primed signal of logic "high" when there is an ID match and a data read command.

Figure 29B:
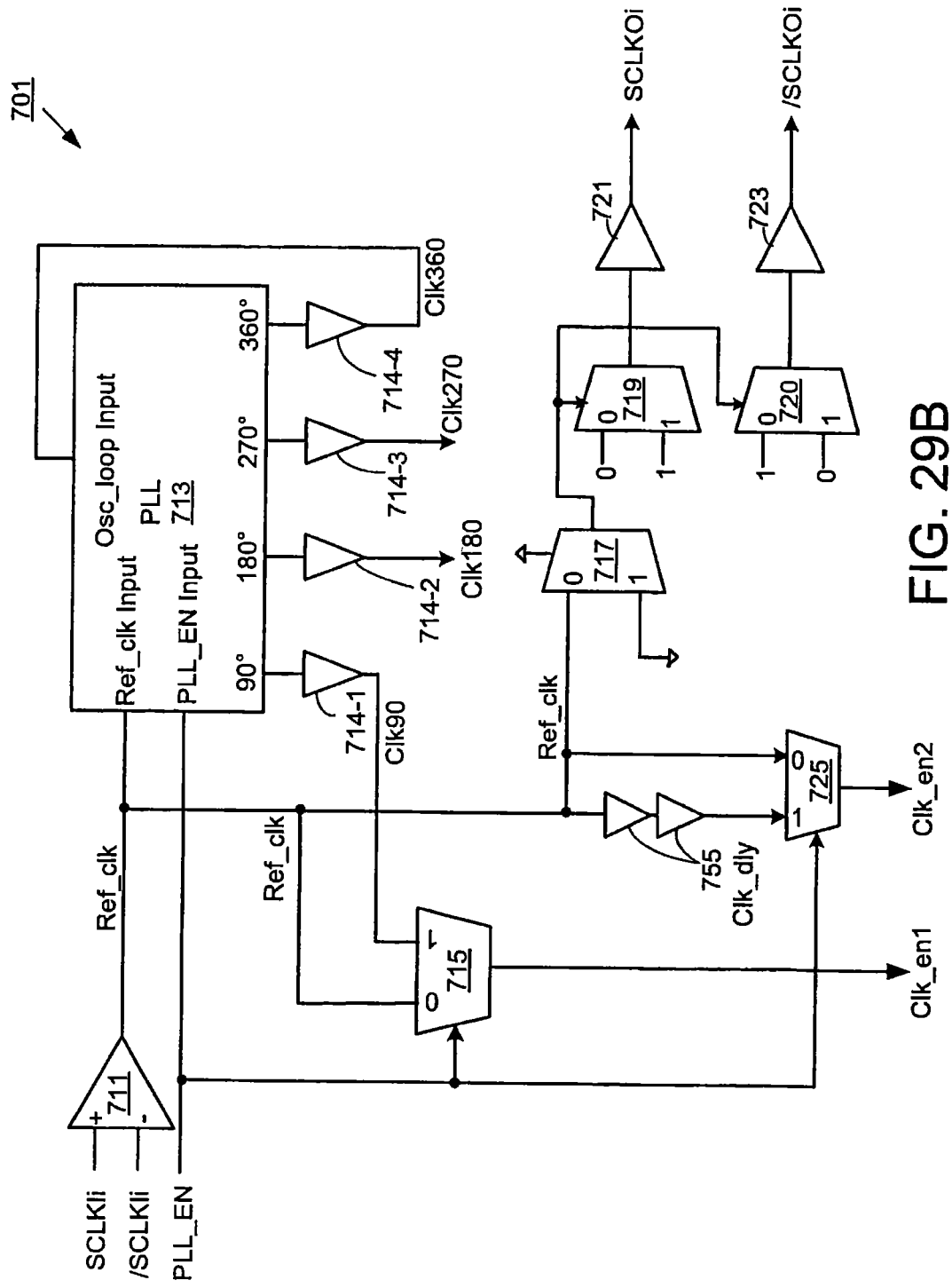
FIG. 29B is a block diagram of clock I/O circuitry of the device shown in FIG. 29A.

FIG. 29B shows details of the clock I/O circuitry 701 shown in FIG. 29A. Referring to FIGS. 29A and 29B, the SCLKOi and /SCLKOi signals are input to an input buffer 711 which in turn provides a reference clock signal Ref_clk to an input of a PLL 713 including an oscillator. Also, the PLL_EN signal is fed to an enable input "PLL_EN input" of the PLL 713. The PLL 713 produces four phase shifted clock signals of 90°, 180°, 270° and 360°, with reference to the reference clock signal Ref_clk. Clk90 signal, Clk180 signal, Clk270 signal and Clk360 signal, are provided by the PLL 713 through respective buffers 714-1, 714-2, 714-3 and 714-4. The 360° phase shift clock signal Clk360 is fed to an oscillation input, Osc_loop Input, of the PLL 713.

The reference clock signal Ref_clk and the 90° phase shift clock signal Clk90 signal are fed to "0" and "1" inputs of a selector 715, respectively, the selection input of which receives the PLL_EN signal. A selected signal from the selector 715 is provided as the Clk_en1 clock signal. The reference clock signal Ref_clk and a delayed version Clk-dly from buffers 755 are provided to "0" and "1" inputs of a selector 725, respectively, and are selected by the selector 725 in response to the PLL_EN signal. A selected clock from the selector 725 from the selector 725 is provided as the Clk_en2 clock signal.

The reference clock signal Ref_clk is also fed to the "0" input of a selector 717, the "1" input and selection input of which are pulled down (logic "0") and thus, the selector 717 always selects the signal of the "0" input, with the result that the reference clock signal Ref_clk is a selected output signal therefrom. The selected output signal of the selector 717 is provided to selection inputs of selectors 719 and 720. The "0" and "1" inputs of the selector 719 are provided with logic "0" and "1", respectively. The "0" and "1" inputs of the selector 720 are provided with logic "1" and "0", respectively. The selected output signals from the selectors 719 and 720 are provided through output buffers 721 and 723 as the SCLKOi and /SCLKOi signals, respectively.

Figure 29C:
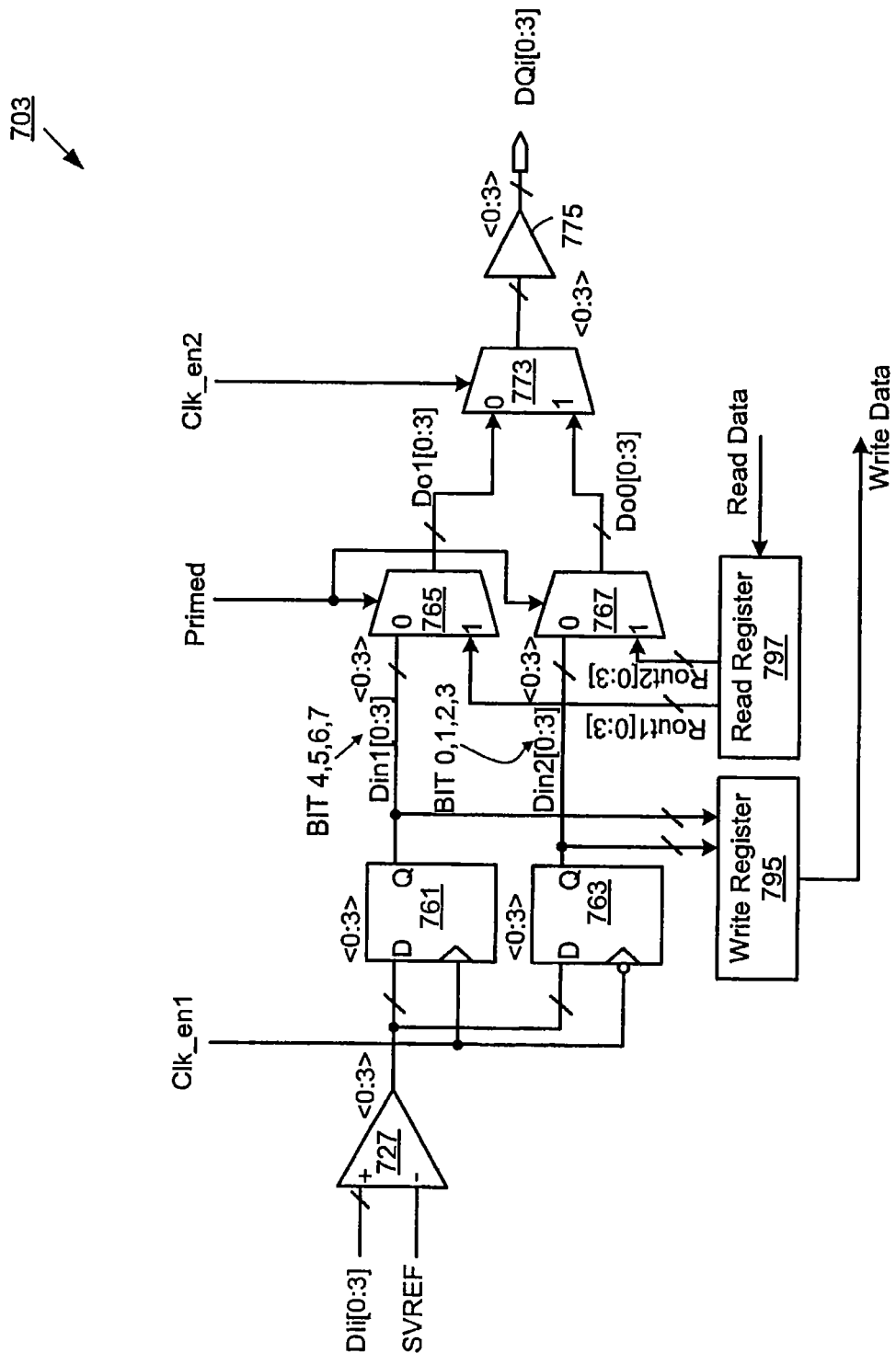
FIG. 29C is a block diagram of data I/O circuitry of the device shown in FIG. 29A.

FIG. 29C shows details of the data I/O circuitry 703 shown in FIG. 29A. Referring to FIGS. 29A and 29C, the reference voltage signal SVREF is provided to the "−" input of an input buffer (comparator) 727. The input data DIi[0:3] is provided to "+" input of the input buffer 725, the output signals <0:3> of which are fed to data inputs D of D-FFs 761 and 763 that are clocked by the Clk_en1 clock signal and its inverted version, respectively. In this example, the data latching operation of the D-FF 763 is shifted from that of the D-FF 761 in 180° in phase of the Clk_en1 clock signal. Although the device has a four-bit data path, the circuitry for only a single bit is shown. Each of the circuit elements processing data is replicated four times in the actual devices. Four-bit output data Din1[0:3] of the D-FF 761 comprising bits 4, 5, 6 and 7 is fed to the "0" input of a selector 765. Similarly, four-bit output data Din2[0:3] of the D-FF 763 comprising bits 0, 1, 2 and 3 is fed to "0" input of a selector 767. The selectors 765 and 767 perform selection operation in accordance with the "Primed" signal fed to the selection inputs of the selectors 765 and 767. In the particular example, the Primed signal is logic "low" when there is no ID match. When there is an ID match, in the cases of data read and data write, the Primed signal is "high" and "low", respectively. In response to the Primed signal, internally selected output data Do1[0:3] and Do0[0:3] from the selectors 765 and 767 are fed to the "0" and "1" inputs of a selector 773, respectively, the selection input of which receives the Clk_en2 from the clock I/O circuitry 701. Selected output data <0:3> from the selector 773 is provided through an output buffer 775 as the output data DQi[0:3].

Figure 29D:
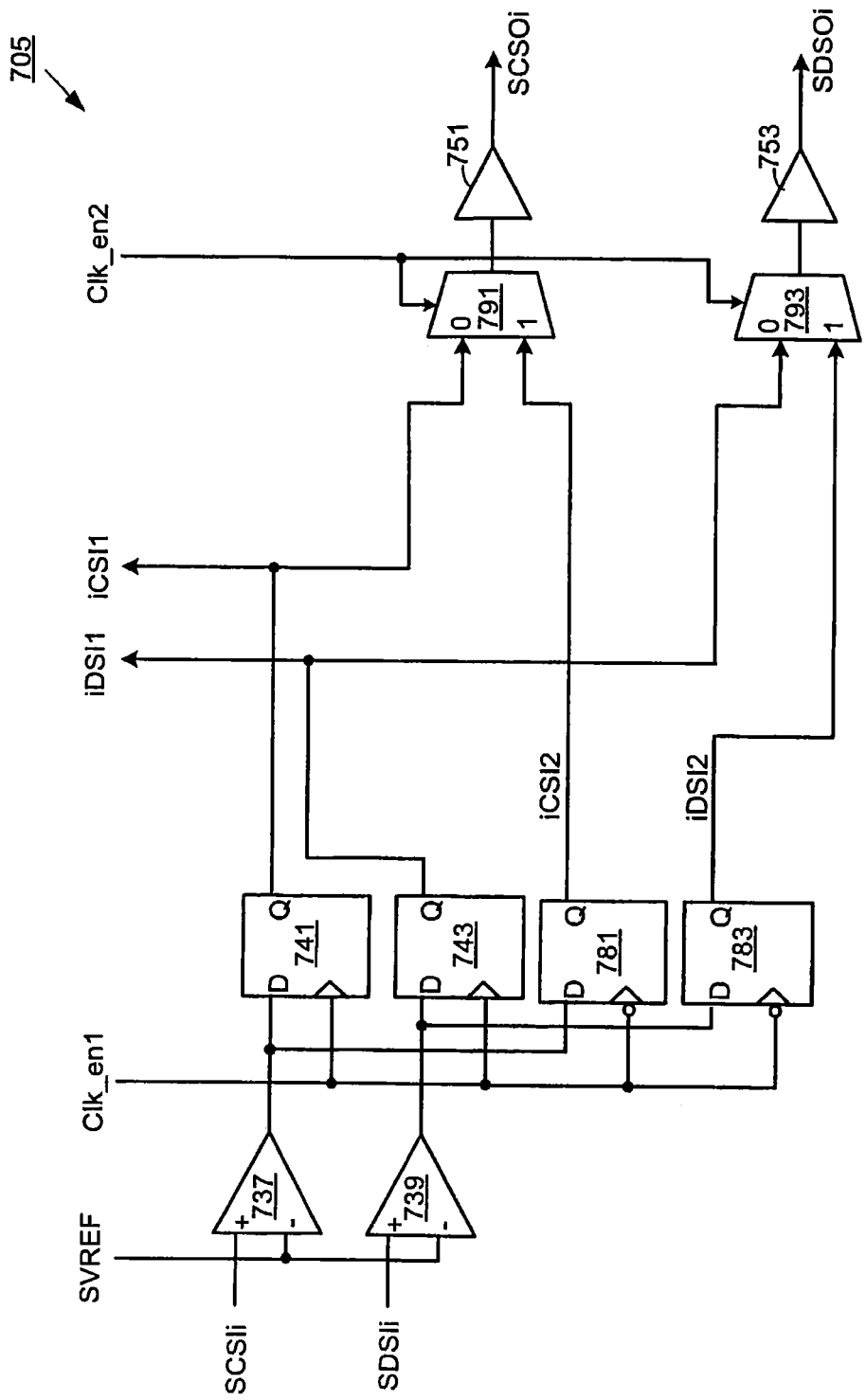
FIG. 29D is a block diagram of strobe I/O circuitry of the device shown in FIG. 29A.

FIG. 29D shows details of the strobe I/O circuitry 705 shown in FIG. 29A. Referring to FIGS. 29A and 29D, the reference voltage signal SVREF is provided to "−" inputs of input buffers (comparators) 737 and 739, the "+" inputs of which receive the SCSIi and SDSIi signals, respectively. The output signals of the input buffers 737 and 739 are provided to the D inputs of D-FFs 741, 781 and 743, 783. The Clk_en1 clock signal is provided to the clock inputs of the D-FFs 741 and 743 and the inverting clock inputs of the D-FFs 781 and 783, respectively. The D-FFs 741 and 743 output the iCSI1 and iDSI1 signals in response to the Clk_en1 clock signal, respectively, that are provided to the control circuitry 707. The iCSI1 and iDSI1 signals are fed to the "0" inputs of the selectors 791 and 793, respectively. Additional internal command strobe and data strobe input signals iSCSI2 and iSDSI2 are provided from the D-FFs 781 and 783 to the "1" inputs of the selectors 791 and 793, respectively. The Clk_en2 clock signal is fed to the selection inputs of the selectors 791 and 793. The selector 791 selects the iCSI1 signal or the iCSI2 signal in response to the Clk_en2 clock signal and the selected output signal from the selector 791 is provided through an output buffer 751 as the SCSOi signal. The selector 793 selects the iDSI1 signal or the iDSI2 signal in response to the Clk_en2 clock signal and the selected output signal from the selector 793 is provided through an output buffer 753 as the SDSOi signal.

The control circuitry with memory core circuitry 707 has the same structure as that of FIG. 18B.

Referring to FIGS. 29A-29D, in write operation (the Primed signal being logic "0"), the latched data from the D-FFs 761 and 763, Din1[0:3] (i.e., bits 4, 5, 6, and 7) and Din2[0:3] (i.e., bits 0, 1, 2 and 3) are written into a write register 795. Upon ID match determination, the written data of 8-bits (bits 0-7) is provided to the control circuitry 707 to store the written data in the core cell included therein. In read operation (the Primed signal being logic "1") of the normal operation, upon ID match determination, the control circuitry 707 accesses the data store elements therein and reads the data and the read data is written into a read register 797. The written data, as Rout1 [0:3] (bits 4, 5, 6 and 7) and Rout2[0:3] (bits 0, 1, 2 and 3), is selected by the selectors 765 and 767, respectively, and eventually output data DQi[0:3] is provided to the next memory device. In read operation, the latched data from the D-FFs 761 and 763, Din1[0:3] (i.e., bits 4, 5, 6, and 7) and Din2[0:3] (i.e., bits 0, 1, 2 and 3) is not written into the write register 795. Therefore, the written data of 8-bits (bits 0-7) is not provided to the control circuitry 707.

Figure 30:
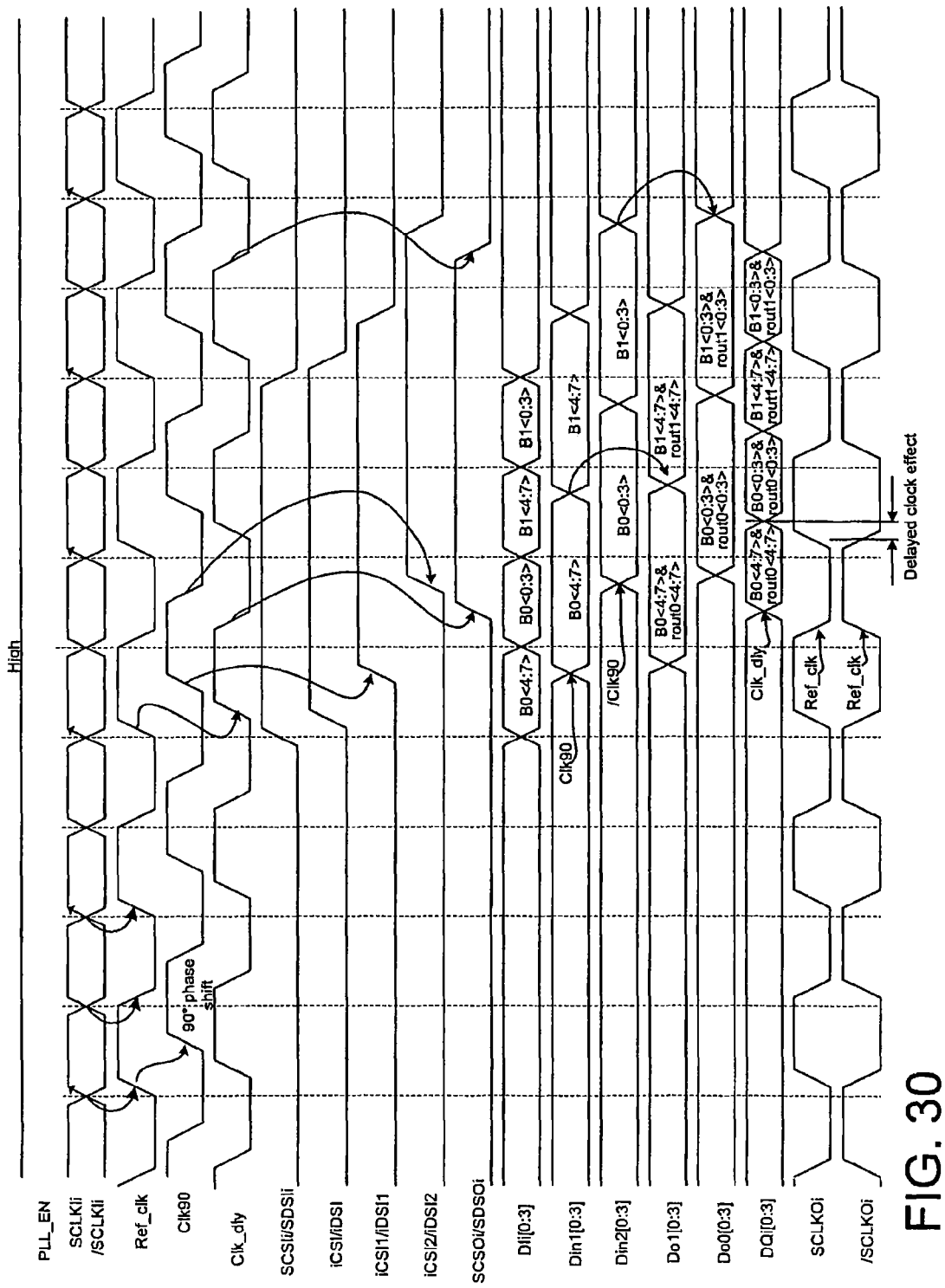
FIG. 30 is a timing diagram for the device shown in FIGS. 29A-29D in operation with the enabled PLL.

FIG. 30 shows various signals for the device of FIGS. 29A-29D. FIG. 30 depicts enabled PLL device operation in the hybrid synchronous clock structure, with edge-aligned clock case. The PLLs are enabled by the "high" PLL_EN signal.

Referring to FIGS. 29A-29D and 30, when the PLL_EN signal is provided by logic "high" level voltage Vdd, the PLL 713 starts to produce internal phase shifted clock signals and one of them (90° phase shifted clock signal Clk90) is used to latch the input data at the data input side, which is the circuitry including the D-FFs 761 and 763 of the data I/O circuitry 703. The edge-aligned clock signal with data has no setup time margin without clock phase shift, so that the 90° phase shift clock signal needs to be provided to each input latches as shown in FIGS. 29C and 29D. In this case, the phase difference between output data (DQi, SCSOi and SDSOi) and the SCLKIi and /SCLKIi signals is so critical that the delayed clock "Clk_dIy" is used to send out output data in order to give timing margin to the next device when clocks and the input data arrive at the input latch stage of the next device. The SCLKOi and /SCLKOi signals of the last component (or device) of each MCP are fed to the other MCP while the output clocks of the first component (or device) in the same MCP are connected to other components with common clocking way into the same MCP.

Figure 31:
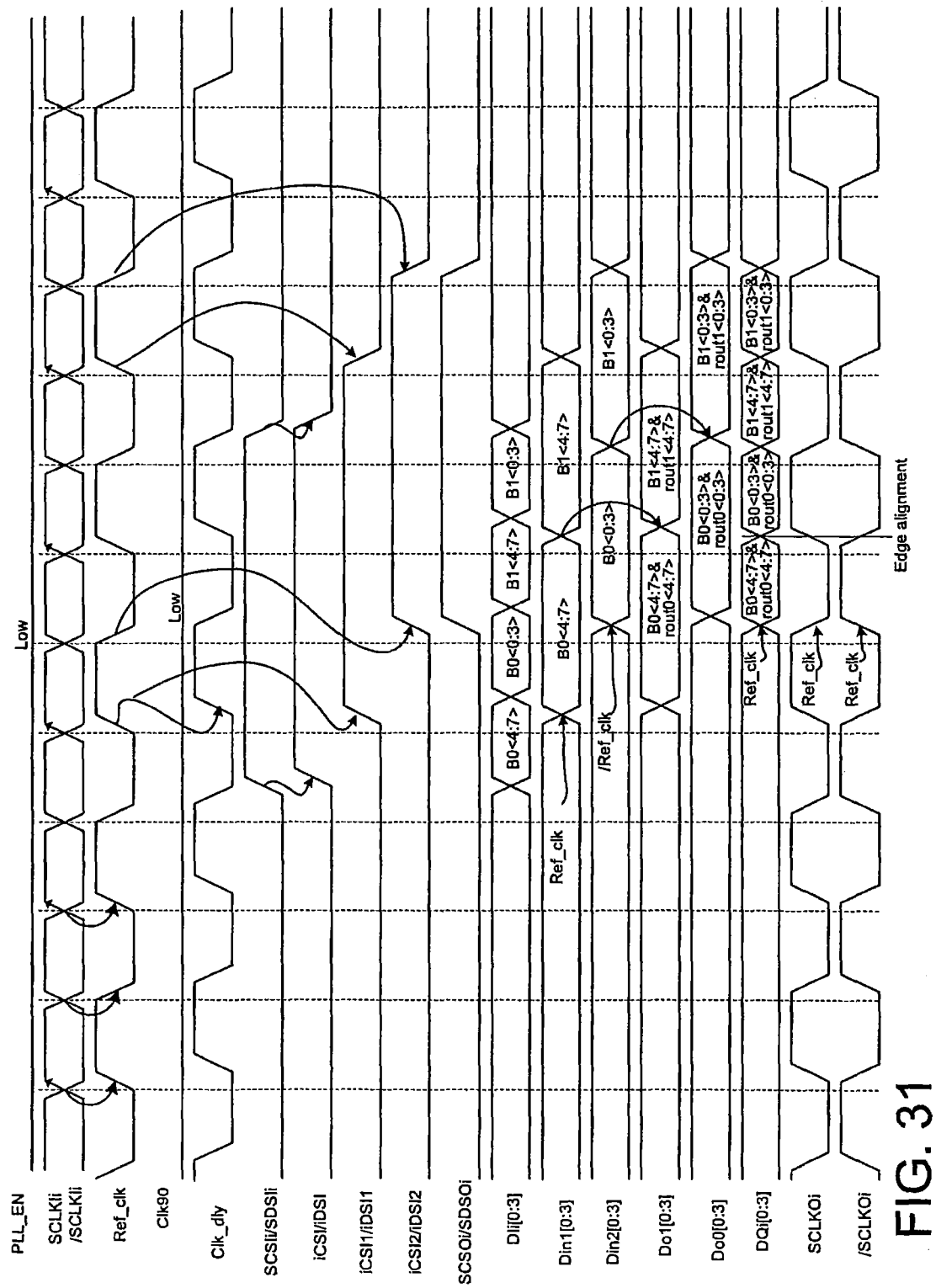
FIG. 31 is a timing diagram for diagram for the device shown in FIGS. 29A-29D in operation with the disabled PLL.

In the event that the PLL_EN signal is logic "low" (Vss), the PLL 713 is disabled and the reference clock signal Ref_clk is used to latch the input data and transmit output data to the next component having edge-aligned clocking. As matching the delay path between clocks and output data, the edge alignment of clocks and output data is attained. At the next component, the input data is captured by the SCLKOi and /SCLKO signals with one cycle latency between two components, as shown in FIG. 31. FIG. 31 shows various signals for the device. FIG. 31 depicts the disabled PLL device operation in hybrid synchronous clock structure, with edge-aligned clock case. The PLLs are disabled by the "low" PLL_EN signal.

Using mixed clocking, the power consumption from the PLL can be reduced and it provides high-speed operations with MCP and grouped devices.

A second alternative to implement full source synchronous clock structure has no hybrid synchronous clocking.

With only source synchronous clock structure, there is a way to reduce the power consumption from the PLL. Using alternate PLL on and off (or off and on) operation, capturing and transmitting data can be achieved. In this case, only source synchronous clock structure is considered so that the full speed performance may be obtained other than two previous cases. Also, the other advantage is that this can be applied to all grouped connection systems including ring type connection systems, not limited to MCPs. For single component package, this can be applied without any restrictions like two previous cases.

Figure 32:
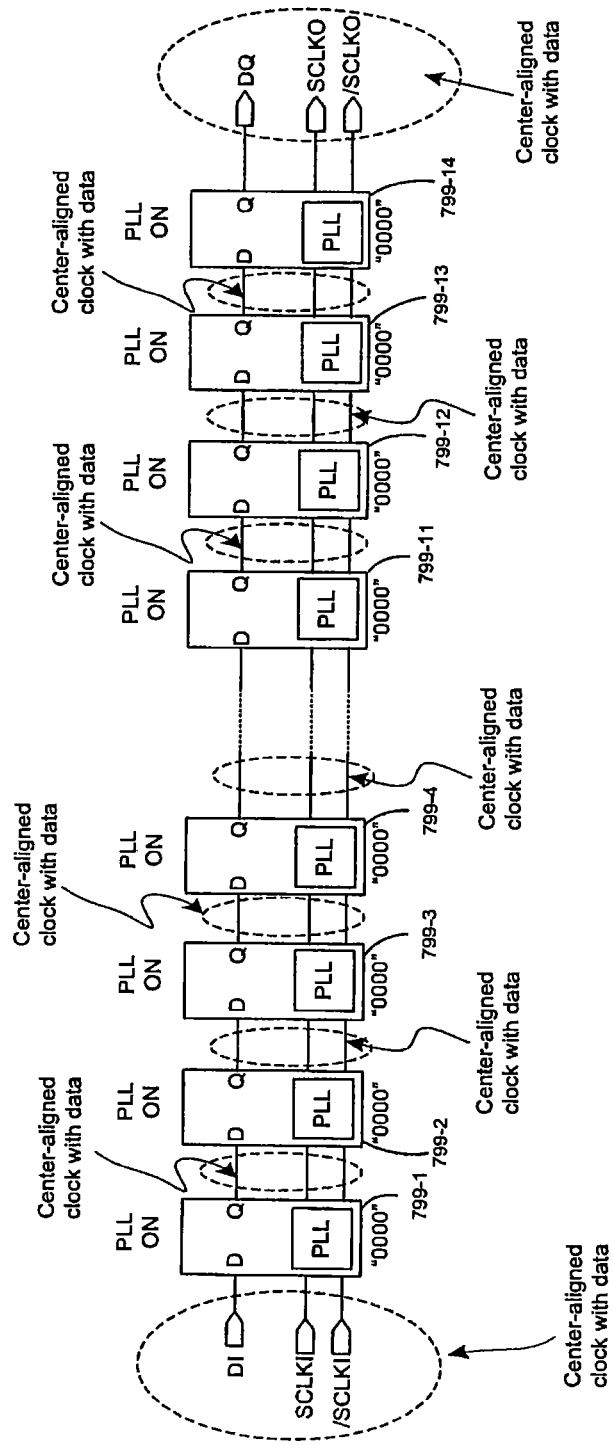
FIG. 32 is a block diagram of an example system having a plurality of devices with the source synchronous clock structure before ID assignments.

FIG. 32 depicts one example of a system with a full source synchronous clock structure. In the illustrated example, the system includes 14 devices 799-1-799-14, each having a PLL. Each of the devices has an ID register for holding an associated ID that is a binary code. In this particular example, the ID is four-bit binary number. Since no ID assignments to the devices 799-1-799-14, their ID registers holds the initial IDs (i.e., "0000"). The PLL_EN signal of each device is logic "high" in accordance with the LSB of the initial ID (i.e., "0"). Therefore, the PLLs of all devices are enabled ("on").

Figure 33A:
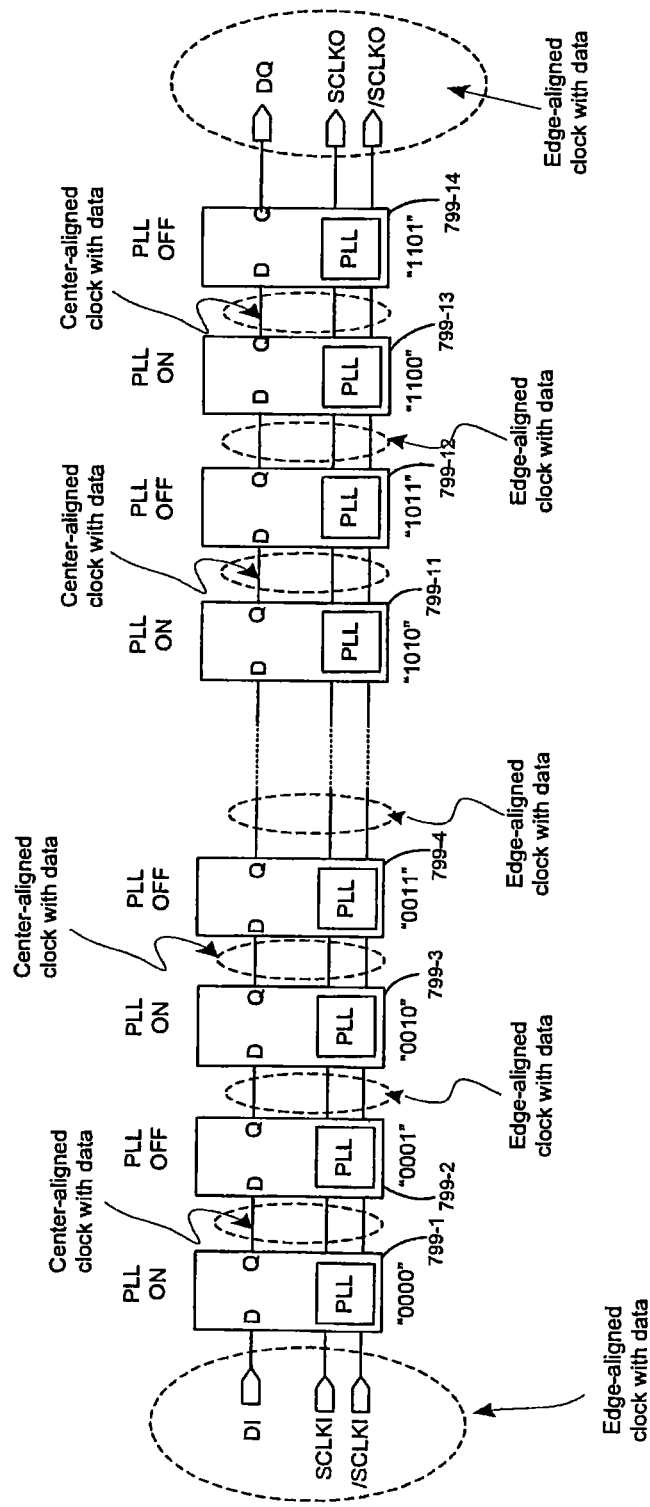
FIG. 33A is a block diagram of an example system having a plurality of devices after Id assignments.

FIG. 33A shows an example of a plurality of devices that are series-connected, with the full source synchronous clock structure, which alternates between edge-aligned clock and center-aligned clock. In the particular example, the system uses edge-aligned clock with data. Referring to FIG. 33A, in the initial mode, the devices 799-1-799-14 are assigned with ID numbers "0000"-"1101", respectively. The PLL_EN signal of each device is logic "high" or "low" in accordance with the LSB of the ID assigned to that device. In the particular example shown in FIG. 33A, the LSBs of the first, third, - - - devices are "0" and their PLL_EN signals are logic "high". The LSBs of the second, fourth, - - - devices are "1" and their PLL_EN signals are logic "low".

Figure 33B:
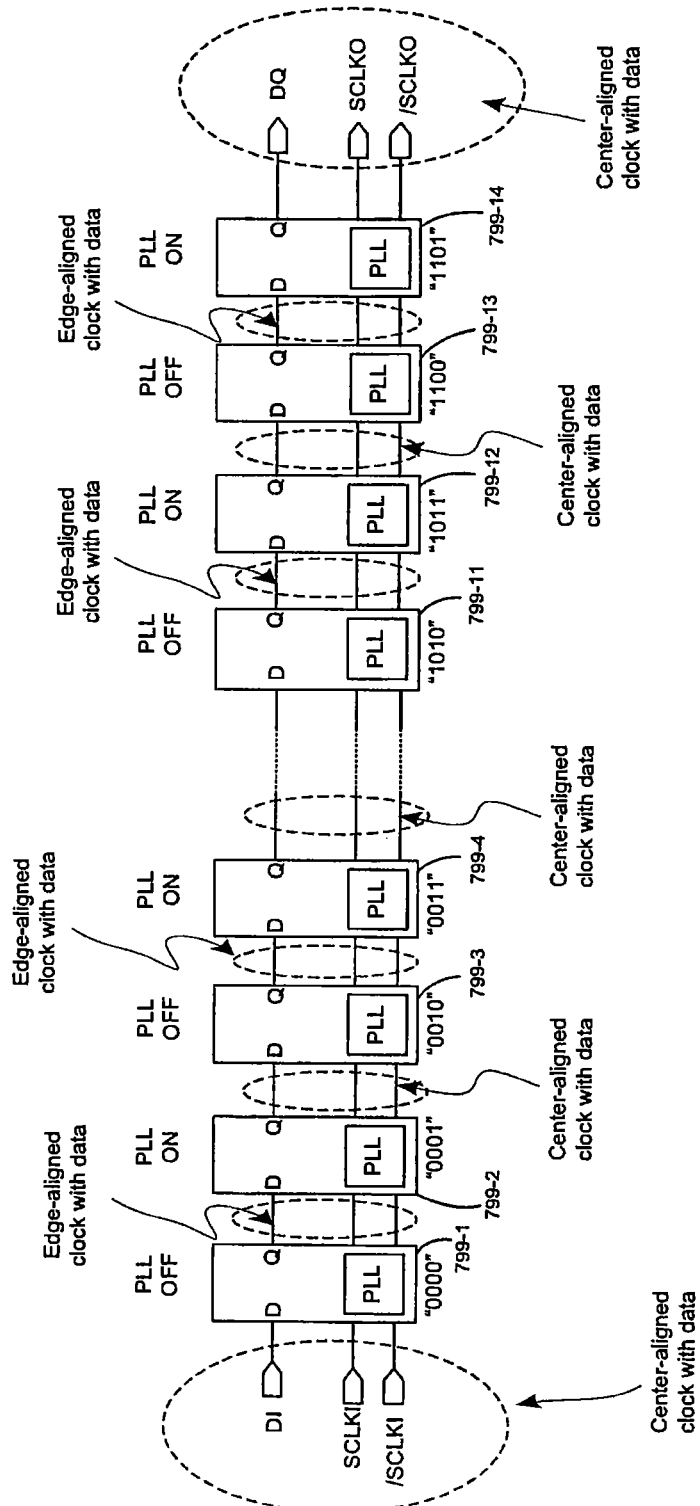
FIG. 33B is a block diagram of another example system having a plurality of devices after ID assignments.

FIG. 33B shows another example of a plurality of devices that are series-connected, with the source synchronous clock structure, which alternates between center-aligned clock and edge-aligned clock. In the particular example, the system uses center-aligned clock with data. Referring to FIG. 33B, in the initial mode, the devices 799-1-799-14 are assigned with ID numbers "0000"-"1101", respectively. The PLL_EN signal of each device is logic "low" or "high" in accordance with the LSBs of the IDs assigned to the devices. In this particular example, the PLL_EN signals of the first, third, - - - devices are logic "low". The PLL_EN signals of the second, fourth, - - - devices are logic "high". In each of the system shown in FIGS. 32, 33A and 33B, the number of devices, N, is 14 (the even number), but the number of series-connected devices is not limited. As shown in FIGS. 33A and 33B, the N/2 devices are enabled (on) and the other N/2 devices are disabled (off).

Figure 34A:
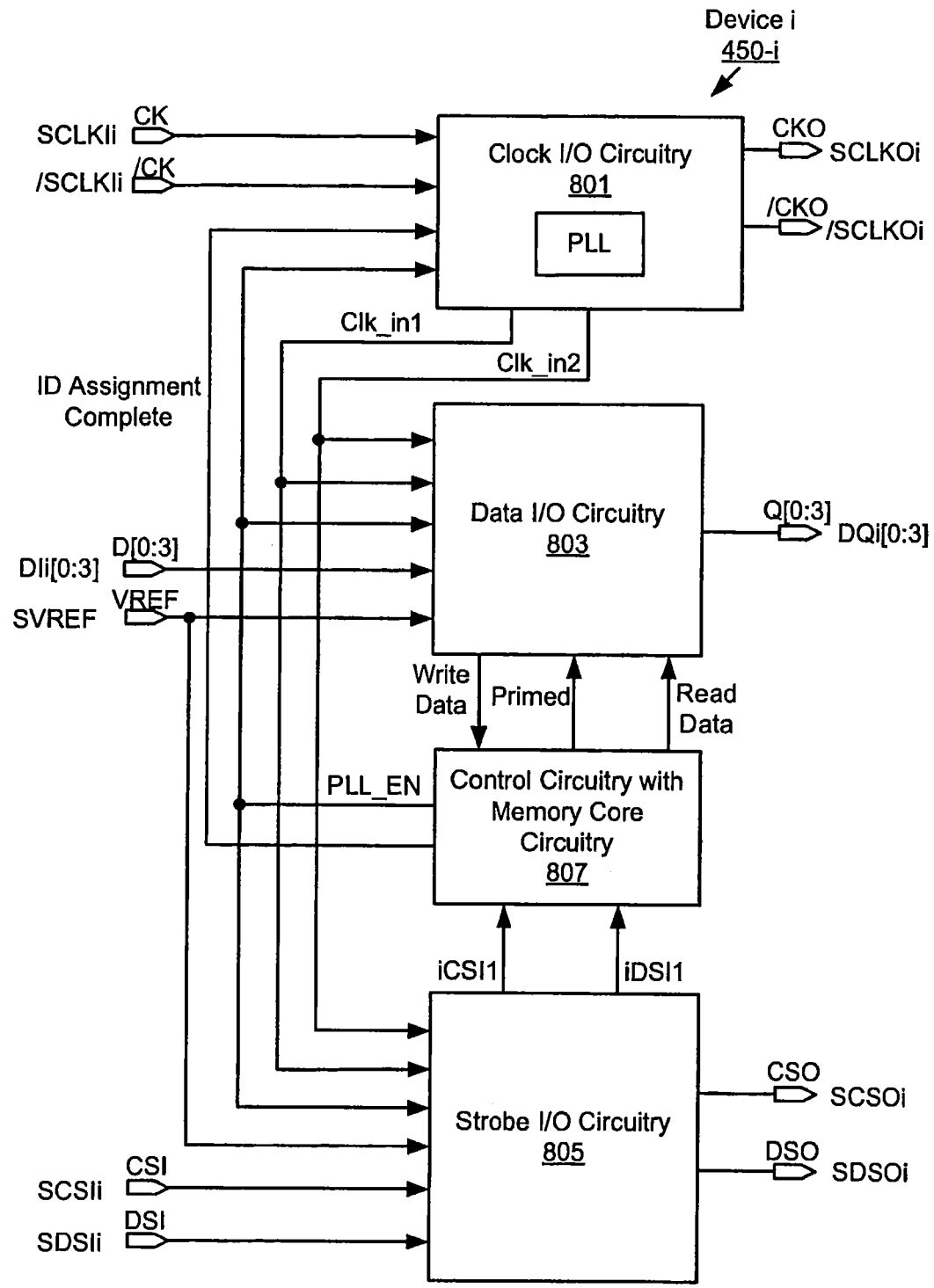
FIG. 34A is a block diagram of one memory device for use with the source synchronous clock.

FIG. 34A shows one of the devices having a full source synchronous clocking interface. Referring to FIG. 34A, the device includes clock I/O circuitry 801 including a PLL, data I/O circuitry 803, strobe I/O circuitry 805 and control circuitry with memory core circuitry 807. The clock I/O circuitry 801 receives the SCLKI, /SCLKI signals and outputs the SCLKOi, /SCLKOi signals. The clock I/O circuitry 801 provides two internally produced clock signals Clk_in1 and Clk_in2 (hereinafter referred to as "Clk_in1 clock signal and "Clk_in2 clock signal, respectively) to the data I/O circuitry 803 and the strobe I/O circuitry 805. The reference voltage signal SVREF is provided to the data I/O circuitry 803 and the strobe I/O circuitry 805. The data I/O circuitry 803 receives input data DIi[0:3] and provides output data DQi[0:3]. The strobe I/O circuitry 805 receives the SCSIi, SDSIi signals and outputs the SCSOi, SDSOi signals. The control circuitry 807 receives an internal command strobe input signal iCSI1 and an internal data strobe input signal iDSI1 from the strobe I/O circuitry 805 and data to be written from the data I/O circuitry 803. The control circuitry 807 provides read data to the data I/O circuitry 803. The control circuitry 807 provides the PLL_EN signal to the clock I/O circuitry 801, the data I/O circuitry 803 and the strobe I/O circuitry 805. Also, the control circuitry 807 provides an ID assignment complete signal to the clock I/O circuitry 801.

Figure 34B:
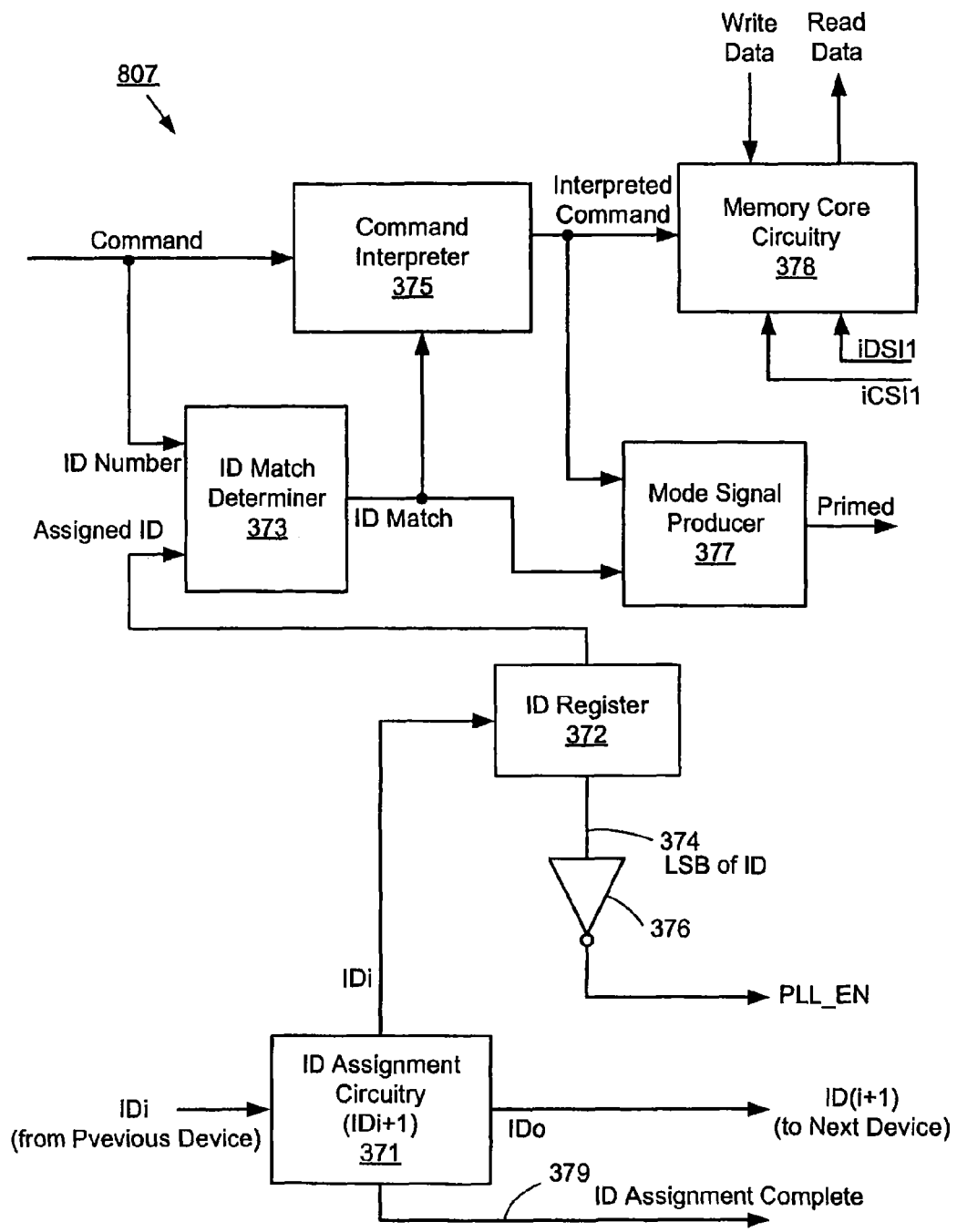
FIG. 34B is a block diagram of control circuitry with memory core circuitry shown in FIG. 34A.

FIG. 34B shows the control circuitry with memory core circuitry 807 shown in FIG. 34A. Referring to FIGS. 34A and 34B, ID assignment circuitry 371 performs an ID assignment and an ID calculation in the initial mode. The number of an input ID, IDi, is registered in an ID register 372. The number of the calculation result (i.e., IDi+1) is provided by Device i as an output IDo to the next device. The ID register 372 holds the assigned ID.

The ID register 372 provides a one-bit signal 374 representing the logic state of the LSB (least significant bit) of the assigned IDi to an inverter 376, the inverted output signal of which is output as the PLL_EN signal. Thus, the PLL_EN signal has the logic state "high" or "low" in response to the "0" or "1" of the LSB of the assigned IDi. Also, the ID assignment circuitry 371 outputs the ID assignment complete signal 379 upon completion of ID assignment. In the initial mode, the ID register 372 is first reset and the LSBs of the all ID registers 372 are "0". Therefore, the PLL_EN signal is logic "high" and the PLLs of all devices are enabled (on) as shown in FIG. 32. Upon registration of IDs, in response to the LSBs of even number IDs, the PLL_EN signals are "high" and in response to the LSBs of odd number IDs, the PLL_EN signals are "low". In response to the "high" PLL_EN signals, the PLLs of the first, third, fifth, - - - devices are enabled (on) and in response to the "low" PLL_EN signals, the PLLs of the second, fourth, devices are disabled (off), as shown in FIG. 33A.

Thereafter, in the normal mode, a command having a format as shown in FIG. 6 is fed to an ID match determiner 373 and a command interpreter 375. The ID match determiner 373 determines whether the input ID number matches the assigned ID held in the ID register 372 and if they match, an ID match signal of logic "high" will be provided. If there is no match, the ID match signal will be logic "low". The command interpreter 375 including an OP code decoder decodes the OP code contained in the input command and provides an interpreted command (e.g., write, read), in response to the "high" ID match signal. In response to the interpreted command and the ID match signal, a mode signal producer 377 provides a "Primed" signal. In the particular example, the Primed signal is logic "low" when there is no ID match, and logic "high" when there is an ID match and the OP code is "read" (i.e., the command is a data read command). In response to the interpreted command, for example, data is written to or data is read from memory core circuitry 378 having data storage or memory elements (not shown). The memory core circuitry 378 receives the internal command strobe input signal iCSI1 and the internal data strobe input signal iDSI1 from the strobe I/O circuitry 805.

Figure 34C:
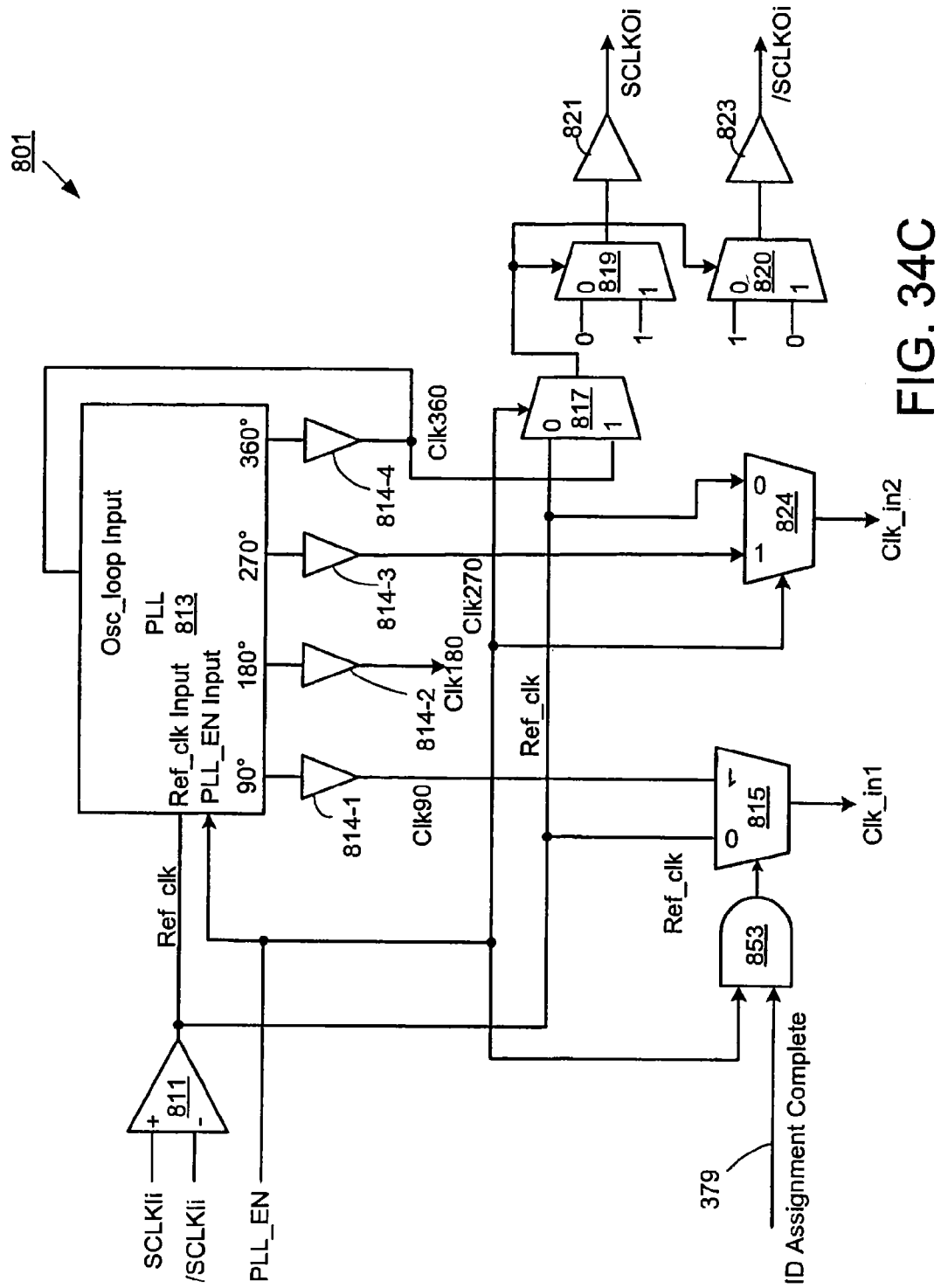
FIG. 34C is a block diagram of clock I/O circuitry shown in FIG. 34A.

FIG. 34C shows details of the clock I/O circuitry 801 shown in FIG. 34A. Referring to FIGS. 34A and 34C, the PLL_EN signal is provided to a PLL 813. The SCLKIi and /SCLKIi signals are fed to "+" and "−" inputs of an input buffer 811 which in turn provides a reference clock signal Ref_clk to a reference clock input "Ref_clk input" of the PLL 813. The PLL 813 includes an oscillator and produces four clock signals phase shifted by 90°, 180°, 270° and 360°, with respect to the input reference clock signal Ref_clk, through buffers 814-1, 814-2, 814-3 and 814-4, respectively. The four phase shifted clock signals of 90°, 180°, 270° and 360° referenced by Clk90, Clk180, Clk270 and Clk360 are hereinafter referred to as "Clk90 signal", "Clk180 signal", "Clk270 signal" and "Clk360 signal", respectively. The Clk360 signal is fed to an oscillation input "Osc_loop Input" of the PLL 813. The Clk360 signal, the reference clock signal Ref_clk and the PLL_EN signal are fed to the "1", "0" and selection inputs of the selector 817, respectively, the output signal of which is fed to the selection inputs of selectors 819 and 820.

The "0" and "1" inputs of the selector 819 receive logic "0" and "1" signals, respectively. The "0" and "1" inputs of the selector 820 receive logic "1" and "0" signals, respectively. The output signal of the selector 819 is provided as the SCLKOi signal through an output buffer 821. Similarly, the output signal of the selector 820 is provided as the /SCLKOi signal through an output buffer 823. The SCLKOi and /SCLKOi signals are therefore complementary differential clock signals which are 180° out of phase.

The ID assignment complete signal 379 and the PLL_EN signal are fed to an AND gate 853, the logic output signal of which is fed to the selection input of a selector 815. The reference clock signal Ref_clk and the Clk90 signal are fed to the "0" and "1" inputs of the selector 815, respectively, the selected output signal of which is provided as the Clk_in1 clock signal. Also, the PLL_EN signal is fed to the selection input of a selector 824, the "1" and "0" inputs receive the Clk270 signal and reference clock signal Ref_clk, respectively. The selected output signal from the selector 824 is provided as the Clk_in2 clock signal.

Figure 34D:
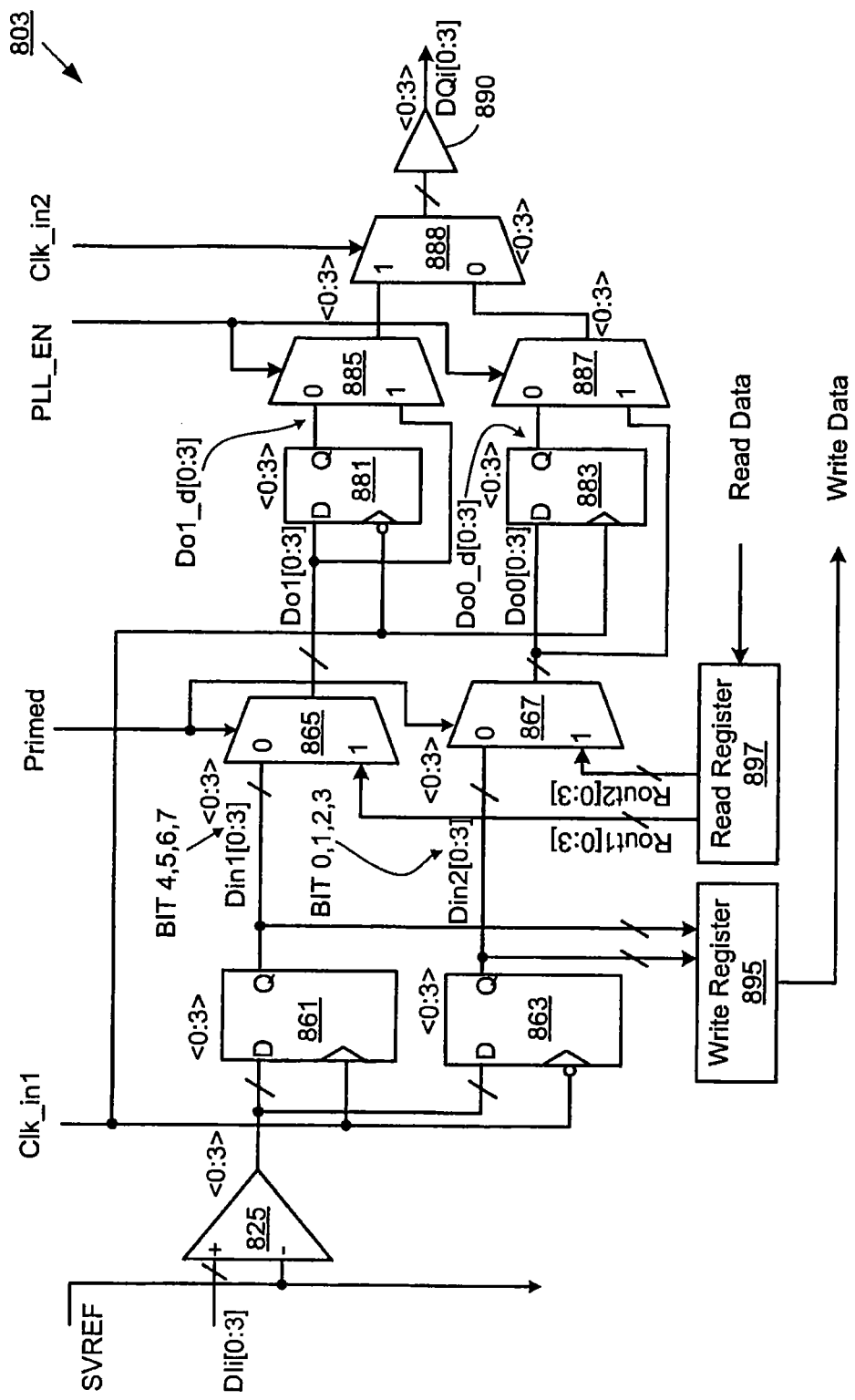
FIG. 34D is a block diagram of data I/O circuitry shown in FIG. 34A.

FIG. 34D shows the data I/O circuitry 803 shown in FIG. 34A. Referring to FIGS. 34A and 34D, the reference voltage signal SVREF is provided to the "−" input of an input buffer 825. The input data DIi[0:3] is fed to the "+" input of the input buffer 825, the output data <0:3> of which is fed to data input "D" of D-FFs 861 and 863 that are clocked by positive and negative edges of the Clk_in1 clock signal, respectively, to capture DDR data. Although the device has a four-bit data path, the circuitry for only a single bit is shown. Each of the circuit elements processing data is replicated four times in the actual devices. The four-bit output Din1 [0:3] of the D-FF 861 comprises bits 4, 5, 6 and 7 and is fed to "0" input of a selector 865. Similarly, the four-bit output Din2[0:3] of the D-FF 863 comprises bits 0, 1, 2 and 3 and is fed to the "0" input of a selector 867. The selectors 865 and 867 perform selection operation in accordance with the "Primed" signal fed to the selection inputs thereof. The selected output signals from the selectors 865 and 867 are fed to data inputs D of D-FFs 881 and 883 that are clocked by the negative and positive edges of the Clk_in1, respectively, for internal data latch operation.

Internally selected output data Do1[0:3] from the selector 865 and internally latched output data Do1_d[0:3] of the D-FF 881 are fed to the "1" and "0" inputs of a selector 885, respectively. The internally selected output data Do0[0:3] from the selector 867 and the internally latched output data Do0_d[0:3] of the D-FF 883 are fed to the "1" and "0" inputs of a selector 887, respectively. The selection inputs of the selectors 885 and 887 receive the PLL_EN signal. The selected output data <0:3> of the selector 885 is fed to the "1" input of a selector 888 and the selected output data <0:3> of the selector 887 is fed to the "0" input of the selector 888, the selection input of which receives the internal clock signal Clk_in2. In response to the internal clock signal Clk_in2, the selected output data <0:3> of the selector 888 is provided through an output buffer 890 as the output data DQi[0:3].

In write operation, the latched data from the D-FFs 861 and 863, Din1[0:3] (i.e., bits 4, 5, 6, and 7) and Din2[0:3] (i.e., bits 0, 1, 2 and 3) are provided to a write register 895. In read operation, the control circuit with memory core circuitry 807 accesses the data store elements therein and reads the data and the read data is written into a read register 897. Read data, as Rout1[0:3] (bits 4, 5, 6 and 7) and Rout2[0:3] (bits 0, 1, 2 and 3) are selected by the selectors 865 and 867, respectively, and eventually output data DQi[0:3] is provided to the next memory device.

Figure 34E:
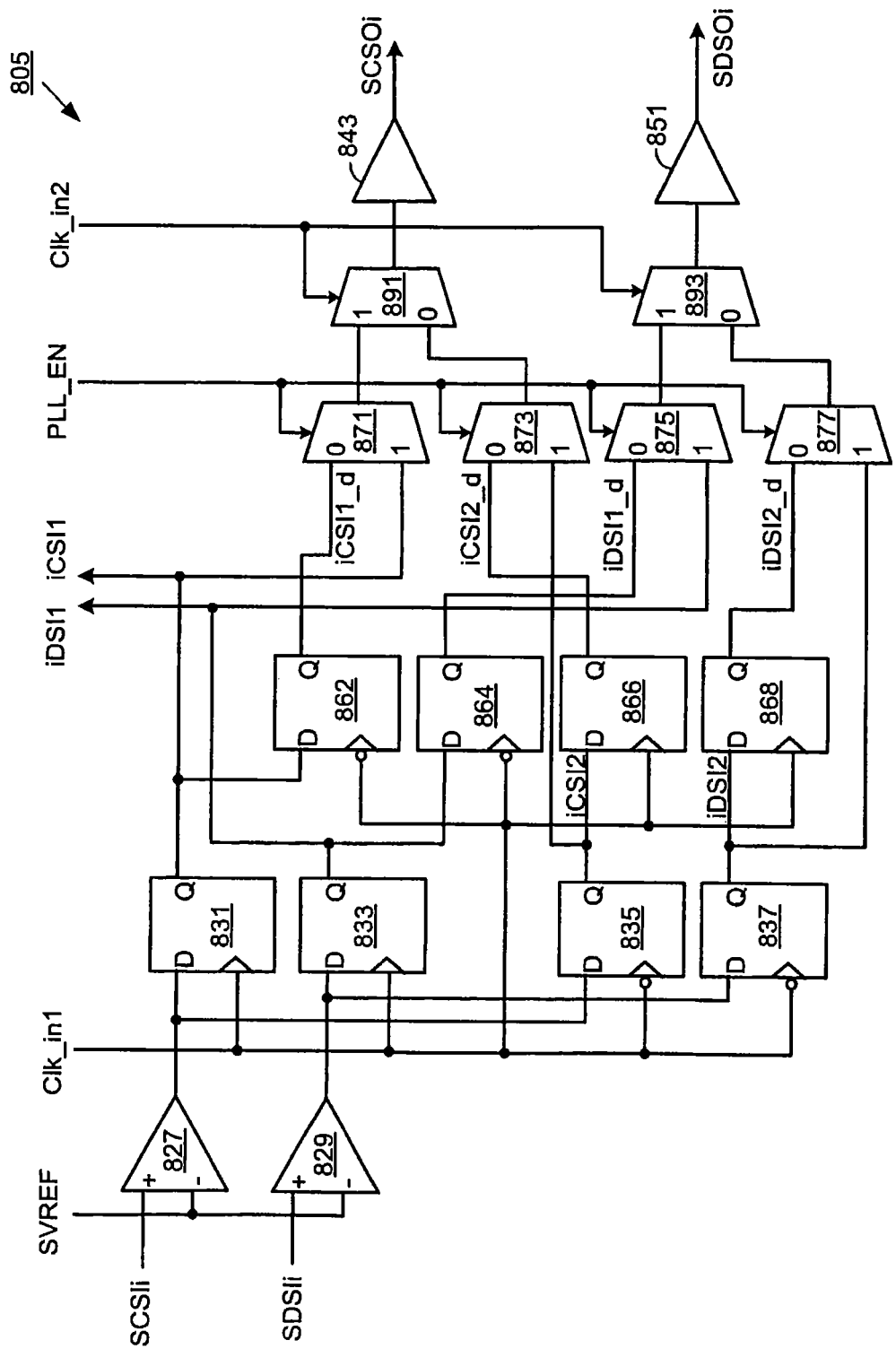
FIG. 34E is a block diagram of strobe I/O circuitry shown in FIG. 34A.

FIG. 34E shows the strobe I/O circuitry 805 shown in FIG. 34A. Referring to FIGS. 34A and 34E, the reference voltage signal SVREF is provided to the "−" input of input buffers (comparators) 827 and 829. The SCSIi and SDSIi signals are fed to the "+" inputs of input buffers 827 and 829, respectively. The output signal of the buffer 827 is provided to the D inputs of D-FFs 831 and 835. The output signal of the buffer 829 is provided to the D inputs of D-FFs 833 and 837. The Clk_in1 clock signal is provided to the clock inputs of the D-FFs 831 and 833 and to the inverting clock inputs of the D-FFs 835 and 837

The D-FFs 831 and 833 perform latching operation in response to the positive edges of the Clk_in1 clock signal. The D-FFs 835 and 837 perform latching operation in response to the negative edges of the Clk_in1 clock signal. Therefore, the latching operation of the D-FFs 835, 837 is 180° phase-shifted of the Clk_in1 clock signal. The D-FFs 831 and 833 output the internal command strobe input signal iCSI1 (hereinafter referred to as "iCSI1 signal") and the internal data strobe input signal iDSI1 signal (hereinafter referred to as "iDSI1 signal") that are provided to the control circuitry 807. The D-FFs 835 and 837 output another internal command strobe input signal iCSI2 (hereinafter referred to as "iCSI2 signal") and another internal data strobe input signal iDSI2 signal (hereinafter referred to as "iDSI2 signal").

The iCSI1 and iDSI1 signals are fed to the D inputs of the D-FFs 862 and 864, respectively, that are clocked by the negative edges of the Clk_in1 clock signal. The iCSI2 and iDSI2 signals are fed to the D inputs of the D-FFs 866 and 868, respectively that are clocked by the positive edges of the Clk_in1 clock signal. The iCSI1 signal and the output signal iCSI1_d from the D-FF 862 are fed to the "1" and "0" inputs of a selector 871. The iCSI2 signal and the output signal iCSI2_d from the D-FF 866 are fed to the "1" and "0" inputs of a selector 873. The iDSI1 signal and the output signal iDSI1_d from the D-FF 864 are fed to the "1" and "0" inputs of a selector 875. The iDSI2 signal and the output signal iDSI2_d from the D-FF 868 are fed to the "1" and "0" inputs of a selector 877. The PLL_EN signal is fed to the selection inputs of the selectors 871, 873, 875 and 877. The selected output signals of the selectors 871 and 873 are fed to the "1" and "0" inputs of selector 891, respectively. The selected output signals of the selectors 875 and 877 are fed to the "1" and "0" inputs of selector 893, respectively. The Clk_in2 clock signal is fed to the selection inputs of the selectors 891 and 893. The selected output signal from the selector 891 is provided through an output buffer 843 as the SCSOi signal. The selected output signal from the selector 893 is provided through an output buffer 851 as the SCSOi signal.

Figure 35A:
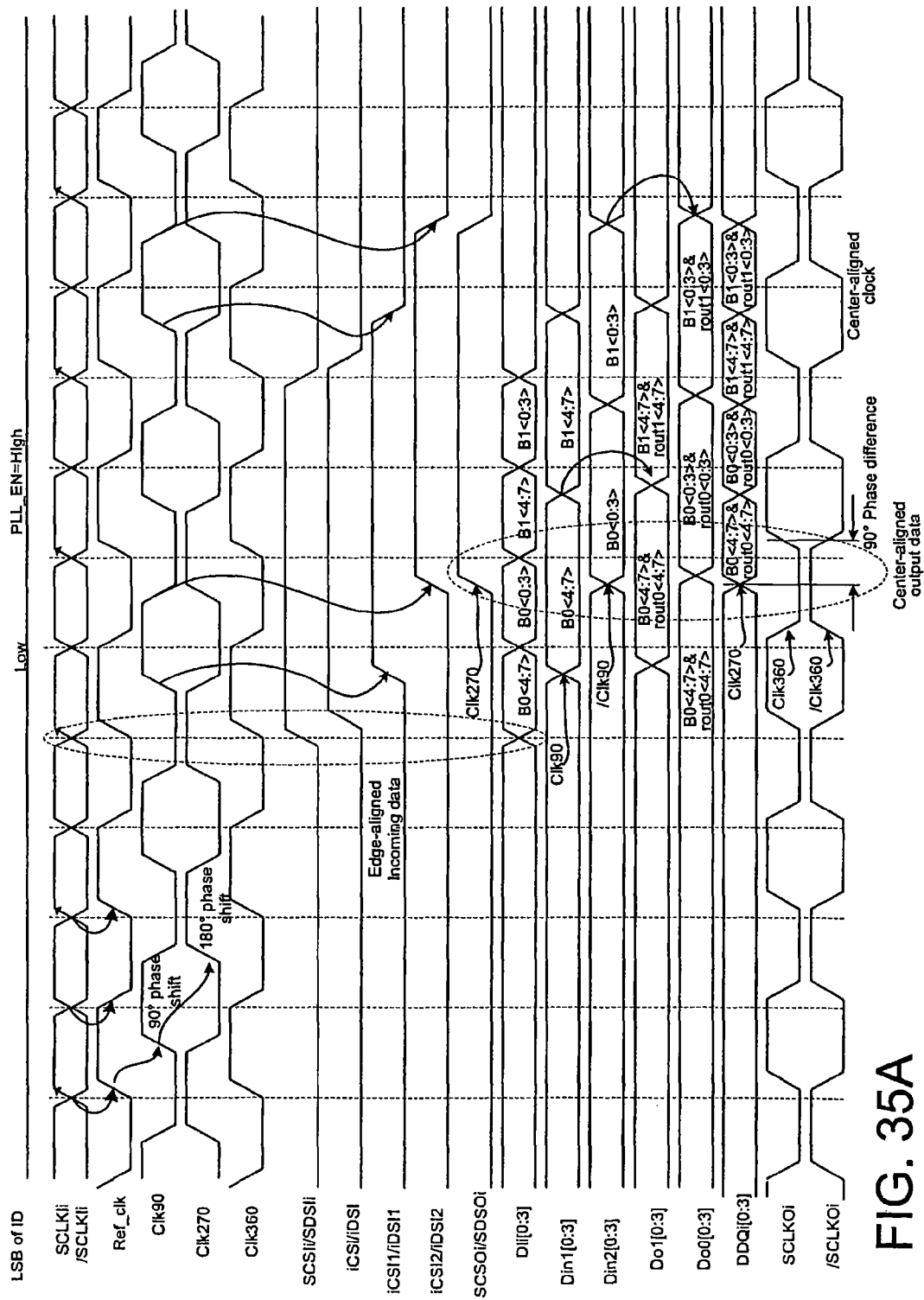
FIG. 35A is a timing diagram for the device shown in FIGS. 34A-34E with the enabled PLL.

FIG. 35A shows various signals for the device shown in FIGS. 34A-34E. Referring to FIGS. 34A-34E and 35A, in the event that the LSB of the assigned ID is "0", the output signal 374 from the ID register 372 is logic "low" and the output signal of the inverter 376 is "high", resulting in the PLL_EN signal being logic "high". In the event that the LSB of the assigned ID is "1", the output signal 374 from the ID register 372 is logic "high" and the PLL_EN signal is logic "low". In response to the PLL_EN signal having the logic "high" or "low", the PLL 813 is disabled or enabled.

Before assigning device IDs, all memory components have "0000" ID number as a default value. Therefore, all PLLs of all components (or devices) are enabled and it can start ID assignment operations with the situation of all PLL turn-on as shown in FIG. 32. The LSB of ID is used to determine whether the PLL is turned on (enabled) or off (disabled). If LSB is "0", it will turn on PLL. Otherwise, in case of LSB equal to "1", it turns off PLL.

Switching between center-aligned clocking and edge-aligned clocking needs to have several hundred cycles at the power-up sequence operation. However, it does not affect the real performance of component operation. Also, according to the last device ID number (that is, the total number of components (or devices) on the ring type connection), the last output can be edge-aligned clock with data or center-aligned clock with data.

During power-up sequence, a device address (DA) or device identification (ID) assignment operation is performed automatically into each device with enabled PLL. So, for this operation, even though PLL is turned on in all components, the input side of each component has the reference clock signal Ref_clk instead of the 90° phase shifted clock signal as shown in FIG. 34C by the logic zero state of the ID_assignment_complete signal 379. Because the input data already has center-aligned clocks with data from the memory controller and a previous component (or device) generates the center-aligned clocks with data. This exemption occurs only before ID assignment. It is controlled by the ID_assignment_complete signal 379. If it is "low", it will enable the "0" input connected to the "Ref_clk". If it is "high", it will enable "1" input connected to the 90° phase shifted clock. The control of timing relationship between center-aligned clock and edge-aligned clock in the memory controller is required to support this source synchronous way. Comparing to all turn-on PLL case, this provides 50% drop of power consumption, relatively, when comparing to the all PLL-on case. Examples of the control between center-aligned clock and edge-aligned clock in the memory controller are disclosed in the disclosed in U.S. Provisional Patent Application No. 61/013,784 filed Dec. 14, 2007; and U.S. Provisional Patent Application No. 61/039,605 filed Mar. 25, 2008.

Figure 36A:
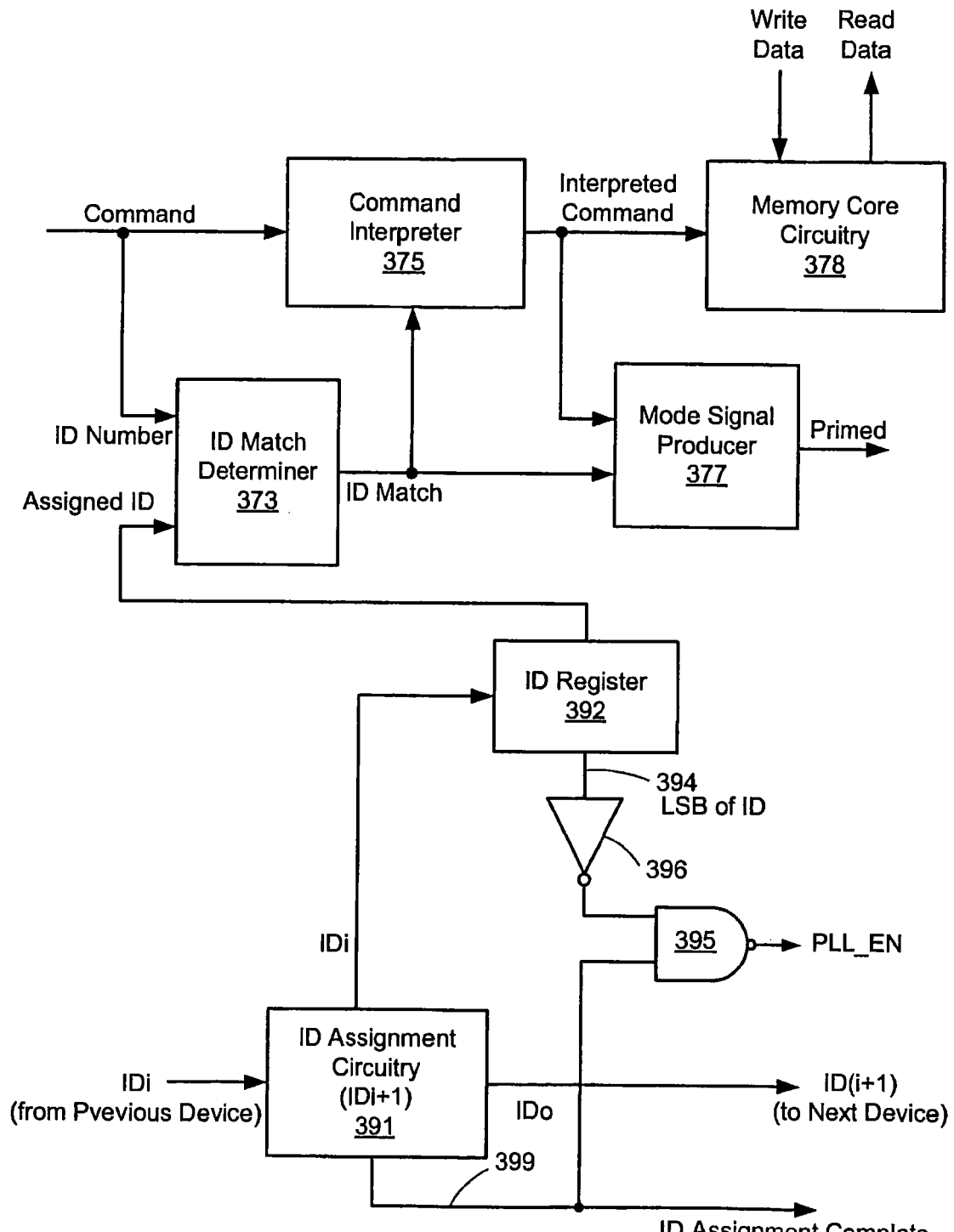
FIG. 36A is a block diagram of another example of the control circuitry with memory core circuitry shown in FIG. 34A.
Figure 36B:
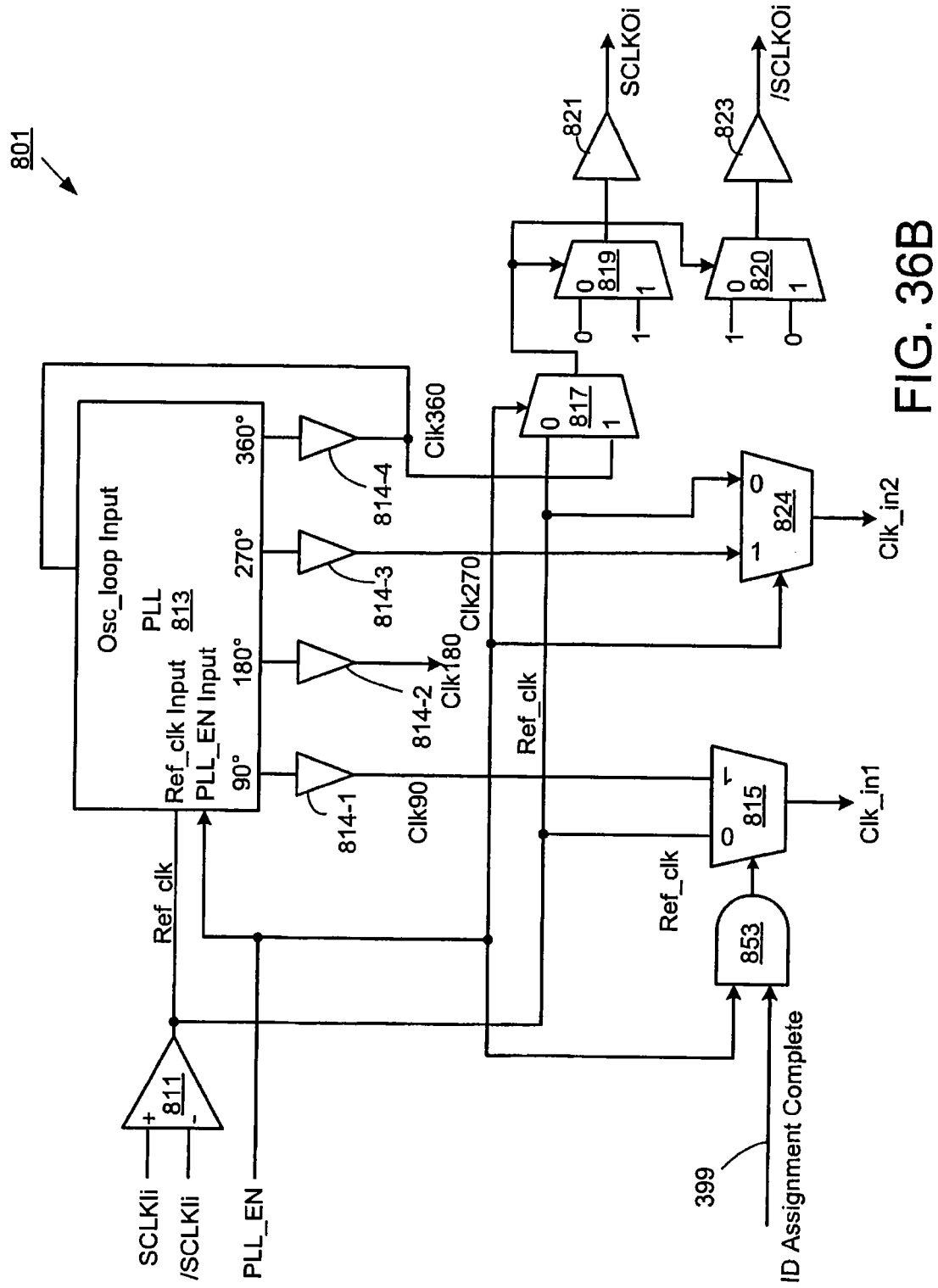
FIG. 36B is a block diagram of another example of the clock I/O circuitry shown in FIG. 34A.

FIG. 36A shows another example of the control circuitry with memory core circuitry 807 shown in FIG. 34A. Referring to FIGS. 34A and 36A, ID assignment circuitry 391 performs an ID assignment and an ID calculation in the initial mode. The number of an input ID, Di, is registered in an ID register 392. The number of the calculation result (i.e., IDi+1) is provided by Device i as an output IDo to the next device. The ID register 392 holds the assigned ID.

The ID register 392 provides a one-bit signal 394 representing the logic state of the LSB of the assigned IDi to an inverter 396, the inverted output signal of which is provided to a NAND gate 395. The ID assignment circuitry 391 provides an ID assignment complete signal 399 to the NAND gate 395, the logic output signal of which is provided as the PLL_EN signal. The PLL_EN signal and the ID assignment complete signal 399 are fed to the AND gate 853. Also, the PLL_EN signal is fed to the PLL 813, the AND gate 853 and the selectors 817, 824.

Thereafter, in the normal mode, the control circuitry shown in FIG. 36A performs similar operations to those of the control circuitry 807 shown in FIG. 34B.

Figure 37A:
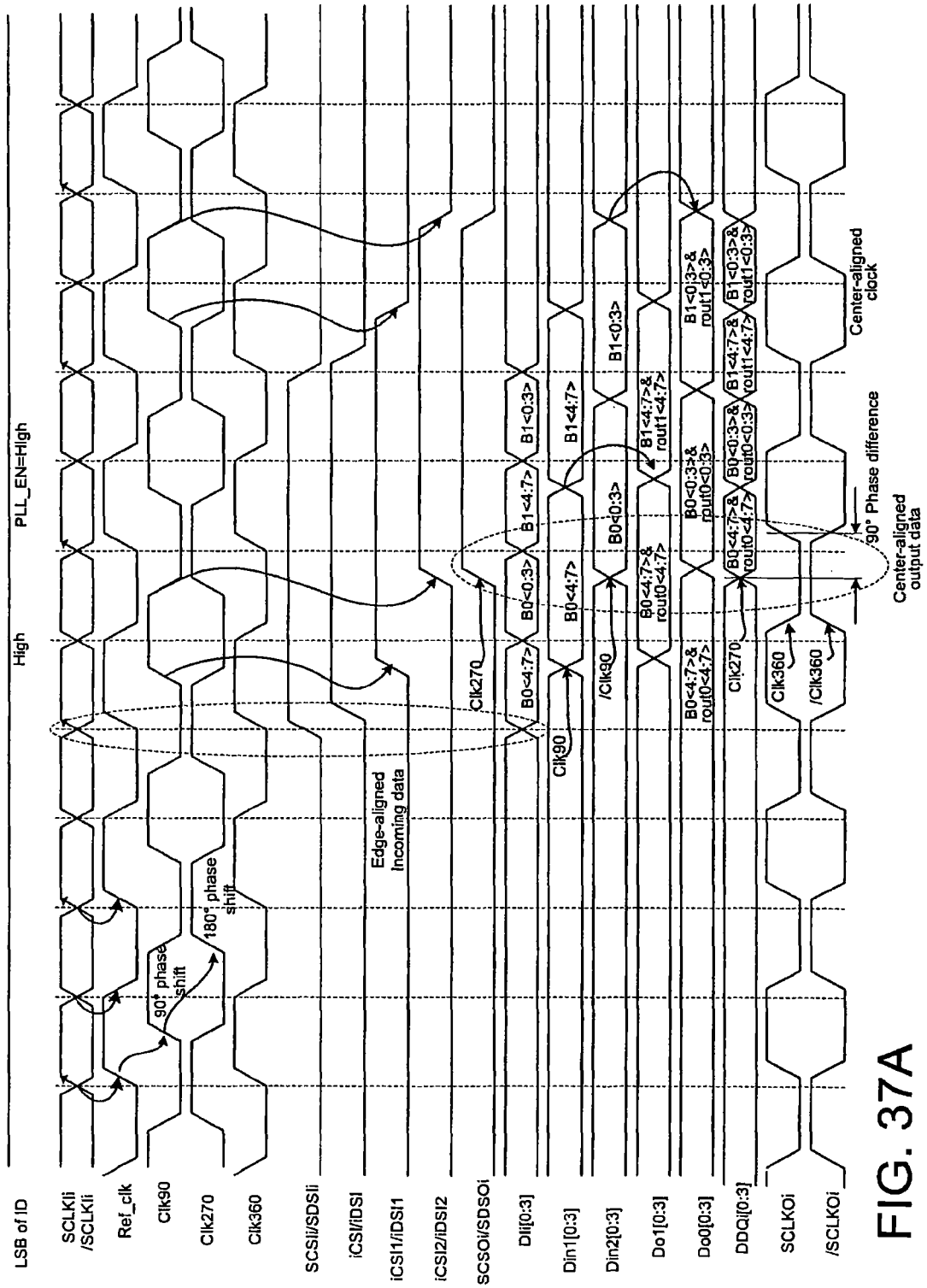
FIG. 37A is a timing diagram for the device shown in FIGS. 34A, 34D-34E and 36A, 36B with the enabled PLL.
Figure 37B:
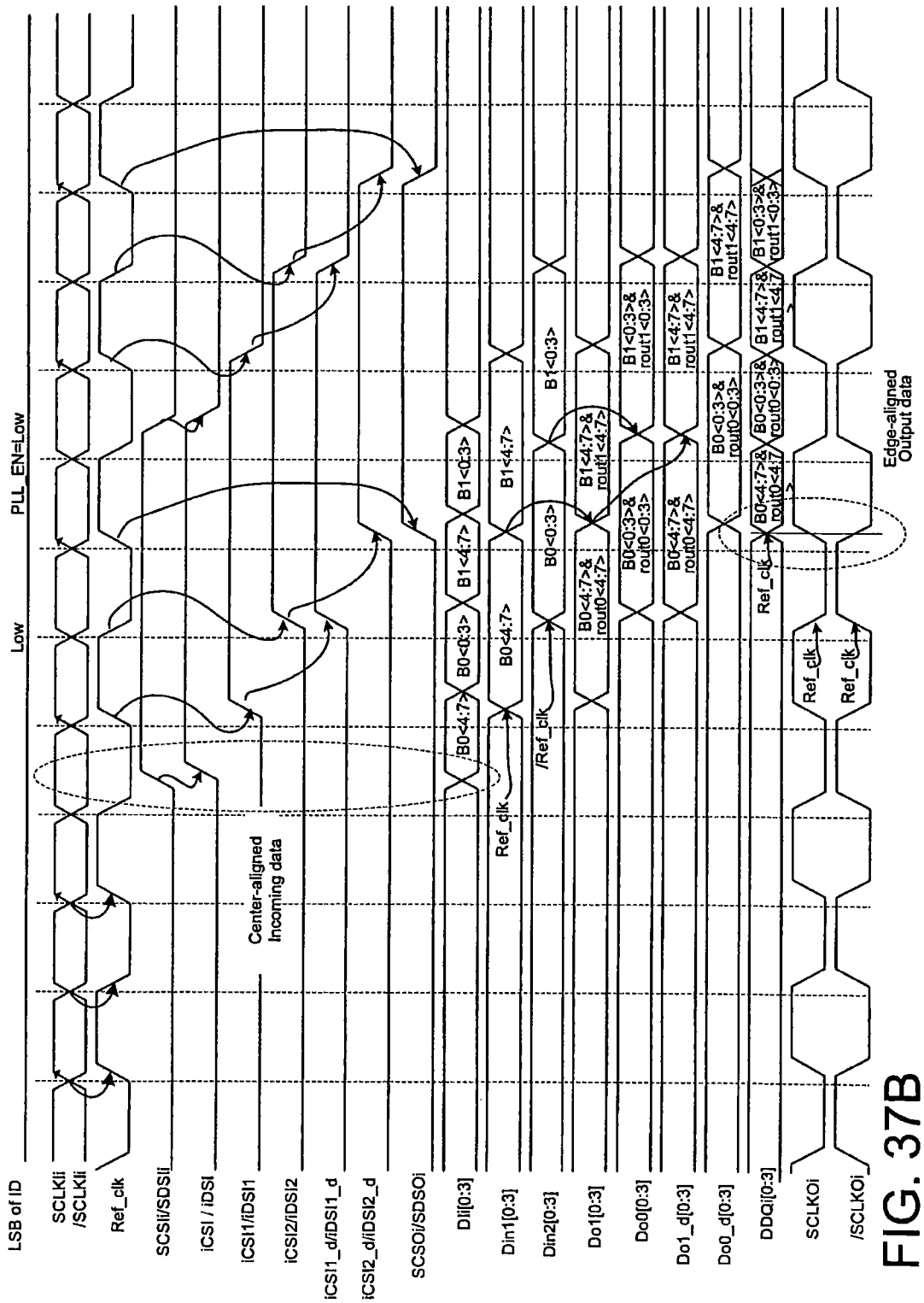
FIG. 37B is a timing diagram for the device shown in FIGS. 34A, 34D-34E and 36A, 36B with the disabled PLL.

FIG. 37A is a timing diagram for the device shown in FIGS. 34A, 34C-34E and 36 with the enabled PLL. FIG. 37B is a timing diagram for the device shown in FIGS. 34A, 34C-34E and 36 with the disabled PLL.

Referring to FIGS. 34A, 34C-34E and 37A, 37B, when the PLL 813 is turned on, the input data is latched by the 90° phase shifted clock in input stage. The output signals, such as SCSOi and SDSOi signals and DQi[0:3] are aligned with centered clock with 90° phase difference. By this shifted clocks, the next device can capture the input data without any clock phase change from the PLL. That is why alternate PLL on (enabled) and off (disabled) is possible in this full source synchronous clock structure.

Figure 35B:
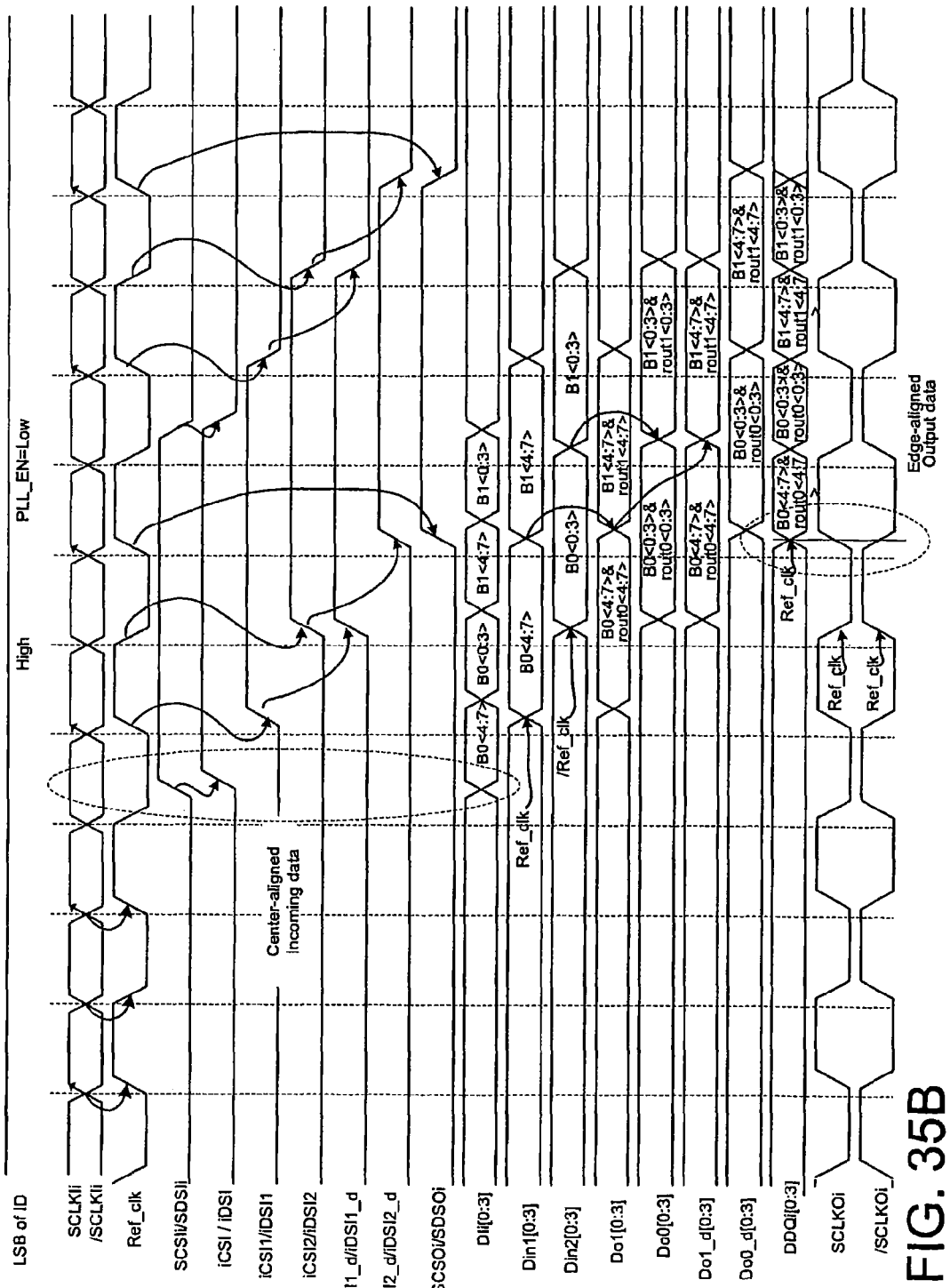
FIG. 35B is a timing diagram for the device shown in FIGS. 34A-34E with the disabled PLL.

In the systems having the devices shown in FIGS. 34A-34E, 36A and 36B, from the device having the disabled PLL, edge-aligned output data is provided and then it is re-aligned in the next device having the enabled PLL that is connected to the previous device. Two timing relationships (e.g., shown in FIGS. 35A, 35B; and 37A, 37B) are repeated in the proposed full source synchronous clock structure.

The technique is applicable nonvolatile devices, such as, for example, flash devices. Flash devices include any type of flash memory devices, such as, for example, NAND flash, NOR flash.

In the above examples, the devices are memory devices. Memory devices may be any one of volatile and nonvolatile memories. Also, the devices may be any semiconductor devices, the operations of which are synchronized with clock signals.

Electronic equipment using semiconductor devices may include various electric devices, such as, for example, digital still and video cameras, personal digital assistants, mobile-type computers, audio and musical apparatus, and cellular phones.

In the examples described above, the device, elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration, the devices, elements and circuits are directly or indirectly coupled with or connected to each other.

The above-described and -illustrated examples of the present invention are intended to be examples only. Alterations, modifications and variations may be effected to the particular embodiments by those of skill in the art without departing from the scope of the present invention, which is defined solely by the claims appended hereto.

What is claimed is:

1. A device for transferring data having a period defined by transitions of an input clock signal, the device comprising: clock circuitry configured to: provide a plurality of reproduced clock signals in response to the input clock signal, the phases of the plurality of reproduced clock signals being differently shifted with the data to each other, and produce an output clock signal in response to at least one of the plurality of reproduced clock signals; and synchronization circuitry for synchronizing the transfer of the data with at least one of the reproduced clock signals, the transition of the output clock signal occurring during the period of the data, the clock circuitry comprising:
a phase-locked loop (PLL) configured to provide the plurality of reproduced clock signals in response to the input clock signal; and
clock output circuitry configured to produce the output clock signal in response to at least one of the plurality of reproduced clock signals,
the PLL being further configured to be selectively enabled or disabled in response to a control signal, the control signal having first and second logic states to cause the PLL to be enabled and disabled, respectively,
in the case of the PLL being enabled, the PLL being configured to produce the plurality of reproduced clock signals in response to the input clock signal, the clock output circuitry being configured to produce the output clock signal in response to at least one of the plurality of reproduced clock signals, and synchronization circuitry being configured to synchronize the transfer of the data with at least one of the reproduced clock signal; and
in the case of the PLL being disabled, the synchronization circuitry being configured to synchronize the transfer of the data with the input clock signal.

2. The device of claim 1, wherein the clock circuitry is further configured to provide an internal clock signal in response to the input clock signal comprising one clock signal and its complementary clock signal.

3. The device of claim 2, wherein the PLL is further configured to produce the plurality of reproduced clock signals in response to the internal clock signal when the PLL is enabled.

4. The device of claim 2, wherein the synchronization circuitry is further configured to synchronize the transfer of the data with the internal clock signal when the PLL is disabled.

5. The device of claim 4, wherein the PLL is further configured to output the reproduced clock signals with the phase shift that is a multiple of 90.degree. with the data.

6. The device of claim 2, wherein the clock output circuitry is configured to produce the reproduced clock signal comprising one clock signal and its complementary clock signal.

7. The device of claim 1, wherein the control signal comprises: a logic signal having a high logic state for enabling the PLL.

8. The device of claim 1, wherein the control signal comprises: a logic signal having first and second logic states for enabling and disabling the PLL, respectively.

9. The device of claim 1, further comprising: memory for storing data; and access circuitry for accessing the memory.

10. The device of claim 9, wherein the access circuitry is configured to write data in the memory in response to a write signal.

11. The device of claim 10, wherein the synchronization circuitry is configured to synchronize the transfer of data input to the device with the reproduced clock signal.

* * * * *